(12) United States Patent
Morisue et al.

(10) Patent No.: US 9,419,142 B2
(45) Date of Patent: Aug. 16, 2016

(54) METHOD FOR MANUFACTURING SEMICONDUCTOR DEVICE

(75) Inventors: Masafumi Morisue, Kawasaki (JP); Yasuhiro Jinbo, Atsugi (JP); Gen Fujii, Sagamihara (JP); Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/431,073

(22) Filed: Mar. 27, 2012

(65) Prior Publication Data

US 2012/0182598 A1 Jul. 19, 2012

Related U.S. Application Data

(63) Continuation of application No. 11/709,126, filed on Feb. 22, 2007, now Pat. No. 8,173,519.

(30) Foreign Application Priority Data

Mar. 3, 2006 (JP) .................................. 2006-058729

(51) Int. Cl.
*H01L 29/786* (2006.01)
*G02F 1/167* (2006.01)
(Continued)

(52) U.S. Cl.
CPC .......... *H01L 29/78603* (2013.01); *G02F 1/167* (2013.01); *H01L 27/1214* (2013.01); *H01L 27/1266* (2013.01); *H01L 29/78633* (2013.01); *H01L 31/0392* (2013.01); *H01L 51/003* (2013.01); *H01L 27/3244* (2013.01); *H01L 51/56* (2013.01); *H01L 2227/326* (2013.01);
(Continued)

(58) Field of Classification Search
CPC .................... H01L 27/1266; H01L 29/78603; H01L 51/003; G02F 1/167; G02F 1/133305
See application file for complete search history.

(56) References Cited

U.S. PATENT DOCUMENTS

| | | | |
|---|---|---|---|
| 4,409,134 A | 10/1983 | Yamazaki | |
| 5,826,162 A | 10/1998 | Aral et al. | |

(Continued)

FOREIGN PATENT DOCUMENTS

| | | |
|---|---|---|
| CN | 1143394 | 2/1997 |
| CN | 1256791 | 6/2000 |

(Continued)

OTHER PUBLICATIONS

Chinese Office Action (Application No. 200710085416.8) Dated Aug. 1, 2012.

(Continued)

*Primary Examiner* — Stephen W Smoot
*Assistant Examiner* — Sun M Kim
(74) *Attorney, Agent, or Firm* — Robinson Intellectual Property Law Office; Eric J. Robinson

(57) ABSTRACT

A method for manufacturing a semiconductor device includes: forming a photocatalytic layer and an organic compound layer in contact with the photocatalytic layer over a substrate having a light transmitting property; forming an element forming layer over the substrate having the light transmitting property with the photocatalytic layer and the organic compound layer in contact with the photocatalytic layer interposed therebetween; and separating the element forming layer from the substrate having the light transmitting property after the photocatalytic layer is irradiated with light through the substrate having the light transmitting property.

16 Claims, 39 Drawing Sheets

(51) Int. Cl.
  H01L 27/12    (2006.01)
  H01L 31/0392  (2006.01)
  H01L 51/00    (2006.01)
  H01L 27/32      (2006.01)
  H01L 51/56      (2006.01)

(52) U.S. Cl.
  CPC ....... *H01L2251/5338* (2013.01); *Y02E 10/549* (2013.01); *Y02P 70/521* (2015.11)

(56) References Cited

U.S. PATENT DOCUMENTS

| | | | |
|---|---|---|---|
| 5,834,327 | A | 11/1998 | Yamazaki et al. |
| 6,100,166 | A | 8/2000 | Sakaguchi et al. |
| 6,127,199 | A | 10/2000 | Inoue et al. |
| 6,335,479 | B1 | 1/2002 | Yamada et al. |
| 6,372,608 | B1 | 4/2002 | Shimoda et al. |
| 6,379,792 | B1 | 4/2002 | Isshiki et al. |
| 6,468,638 | B2 | 10/2002 | Jacobsen et al. |
| 6,521,511 | B1 | 2/2003 | Inoue et al. |
| 6,627,518 | B1 | 9/2003 | Inoue et al. |
| 6,645,830 | B2 | 11/2003 | Shimoda et al. |
| 6,814,832 | B2 | 11/2004 | Utsunomiya |
| 6,818,530 | B2 | 11/2004 | Shimoda et al. |
| 6,825,099 | B2 | 11/2004 | Yanagita et al. |
| 6,867,067 | B2 | 3/2005 | Ghyselen et al. |
| 6,885,146 | B2 * | 4/2005 | Yamazaki et al. ............ 313/498 |
| 6,946,361 | B2 * | 9/2005 | Takayama et al. ............ 438/455 |
| 6,947,321 | B2 | 9/2005 | Tanabe |
| 7,052,924 | B2 | 5/2006 | Daniels et al. |
| 7,067,392 | B2 | 6/2006 | Yamazaki et al. |
| 7,070,851 | B2 | 7/2006 | Jacobsen et al. |
| 7,078,737 | B2 | 7/2006 | Yuri et al. |
| 7,084,045 | B2 | 8/2006 | Takayama et al. |
| 7,094,665 | B2 | 8/2006 | Shimoda et al. |
| 7,147,740 | B2 | 12/2006 | Takayama et al. |
| 7,169,652 | B2 | 1/2007 | Kimura |
| 7,217,956 | B2 | 5/2007 | Daniels et al. |
| 7,259,030 | B2 | 8/2007 | Daniels et al. |
| 7,262,088 | B2 | 8/2007 | Kodaira et al. |
| 7,288,432 | B2 | 10/2007 | Jacobsen |
| 7,294,961 | B2 | 11/2007 | Daniels et al. |
| 7,341,924 | B2 | 3/2008 | Takayama et al. |
| 7,420,208 | B2 | 9/2008 | Yamazaki et al. |
| 7,425,467 | B2 | 9/2008 | Jacobsen et al. |
| 7,427,782 | B2 | 9/2008 | Daniels et al. |
| 7,456,059 | B2 | 11/2008 | Kodaira et al. |
| 7,476,557 | B2 | 1/2009 | Daniels et al. |
| 7,572,667 | B2 * | 8/2009 | Ryu et al. ......................... 438/99 |
| 7,575,965 | B2 | 8/2009 | Kuwabara et al. |
| 7,677,943 | B2 | 3/2010 | Daniels et al. |
| 7,723,733 | B2 | 5/2010 | Daniels et al. |
| 7,858,994 | B2 | 12/2010 | Daniels |
| 7,863,760 | B2 | 1/2011 | Daniels et al. |
| 7,952,107 | B2 | 5/2011 | Daniels et al. |
| 8,129,730 | B2 | 3/2012 | Daniels |
| 2003/0048370 | A1 * | 3/2003 | Koyama ....................... 348/311 |
| 2003/0087073 | A1 | 5/2003 | Kobayashi |
| 2004/0129960 | A1 | 7/2004 | Maruyama et al. |
| 2005/0124751 | A1 * | 6/2005 | Klingenberg et al. ........ 524/502 |
| 2005/0130391 | A1 | 6/2005 | Takayama et al. |
| 2005/0173701 | A1 * | 8/2005 | Kawase et al. .................. 257/40 |
| 2005/0250308 | A1 * | 11/2005 | Yamaguchi et al. .......... 438/618 |
| 2005/0287871 | A1 | 12/2005 | Nakayama et al. |
| 2006/0231527 | A1 | 10/2006 | Takayama et al. |
| 2007/0090387 | A1 | 4/2007 | Daniels et al. |
| 2007/0171142 | A1 | 7/2007 | Ikarashi et al. |
| 2007/0194332 | A1 | 8/2007 | Daniels et al. |
| 2007/0295973 | A1 | 12/2007 | Jinbo et al. |
| 2008/0067527 | A1 | 3/2008 | Daniels et al. |
| 2008/0191220 | A1 | 8/2008 | Daniels et al. |

FOREIGN PATENT DOCUMENTS

| | | |
|---|---|---|
| CN | 1143394 C | 3/2004 |
| CN | 1143394 | 2/2007 |
| EP | 0986104 A | 3/2000 |
| EP | 1 381 054 | 1/2004 |
| EP | 1 575 085 A | 9/2005 |
| EP | 1 655 633 | 5/2006 |
| EP | 0 858 110 | 12/2006 |
| EP | 1 758 169 | 2/2007 |
| EP | 1 351 308 | 4/2009 |
| EP | 1 744 365 | 4/2009 |
| JP | 61-030093 A | 2/1986 |
| JP | 62-229182 A | 10/1987 |
| JP | 01-245038 A | 9/1989 |
| JP | 06-018914 A | 1/1994 |
| JP | 06-049270 A | 2/1994 |
| JP | 10-125929 | 5/1998 |
| JP | 10-125931 | 5/1998 |
| JP | 2001-206979 A | 7/2001 |
| JP | 2001-260597 | 9/2001 |
| JP | 2002-026282 | 1/2002 |
| JP | 2002-280613 A | 9/2002 |
| JP | 2002-329584 A | 11/2002 |
| JP | 2003-501676 | 1/2003 |
| JP | 2003-098977 | 4/2003 |
| JP | 2004-047791 | 2/2004 |
| JP | 2004-172578 A | 6/2004 |
| JP | 2004-198885 A | 7/2004 |
| JP | 2004-214281 | 7/2004 |
| JP | 2005-039129 A | 2/2005 |
| JP | 2005-197673 A | 7/2005 |
| JP | 2006-040265 A | 2/2006 |
| JP | 2006-049800 A | 2/2006 |
| JP | 2006-058676 A | 3/2006 |
| WO | WO 95/24510 | 9/1995 |
| WO | WO-00/55915 | 9/2000 |
| WO | WO-2005/099310 | 10/2005 |
| WO | WO 2006/098207 A1 * | 9/2006 |
| WO | WO-2007/149362 | 12/2007 |
| WO | WO-2008/051596 | 5/2008 |

OTHER PUBLICATIONS

Ian French et al., "Thin Plastic Electrophoretic Displays Fabricated by a Novel Process," SID Digest '05, 2005, pp. 1634-1637.

Office Action (Application No. 200710084421.7) dated Dec. 4, 2009.

Office Action (Application No. 200710085416.8) dated Jan. 8, 2010.

Ian French et al., "Thin Plastic Electrophoretic Displays Fabricated by a Novel Process," SID Digest '05, 2005, vol. 36, pp. 1634-1637.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device having flexibility.

2. Description of the Related Art

It has been required to manufacture semiconductor devices at low cost, and development of elements such as thin film transistors, memories, and solar cells for control circuits, memory circuits, or the like has been extensively carried out in recent years (for example, Reference 1: Japanese Published Patent Application No. 2004-47791).

Various applications of semiconductor devices having elements such as thin film transistors, memories, and solar cells are expected, and using flexible plastic films is attempted in pursuit of reduction in size and weight.

Since plastic films have low heat resistance, it is necessary to decrease the highest temperature in a process. Therefore, a method for manufacturing a semiconductor element is limited. Accordingly, the semiconductor devices using plastic films are manufactured by an evaporation method or a sputtering method using a metal mask.

A technique is suggested, in which after a polyimide layer is formed over a glass substrate and a layer having a fine element is formed over the polyimide layer, the polyimide layer is irradiated with a laser beam from the glass substrate side, and the polyimide layer and the layer having the fine element are separated from the glass substrate to form a display device having flexibility (Reference 2: French and others (Ian French, David McCulloch, Ivar Boerefijin, Nico Kooyman), SID 2005 Digest, U.S.A., 2005, pp. 1634-1637)

SUMMARY OF THE INVENTION

However, in the case of manufacturing a semiconductor device by an evaporating method or a sputtering method using a metal mask, a step of aligning the metal mask is necessary. Therefore, a problem of aligning the metal mask leads to low yield.

Moreover, in the case of manufacturing a semiconductor device by an evaporation method or a sputtering method using a metal mask, an element is designed in consideration of the misalignment. Thus, it is difficult to manufacture thin film transistors, memories, and solar cells having fine structures, or the like, and thus it is difficult to achieve reduction in size and weight and improvement in performance of semiconductor devices.

In the separation method shown in Reference 2, a laser beam is delivered from a glass substrate side to peel a polyimide layer; however, the energy of the laser beam is unstable and fluctuates, so that there is a phenomenon that a part of the polyimide layer is not separated from the glass substrate. As a result, there arises a problem in that yield is decreased. In addition, when the polyimide layer is irradiated with a laser beam having strong energy through the glass substrate so that yield is improved, there is a problem in that glass and an element included in a layer are damaged.

An object of the present invention is to provide a method for manufacturing a semiconductor device with high yield without damaging a layered product. Further, another object of the present invention is to provide a method for manufacturing a semiconductor device whose entire thickness is thin and which is light weight and flexible, with high yield.

One feature of the present invention is a method for manufacturing a semiconductor device which includes: forming a photocatalytic layer and an organic compound layer in contact with the photocatalytic layer over a substrate having a light transmitting property; forming an element forming layer over the substrate having the light transmitting property with the photocatalytic layer and the organic compound layer in contact with the photocatalytic layer interposed therebetween; and separating the element forming layer from the substrate having the light transmitting property after the photocatalytic layer is irradiated with light through the substrate having the light transmitting property. In addition, separation is performed at an interface between the photocatalytic layer and the organic compound layer, so that the element forming layer is separated from the substrate having the light transmitting property.

Note that the organic compound layer may be formed over the substrate having the light transmitting property with the photocatalytic layer interposed therebetween.

In addition, the photocatalytic layer may be formed over the substrate having the light transmitting property with an organic compound layer interposed therebetween.

In addition, a substrate having flexibility may be attached to a surface of the organic compound layer after the element forming layer is separated from the substrate having the light transmitting property.

In addition, the organic compound layer may include an inorganic compound particle. Further, the organic compound layer may include a light shielding property. In this case, the organic compound layer includes an optical absorber or a light reflector.

In addition, a wavelength of the light is a wavelength which activates the photocatalytic layer.

In addition, the element forming layer includes at least one of a thin film transistor, a diode, a resistor, a light emitting element, a liquid crystal element, and an electrophoresis element.

In addition, the above-described semiconductor device is a semiconductor device which functions as a light emitting device, a liquid crystal display device, an electrophoretic display device, a wireless chip, a solar cell, or a sensor.

In the present invention, a photocatalytic layer and an organic compound layer are formed over a substrate having a light transmitting property, an element forming layer having an element with a fine structure is formed over the photocatalytic layer and the organic compound layer by using a semiconductor process, and then, the photocatalytic layer is irradiated with light from the substrate having the light transmitting property. Accordingly, at an interface between the photocatalytic layer and the organic compound layer, photocatalytic reaction can be generated and the photocatalytic layer and the organic compound layer can be separated from each other without using light with high energy. Therefore, a semiconductor device which has flexibility and an element including a fine structure formed by using a conventional semiconductor process can be easily manufactured. In addition, a semiconductor device which has flexibility and an element forming layer including an element with a fine structure can be manufactured with high yield by using a conventional semiconductor process.

In addition, after a photocatalytic layer, an organic compound layer having a light shielding property, and an element forming layer are sequentially formed over a substrate having a light transmitting property, the photocatalytic layer is irradiated with light from the substrate having the light transmitting property, and the photocatalytic layer and the organic compound layer having the light shielding property can be separated from each other. At this time, light with which the photocatalytic layer is irradiated can be prevented from entering the element forming layer; therefore, a characteristic of the element can be prevented from changing due to light, and a semiconductor device which has high reliability and flexibility can be manufactured. In addition, a semiconductor device which has flexibility and an element forming layer including an element with a fine structure can be manufactured with high yield by using a conventional semiconductor process.

In addition, after a photocatalytic layer, an organic compound layer in which inorganic compound particles are dispersed, and an element forming layer are sequentially formed over a substrate having a light transmitting property, the photocatalytic layer is irradiated with light from the substrate having the light transmitting property, and the photocatalytic layer and the organic compound layer in which the inorganic compound particles are dispersed are separated from each other. At this time, since the element forming layer is provided with the organic compound layer in which the inorganic compound particles are dispersed, mechanical strength is increased, and a semiconductor device can be prevented from breaking when the semiconductor device is curved. In addition, a semiconductor device which has flexibility and an element forming layer including an element with a fine structure can be manufactured with high yield by using a conventional semiconductor process.

Further, cohesion between the photocatalytic layer and the organic compound layer can be lowered by light. Therefore, causes of separation between the photocatalytic layer and the organic compound layer can be controlled, and unintended separation can be prevented. Accordingly, a semiconductor device which has flexibility and an element forming layer including an element with a fine structure can be manufactured with high yield by using a conventional semiconductor process.

Since the organic compound layer remaining on one surface of the element forming layer can be used as a substrate, the number of substrates having flexibility can be reduced, and cost of the semiconductor device can be reduced.

DETAILED DESCRIPTION OF THE INVENTION

Figure 1A:
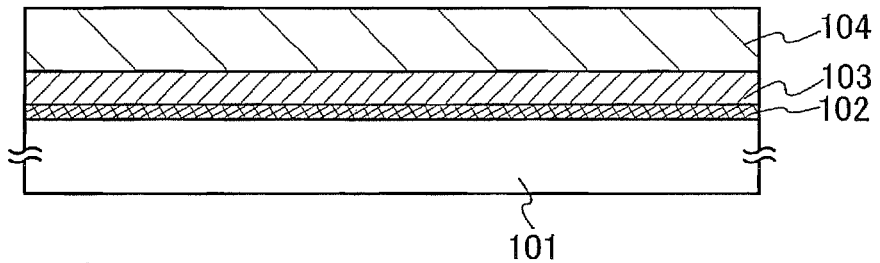
FIGS. 1A to 1E are cross sectional views illustrating a manufacturing process of a semiconductor device of the present invention.

Hereinafter, embodiment modes and embodiments will be described with reference to the drawings. The present invention can be carried out in many different modes. It is easily understood by those skilled in the art that modes and details disclosed herein can be modified in various ways without departing from the spirit and the scope of the present invention. It should be noted that the present invention should not be interpreted as being limited to the description of the embodiment modes and embodiments given below. Note that like portions or portions having a like function are denoted by the same reference numerals through drawings, and therefore, description thereof is omitted.

Embodiment Mode 1

This embodiment mode will describe a method for manufacturing a semiconductor device having flexibility with high yield by separating an element forming layer from a substrate having a light transmitting property, with reference to FIGS. 1A to 1E.

As shown in FIG. 1A, a photocatalytic layer 102 is formed over a substrate 101 having a light transmitting property, and an organic compound layer 103 is formed over the photocatalytic layer 102. Next, an element forming layer 104 is formed over the organic compound layer 103.

As the substrate 101 having the light transmitting property, a glass substrate, a quartz substrate, a plastic substrate having heat resistance enough to withstand the process temperature of the process, or the like can be used. Since the above-mentioned substrate 101 having a light transmitting property is not restricted in size and shape, for example, a rectangular substrate with a length of 1 m or more on a side can be used as the substrate 101 having the light transmitting property. With such a rectangular substrate, productivity can be drastically increased. This is a superior point to a circular silicon substrate. Here, a glass substrate is used as the substrate 101 having the light transmitting property. Note that when a plastic substrate is used as the substrate 101 having the light transmitting property, an insulating layer having a light transmitting property is preferably formed over a surface of the plastic substrate. As the insulating layer, there are silicon oxide, silicon nitride, silicon oxynitride, aluminum nitride, and the like. When an insulating layer having a light transmitting property is formed over the surface of the plastic substrate, when a photocatalytic layer is formed later and the photocatalytic layer is irradiated with light, the photocatalytic layer is activated, and an interface between the plastic substrate and the photocatalytic layer can be prevented from being separated.

Next, the photocatalytic layer 102 is formed over a surface of the substrate 101 having the light transmitting property. The photocatalytic layer 102 is formed of titanium oxide ($TiO_x$), tin oxide ($SnO_2$), tungsten oxide ($WO_3$), zinc oxide (ZnO), bismuth oxide ($Bi_2O_3$), titanate ($MTiO_3$), tantalate ($MTaO_3$), niobate ($M_4Nb_6O_{17}$), (note that every M indicates a metal element), CdS, ZnS, or the like. As a crystalline structure of titanium oxide, an anatase type, a rutile type, or a mixture of these types can be used. The photocatalytic layer 102 is formed by a sputtering method, a plasma CVD method, an evaporation method, a sol-gel method, an electrophoresis method, a spray method, or the like.

Titanium oxide doped with metal or nitrogen can be used as the photocatalytic layer 102. As the metal, there are platinum (Pt), copper (Cu), chrome (Cr), silver (Ag), vanadium (V), iron (Fe), cobalt (Co), zinc (Zn), rhodium (Rh), palladium (Pd), gold (Au), and the like. When the photocatalytic layer 102 is formed using titanium oxide doped with metal or nitrogen, the photocatalytic layer 102 can be activated by using not ultraviolet rays, but using visible light, typically sunlight. Here, titanium oxide is used to form the photocatalytic layer 102.

The photocatalytic layer 102 preferably has a thickness greater than or equal to 0.5 nm and less than or equal to 150 nm, more preferably greater than or equal to 1 nm and less than or equal to 30 nm. When the thickness of the photocatalytic layer 102 is thinner than the above-mentioned film thickness, the photocatalytic layer 102 is not activated even when it is irradiated with light. Therefore, even when the organic compound layer 103 is formed over the photocatalytic layer 102 later, and the photocatalytic layer 102 is irradiated with light, the photocatalytic layer 102 and the organic compound layer 103 are difficult to be separated from each other at an interface between the photocatalytic layer 102 and the organic compound layer 103. On the other hand, when the thickness of the photocatalytic layer 102 is thicker than the above-mentioned film thickness, even when the photocatalytic layer 102 is irradiated with light and activated species are generated, the activated species are deactivated before the activated species move to the interface between the photocatalytic layer 102 and the organic compound layer 103; therefore, the photocatalytic layer 102 and the organic compound layer 103 are difficult to be separated from each other.

Next, the organic compound layer 103 is formed over photocatalytic layer 102. As the organic compound layer 103, an organic compound such as a cyanoethyl cellulose resin, polyimide, polyethylene, polypropylene, a polystyrene resin, a silicone resin, an epoxy resin, vinylidene fluoride, or the like can be used. Alternatively, aromatic polyamide or polybenzimidazole may be used. As a further alternative, a resin material such as a vinyl resin such as polyvinyl alcohol or polyvinyl butyral; a phenol resin; a novolac resin; an acrylic resin; a melamine resin; a urethane resin; or an oxazole resin (polybenzoxazole) may be used. In addition, polyimide, a vinyl acetate resin, polyvinyl acetal, polystyrene, an AS resin, a methacrylic resin, polypropylene, polycarbonate, celluloid, acetyl cellulose plastic, a methylpentene resin, a vinyl chloride resin, a polyester resin, an urea resin, or the like may be used, and polyimide is used to form the organic compound layer 103 here.

The organic compound layer 103 preferably has a thickness greater than or equal to 50 nm and less than or equal to 5 µm. When the organic compound layer 103 is formed to have a thickness greater than or equal to 1 µm and less than or equal to 5 µm, the organic compound layer 103 can be used instead of a substrate in the semiconductor device to be formed later. Accordingly, the number of substrates can be reduced and cost reduction is possible.

Next, the element forming layer 104 is formed over the organic compound layer 103. As the element forming layer

104, a thin film transistor, a thin film transistor having a floating gate electrode, a memory element, a capacitor, a resistor, a diode, or the like may be used. In addition, the element forming layer 104 may have an EL element, a liquid crystal element, an electron-emissive element, an electrophoresis element, a MEMS (Micro Electro Mechanical System), or the like.

A substrate having flexibility may be provided over a surface of the element forming layer 104. As the substrate having flexibility, typically, a substrate including PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. When any of these substrates is used, the substrate having flexibility is provided over the element forming layer 104 using an adhesive agent. Moreover, a multilayer film including paper made of a fibrous material or a host material film (polyester, polyamide, an inorganic evaporated film, or the like) and an adhesive organic resin film (an acrylic-based organic resin, an epoxy-based organic resin, or the like), or the like can also be used. In the case of using any of these multilayer films, when a multilayer film is attached to the surface of the element forming layer 104 by thermal compression bonding, the adhesive organic resin film is plasticized and functions as an adhesive agent.

Figure 1B:
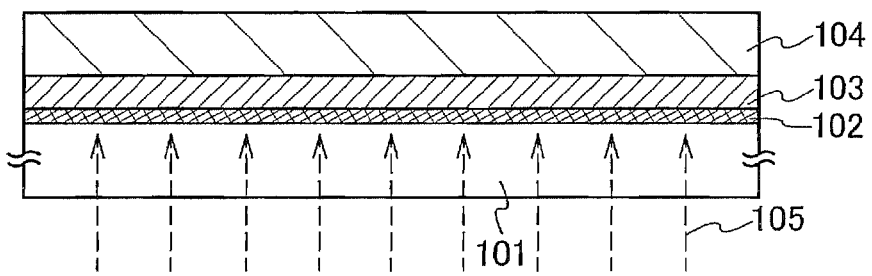
Figure 1C:
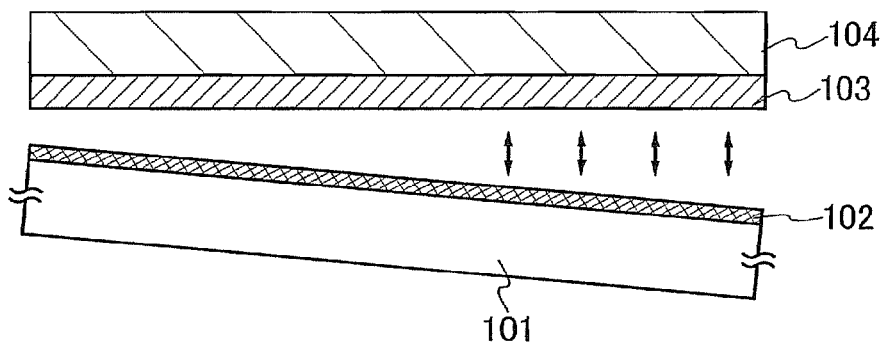

Next, as shown in FIG. 1B, the substrate 101 having the light transmitting property is irradiated with light 105. As the light 105, light having a wavelength capable of activating the photocatalytic layer 102 may be used. Further, a laser beam having a wavelength capable of activating the photocatalytic layer 102 may also be used. Typically, when the photocatalytic layer 102 is formed with titanium oxide, ultraviolet rays may be uses as the light 105. When the photocatalytic layer is formed with CdS, visible light may be used as the light 105. When the photocatalytic layer 102 is irradiated with the light 105 through the substrate 101 having the light transmitting property, the photocatalytic layer 102 is activated. Accordingly, the photocatalytic layer 102 and the organic compound layer 103 are separated from each other. Typically, as shown in FIG. 1C, when the photocatalytic layer 102 is formed using titanium oxide, oxidizability of titanium oxide is increased due to the irradiation with the light 105, and a carbon-hydrogen bond of the organic compound layer 103 is broken at the interface between the photocatalytic layer 102 and the organic compound layer 103. Accordingly, a surface of the organic compound layer 103 becomes rough, and a part of the organic compound layer 103 becomes carbon dioxide and water and degassing is generated. As a result, the activate photocatalytic layer 102 and the organic compound layer 103 are separated from each other.

Figure 1D:
Figure 1E:
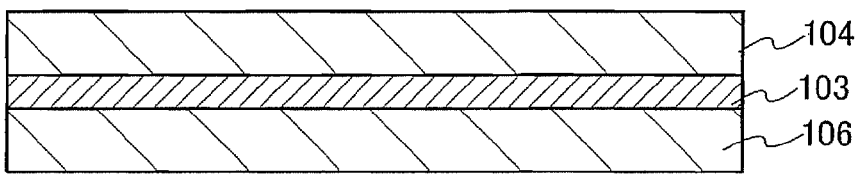

By the above-described steps, as shown in FIG. 1D, a semiconductor device including the element forming layer 104 and the organic compound layer 103 can be formed. Note that after the separation process shown in FIG. 1C, the surface of the organic compound layer 103 may be provided with a substrate 106 having flexibility, so that a semiconductor device as shown in FIG. 1E may be formed.

When the substrate 106 having flexibility is used, mechanical strength of the semiconductor device to be formed later can be increased. In addition, a contaminant from outside can be prevented from being mixed into the semiconductor device.

As the substrate 106 having flexibility, a similar one to the substrate having flexibility which can be provided over the surface of the element forming layer 104 can be selected as appropriate.

By the above-described process, photocatalytic reaction can be generated at the interface between the photocatalytic layer and the organic compound layer, so that the photocatalytic layer and the organic compound layer can be separated from each other. Therefore, a semiconductor device which has flexibility and an element including a fine structure formed by using a conventional semiconductor process can be easily manufactured.

Embodiment Mode 2

This embodiment mode will describe another mode of a manufacturing process of the photocatalytic layer 102 and the organic compound layer 103, which is different from Embodiment Mode 1, with reference to FIGS. 2A to 2E.

Figure 2A:
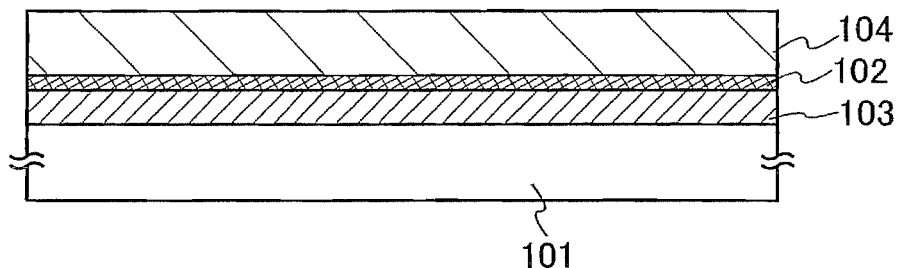
FIGS. 2A to 2E are cross sectional views illustrating a manufacturing process of a semiconductor device of the present invention.

As shown in FIG. 2A, the organic compound layer 103 is formed over the substrate 101 having the light transmitting property, and the photocatalytic layer 102 is formed over the organic compound layer 103. Then, the element forming layer 104 is formed over the photocatalytic layer 102.

In this embodiment mode, since the photocatalytic layer 102 is irradiated with light through substrate 101 having a light transmitting property and the organic compound layer 103, the organic compound layer 103 is formed using a material capable of transmitting light which is to be delivered later. Typically, a material capable of transmitting any of ultraviolet rays, visible rays, or infrared rays is used. As an organic compound having a light transmitting property, there are polyimide, acrylic, a vinyl acetate resin, polyvinyl acetal, polystyrene, an AS resin, a methacrylic resin, polypropylene, polycarbonate, celluloid, acetyl cellulose plastic, polyethylene, a methylpentene resin, a vinyl chloride resin, a polyester resin, an urea resin, and the like.

Figure 2B:
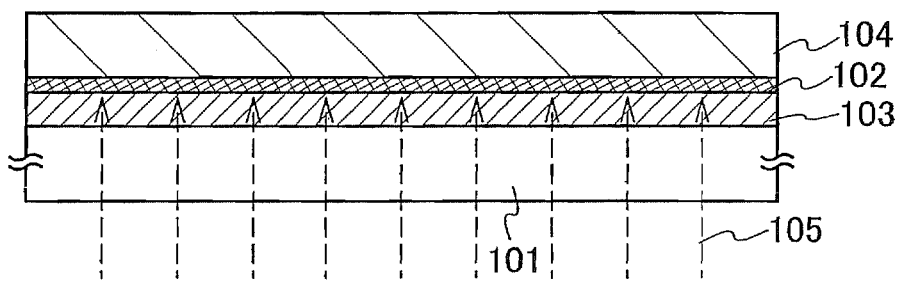
Figure 2C:
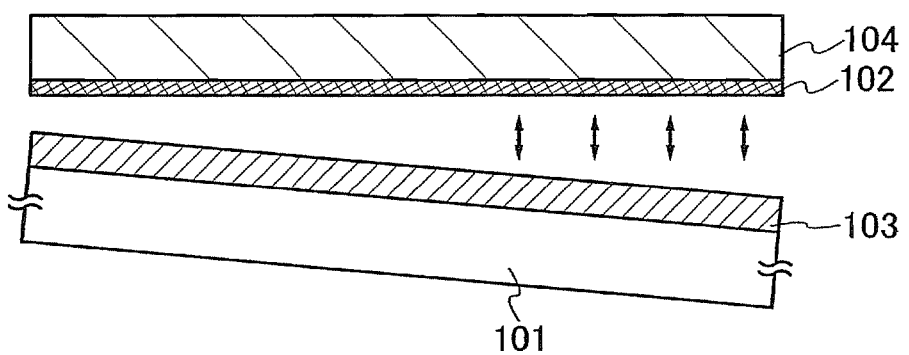

Next, as shown in FIG. 2B, the photocatalytic layer 102 is irradiated with the light 105 through the substrate 101 having the light transmitting property and the organic compound layer 103. As a result, the photocatalytic layer 102 is activated. Accordingly, the photocatalytic layer 102 and the organic compound layer 103 are separated from each other as shown in FIG. 2C.

Figure 2D:
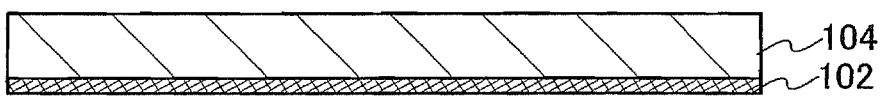
Figure 2E:
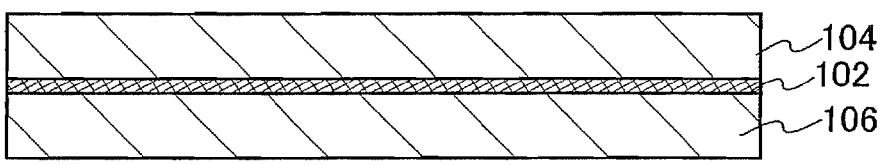

By the above-described steps, as shown in FIG. 2D, a semiconductor device including the element forming layer 104 and the photocatalytic layer 102 can be formed. Note that after the separation process shown in FIG. 2C, a surface of the photocatalytic layer 102 may be provided with the substrate 106 having flexibility, so that a semiconductor device as shown in FIG. 2E may be formed.

By the above-described process, photocatalytic reaction can be generated at the interface between the photocatalytic layer and the organic compound layer, so that the photocatalytic layer and the organic compound layer can be separated from each other. Therefore, a semiconductor device which has flexibility and an element including a fine structure formed by using a conventional semiconductor process can be easily manufactured.

Embodiment Mode 3

This embodiment mode will describe a mode in which a semiconductor device is formed using an organic compound layer 112 in which inorganic compound particles are dispersed instead of the organic compound layer 103 in Embodiment Modes 1 and 2, with reference to FIGS. 3A to 3E. Note that in this embodiment mode, Embodiment Mode 1 is used for description; however, Embodiment Mode 2 can be applied.

Figure 3A:
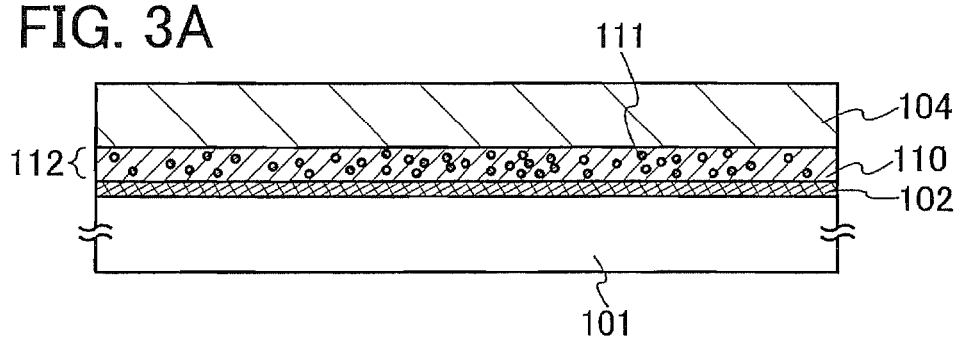
FIGS. 3A to 3E are cross sectional views illustrating a manufacturing process of a semiconductor device of the present invention.

As shown in FIG. 3A, the photocatalytic layer 102 is formed over the substrate 101 having the light transmitting property, and the organic compound layer 112 is formed over the photocatalytic layer 102. Then, the element forming layer 104 is formed over the organic compound layer 112. Note that as the organic compound layer 112, inorganic compound particles 111 are dispersed in an organic compound 110.

As the inorganic compound particles 111, silicon oxide, silicone nitride, aluminum oxide, tantalum oxide, barium fluoride magnesium, or the like can be used. When the inorganic compound particles 111 are dispersed in the organic compound layer 103, mechanical strength of an organic compound layer 114 is increased; therefore, a semiconductor device to be formed later can be prevented from breaking when the semiconductor device is curved.

Figure 3B:
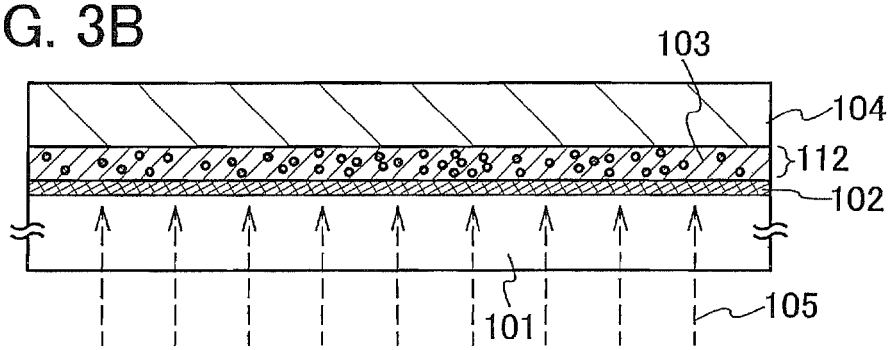
Figure 3C:
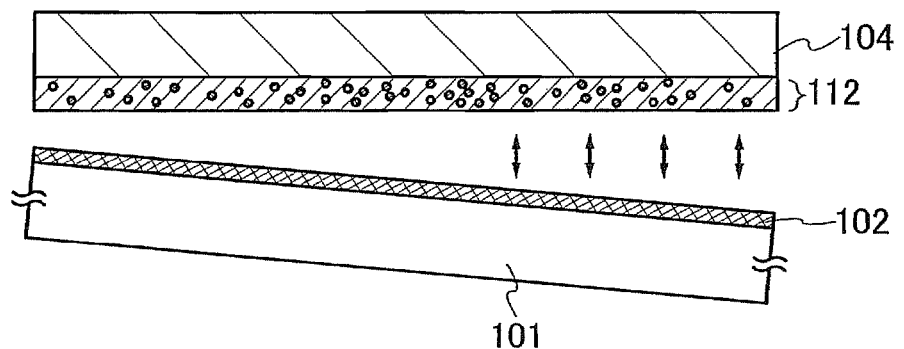

Next, as shown in FIG. 3B, the photocatalytic layer 102 is irradiated with the light 105 through the substrate 101 having the light transmitting property. As a result, the photocatalytic layer 102 is activated. Accordingly, as shown in FIG. 3C, the photocatalytic layer 102 and the organic compound layer 112 in which the inorganic compound particles 111 are dispersed in the organic compound 110 are separated from each other.

Figure 3D:
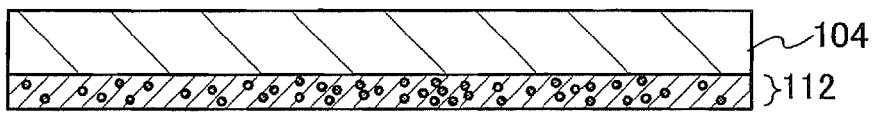
Figure 3E:
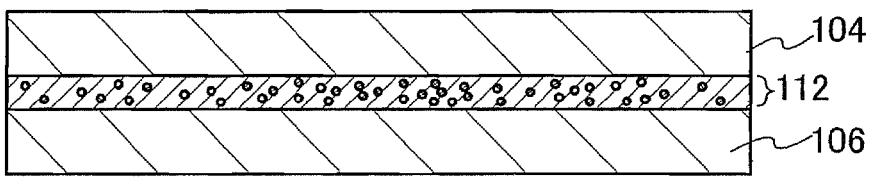

By the above-described steps, as shown in FIG. 3D, a semiconductor device including the element forming layer 104 and the organic compound layer 112 in which the inorganic compound particles 111 are dispersed in the organic compound 110 can be formed. Note that after the separation process shown in FIG. 3C, a surface of the organic compound layer 112 may be provided with the substrate 106 having flexibility, so that a semiconductor device as shown in FIG. 3E may be formed.

When an organic compound layer in which inorganic compound particles are dispersed is used as the organic compound layer, an element forming layer which has been separated from a photocatalytic layer can be provided with the organic compound layer in which the inorganic compound particles are dispersed. Therefore, a semiconductor device having high mechanical strength can be manufactured.

Embodiment Mode 4

This embodiment mode will describe a mode in which a semiconductor device is manufactured using the organic compound layer 114 in which particles 113 having light shielding properties are dispersed in the organic compound 110, instead of the organic compound layer 103 or the organic compound layer 112 in which the inorganic compound particles 111 are dispersed in the organic compound 110 in Embodiment Modes 1 to 4, with reference to FIGS. 4A to 4E. Note that Embodiment Mode 1 is used for description in this embodiment mode; however, Embodiment Mode 2 or Embodiment Mode 3 can be applied.

Figure 4A:
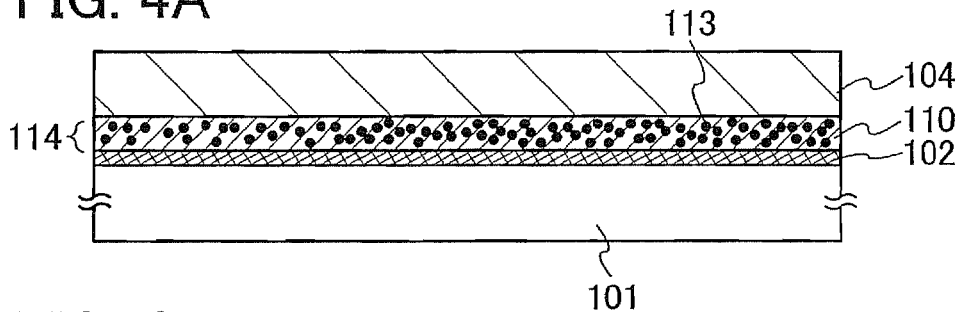
FIGS. 4A to 4E are cross sectional views illustrating a manufacturing process of a semiconductor device of the present invention.

As shown in FIG. 4A, the photocatalytic layer 102 is formed over the substrate 101 having the light transmitting property, and the organic compound layer 114 is formed over the photocatalytic layer 102. Then, the element forming layer 104 is formed over the organic compound layer 114. As the organic compound layer 114, the particles 113 having light shielding properties are dispersed in the organic compound 110.

Particles (light absorbers) which absorb light in the wavelength range from 280 to 780 nm or particles (light reflectors) which reflect light are preferably used as the particles 113 having light shielding properties. As particles which absorb light, dye or an ultraviolet absorber can be used. As typical examples of dyes, there are an azo-based dye, an anthraquinone-based dye, a naphthoquinone-based dye, an isoindolinone-based dye, a perylene-based dye, an indigo-based dye, a fluorenone-based dye, a phenazine-based dye, a phenothiazine-based dye, a polymethine-based dye, a polyene-based dye, a diphenylmethane-based dye, a triphenylmethane-based dye, a quinacridone-based dye, an acridine-based dye, a phthalocyanine-based dye, and a quinophthalocyanine-based dye, carbon black, and the like. As the ultraviolet absorber, there are a benzotriazole-based compound, a hydroxybenzophenone-based compound, a salicylate-based compound, and the like. As the particles which reflect light, typically, there are an element selected from titanium (Ti), aluminum (Al), tantalum (Ta), tungsten (W), molybdenum (Mo), copper (Cu), chrome (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), or barium (Ba); particles having a single layer of an alloy material, a nitride, an oxide, a carbide, or a halogenated compound which includes the above element as a main component; or particles having a layered structure thereof. The particles 113 having light shielding properties may be uniformly dispersed in the organic compound 110. Alternatively, the particles 113 having light shielding properties may be dispersed particularly with high concentration in a region which is not in contact with the photocatalytic layer 102.

When the particles 111 having light shielding properties are dispersed in the organic compound layer 114, light which has passed without being absorbed in the photocatalytic layer 102 can be absorbed in the organic compound layer 114. Accordingly, the element of the element forming layer 104 can be prevented from being irradiated with the light 105, and destruction of an element due to light irradiation can be prevented.

Figure 4B:
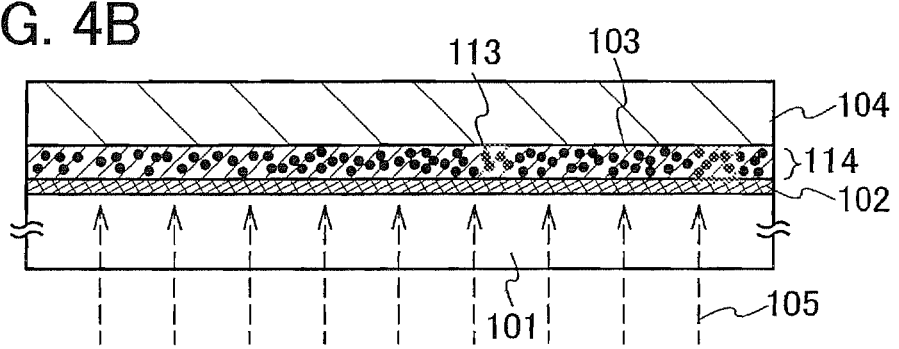
Figure 4C:
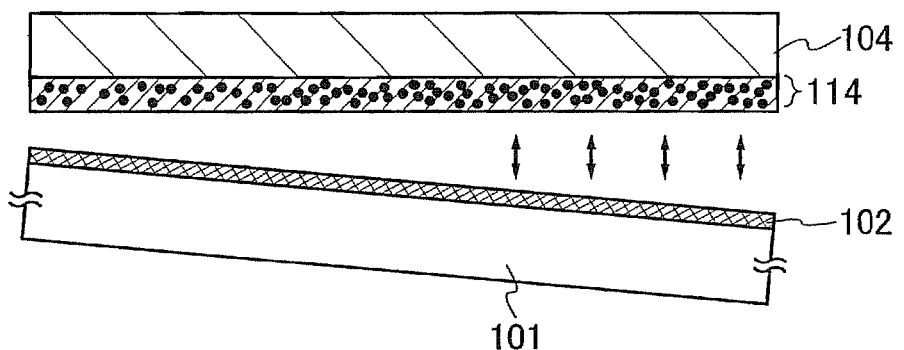

Next, as shown in FIG. 4B, the photocatalytic layer 102 is irradiated with the light 105 through the substrate 101 having the light transmitting property. As a result, the photocatalytic layer 102 is activated. Accordingly, the photocatalytic layer 102 and the organic compound layer 114 including the particles 113 having light shielding properties are separated from each other as shown in FIG. 4C.

Figure 4D:
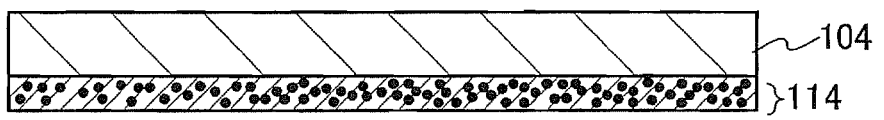
Figure 4E:
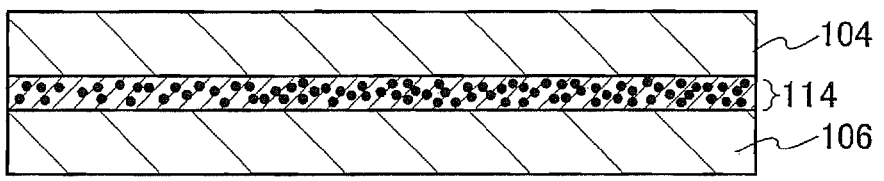

By the above-described steps, as shown in FIG. 4D, a semiconductor device including the element forming layer 104 and the organic compound layer 114 including the particles 113 having light shielding properties can be formed. Note that after the separation process shown in FIG. 4C, a surface of the organic compound layer 114 including the particles 113 having light shielding properties may be provided with the substrate 106 having flexibility, so that a semiconductor device as shown in FIG. 4E may be formed.

By the above-described steps, when the photocatalytic layer is irradiated with the light from the substrate having the light transmitting property, and the photocatalytic layer and the organic compound layer having the light shielding property are separated from each other, the light with which the photocatalytic layer is irradiated can be prevented from entering the element forming layer. Accordingly, it is possible to prevent changes in characteristics of the element due to the light with which the photocatalytic layer is irradiated, and a semiconductor device which has high reliability and flexibility can be manufactured.

Embodiment Mode 5

This embodiment mode will describe a typical example of the structure of the element forming layer 104 in Embodiment Modes 1 to 4, with reference to FIGS. 5A to 5D. Note that Embodiment Mode 1 is used for description in this embodiment mode; however, any of Embodiment Modes 2 to 4 can be applied. In this embodiment mode, a mode having an element 126 in which a first conductive layer, a functional layer 123, and a second conductive layer are formed over the element forming layer 104 is described.

Figure 5A:
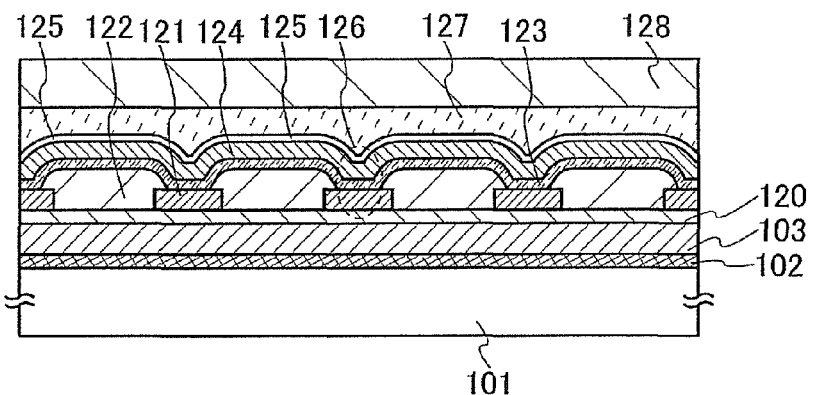
FIGS. 5A to 5D are cross sectional views illustrating a manufacturing process of a semiconductor device of the present invention.

Similarly to Embodiment Mode 1, as shown in FIG. 5A, the photocatalytic layer 102 is formed over the substrate 101 having the light transmitting property, and the organic compound layer 103 is formed over the photocatalytic layer 102. Next, an element forming layer is formed over the organic compound layer 103.

Next, an insulating layer 120 may be formed over the organic compound layer 103. The insulating layer 120 is provided so as to prevent an impurity or gas from the organic compound layer 103, the photocatalytic layer 102, or the substrate 101 having the light transmitting property from entering the element forming layer. The insulating layer 120 is formed with a single layer or a layered structure of silicon nitride, silicon oxide, aluminum nitride, or the like.

A first conductive layer 121 is formed over the insulating layer 120. Next, an insulating layer 122 may be formed so as to cover an end portion of the first conductive layer 121. Next, the functional layer 123 is formed over the first conductive layer 121, and a second conductive layer 124 is formed over the functional layer 123. Next, an insulating layer 125 may be formed over the second conductive layer 124. In addition, a substrate 128 having flexibility may be provided over the insulating layer 125 with an adhesive agent 127 interposed therebetween. Here, the element 126 can be formed with the first conductive layer 121, the functional layer 123, and the second conductive layer 124.

As for the element 126, there are an EL (Electro Luminescence) element having a light emitting material in the functional layer 123; a memory element having the functional layer 123 which is formed using a material whose crystalline state, conductivity, shape, or the like is changed due to voltage application or light irradiation; a diode or a photoelectric conversion element having the functional layer 123 which is formed using a semiconductor material whose electric characteristic is changed due to light irradiation; a capacitor having a dielectric layer in the functional layer 123; and the like.

The first conductive layer 121 and the second conductive layer 124 can be formed in a single layer or layered structure by using a metal, alloy, compound, or the like having high conductivity by a sputtering method, a plasma CVD method, a coating method, a printing method, an electrolytic plating method, an electroless plating method, or the like. Typically, a metal, alloy, conductive compound, mixture thereof, or the like having a high work function (specifically 4.0 eV or higher) can be used. Moreover, a metal, alloy, conductive compound, mixture thereof, or the like having a low work function (specifically 3.8 eV or lower) can be used.

As a typical example of a metal, alloy, or conductive compound having a high work function (specifically 4.0 eV or higher), indium tin oxide (hereinafter called ITO), indium tin oxide containing silicon, indium oxide containing 2 to 20 atomic % of zinc oxide (ZnO), or the like is given. Moreover, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride (TiN), tungsten nitride (WN), or molybdenum nitride (MoN)), or the like can be used.

As a typical example of a metal, alloy, or conductive compound having a low work function (specifically 3.8 eV or lower), a metal belonging to Group 1 or 2 of the periodic table of the elements, i.e., an alkali metal such as lithium (Li) or cesium (Cs), an alkaline earth metal such as magnesium (Mg), calcium (Ca), or strontium (Sr); aluminum (Al); an alloy containing any of these (such as MgAg or AlLi); a rare earth metal such as europium (Eu) or ytterbium (Yb); an alloy containing the rare earth metal; or the like can be used.

Note that when the element 126 is an EL element, a memory element, a diode, or a photoelectric conversion element, the first conductive layer 121 or the second conductive layer 124 is formed with a material having a light transmitting property such as ITO, indium tin oxide containing silicon, indium oxide containing 2 to 20 atomic % of zinc oxide, or indium oxide-tin oxide containing tungsten oxide and zinc oxide. In addition, even when the first conductive layer 121 or the second conductive layer 124 is formed with a material having low transmittance of visible light (typically, the above-described alkali metal, alkaline earth metal, aluminum, and an alloy containing any of these), the first conductive layer 121 or the second conductive layer 124 can have a light transmitting property by being deposited with a thickness of about 1 nm to 50 nm, preferably about 5 nm to 20 nm.

The material of the functional layer 123 is selected as appropriate in accordance with the structure of the element 126.

The insulating layer 122 is provided so as to prevent breaking of the functional layer 123 which would otherwise be caused by steps of the first conductive layers 121 or to prevent an effect of an electric field in a lateral direction between the elements. Note that at the cross section of the insulating layer 122, a side surface of the insulating layer 122 preferably has an angle of inclination with respect to the surface of the first conductive layer 121, which is greater than or equal to 10° and less than 60°, more preferably greater than or equal to 25° and less than or equal to 45°. Furthermore, the upper end portion of the insulating layer 122 is preferably curved.

The insulating layer 122 can be formed using an inorganic insulator such as silicon oxide, silicone nitride, silicon oxynitride, or aluminum nitride by a thin film forming method such as a CVD method or a sputtering method. In addition, the insulating layer 122 can be formed using an organic resin or a high molecular material such as polyimide, polyamide, benzocyclobutene, an acrylic resin, an epoxy resin, or a siloxane polymer, or the like by a coating method, a printing method, an ink-jet method, or the like. Furthermore, the insulating layer 122 can be formed with a single layer or a layered structure using any of the inorganic insulator, the high molecular material, and the organic resin.

The insulating layer 125 functions as a protective film, and can be formed using silicon oxide, silicone nitride, silicon oxynitride, DLC (Diamond Like Carbon), aluminum nitride, or the like by a thin film forming method such as a CVD method or a sputtering method.

As the adhesive agent 127, an acrylic resin, an epoxy resin, a silicone resin, or the like can be used.

As the substrate 128 having flexibility, a similar one to the substrate having flexibility which can be provided over the surface of the element forming layer 104 shown in Embodiment Mode 1 can be selected as appropriate.

Figure 5B:
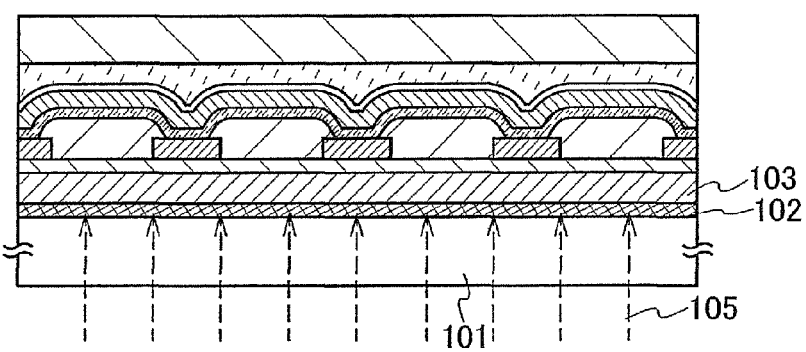

Next, as shown in FIG. 5B, the photocatalytic layer 102 is irradiated with the light 105 through the substrate 101 having the light transmitting property. As a result, the photocatalytic layer 102 is activated. Accordingly, the photocatalytic layer 102 and the organic compound layer 103 are separated from each other as shown in FIG. 5C.

Figure 5C:
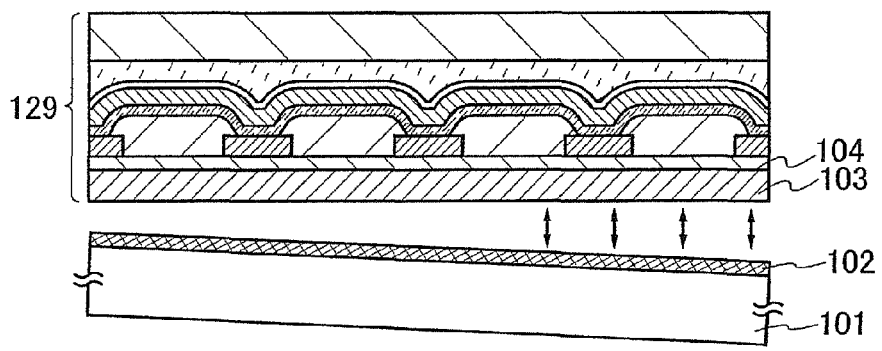
Figure 5D:
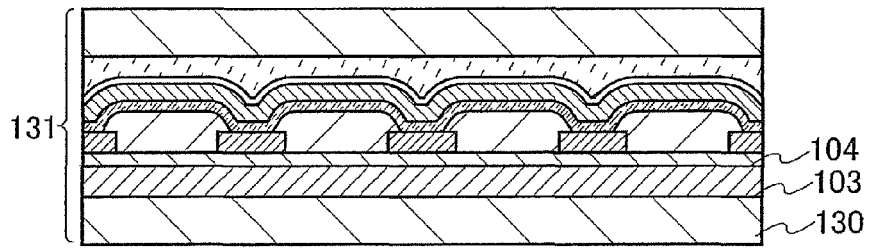

By the above-described steps, as shown in FIG. 5C, a semiconductor device 129 including the element 126 and the organic compound layer 103 can be formed. Note that after the separation process shown in FIG. 5C, the surface of the organic compound layer 103 may be provided with a substrate 130 having flexibility, so that a semiconductor device 131 as shown in FIG. 5D may be formed.

Figure 6A:
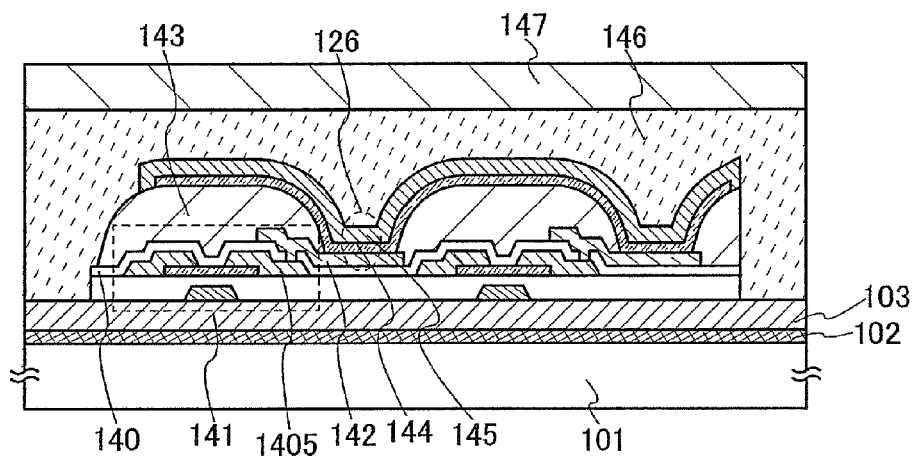
FIGS. 6A to 6D are cross sectional views illustrating a manufacturing process of a semiconductor device of the present invention.

In addition, as shown in FIG. 6A, a switching element may be connected to the element 126. As the switching element, there are a thin film transistor, MIM (Metal-Insulator-Metal), a diode, and the like. Here, a mode in which a thin film transistor 141 is used as the switching element is shown.

That is, as shown in FIG. 6A, the photocatalytic layer 102 is formed over the substrate 101 having the light transmitting property, and the organic compound layer 103 is formed over the photocatalytic layer 102. Next, the thin film transistor 141 which functions as a switching element is formed over the organic compound layer 103. Next, a first conductive layer 142 connected to wirings 1405 of the thin film transistor 141 is formed with an insulating layer 140 interposed therebetween. Note that the wiring of the thin film transistor 141 and the first conductive layer 142 are connected to each other with the insulating layer 140 interposed therebetween; however, the present invention is not limited to this structure, and the first conductive layer 142 may be formed with the wiring of the thin film transistor 141.

Figure 16A:
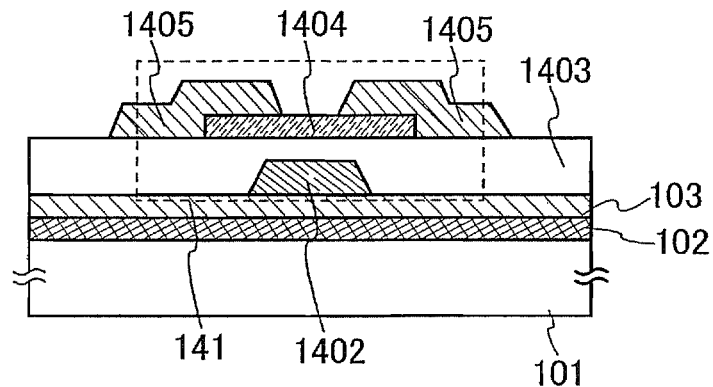
FIGS. 16A to 16C are cross sectional views illustrating structures of thin film transistors applicable to the present invention.

Here, a structure of the thin film transistor will be described with reference to FIGS. 16A and 16B. FIG. 16A shows an example of a staggered thin film transistor. The photocatalytic layer 102 and the organic compound layer 103 are provided over the substrate 101, and the thin film transistor 141 is provided over the organic compound layer 103. As the thin film transistor 141, a gate electrode 1402 and an insulating layer 1403 which serves as a gate insulating film, a semiconductor layer 1404 which overlaps with the gate electrode and the insulating layer 1403 which serves as a gate insulating film, and the wirings 1405 which are connected to the semiconductor layer 1404 are provided. Note that a part of the semiconductor layer 1404 is interposed between the insulating layer 1403 which serves as a gate insulating film and the wirings 1405.

The gate electrode 1402 can be formed by using a similar material and method to the first conductive layer 121. In addition, the gate electrode 1402 can be formed by using a droplet discharging method, and then drying and baking. Further, the gate electrode 1402 can be formed by printing a paste including fine particles by a printing method over the organic compound layer 103, and then drying and baking the paste. As typical examples of the fine particles, fine particles which includes, as a main component, any of gold; copper, an alloy of gold and silver; an alloy of gold and copper; an alloy of silver and copper; or an alloy of gold, silver and copper may be given. Furthermore, the fine particles may include a conductive oxide such as ITO as a main component.

The insulating layer 1403 which serves as a gate insulating film can be formed by using a similar material and method to the insulating layer 120. The insulating layer 1403 can be formed using the organic compound layer shown in the organic compound 110, as appropriate.

As a material for the semiconductor layer 1404 of a thin film transistor, a semiconductor material can be used, and an amorphous semiconductor layer including one or more of silicon and germanium can be formed by a thin film forming method such as a sputtering method or a CVD method. In addition, by using a material having high heat resistance for the organic compound layer 103, and irradiating the amorphous semiconductor layer with a laser beam, a crystalline semiconductor layer which is crystallized can be used. Furthermore, an organic semiconductor can be used for the semiconductor layer 1404.

As the organic semiconductor, a polycyclic aromatic compound, a conjugated double bond compound, phthalocyanine, a charge-transfer complex, or the like can be given. For example, anthracene, tetracene, pentacene, 6T (hexathiophene), TCNQ (tetracyanoquinodimethane), PTCDA (perylenetetracarboxylic dianhydride), NTCDA (naphthalenetetracarboxylic dianhydride), or the like can be used. As a material of the semiconductor layer 1404 of the organic semiconductor transistor, a π-conjugated high molecular material such as an organic high molecular compound, a carbon nanotube, polyvinyl pyridine, a phthalocyanine metal complex, or the like can be given. In particular, polyacetylene, polyaniline, polypyrrole, polythienylene, a polythiophene derivative, poly(3-alkylthiophene), a polyparaphenylene derivative, or a polyparaphenylene vinylene derivative is preferably employed, which is a π-conjugated high molecular material whose skeleton is formed with conjugated double bonds.

As a method for forming the semiconductor layer 1404 of the organic semiconductor transistor, a method for forming a film having a uniform thickness may be used. The thickness of the semiconductor layer is preferably set to be greater than or equal to 1 nm and less than or equal to 1000 nm, and more preferably, greater than or equal to 10 nm and less than or equal to 100 nm. As a specific method, an evaporation method, an electron beam evaporation method, a coating method, or the like can be used.

Figure 16B:
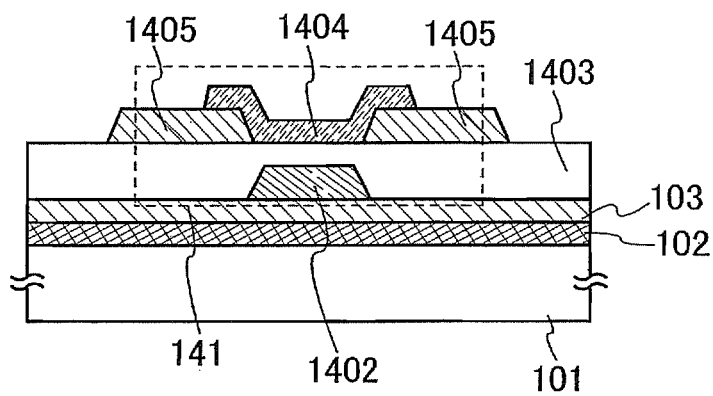

As shown in FIG. 16B, the gate electrode 1402, the insulating layer 1403 which serves as a gate insulating film, the wirings 1405, and the semiconductor layer 1404 which overlaps with the gate electrode and the insulating layer which serves as the gate insulating layer may be formed. Further, a part of the wirings 1405 is interposed between the insulating layer which serves as the gate insulating layer and the semiconductor layer 1404.

Figure 16C:
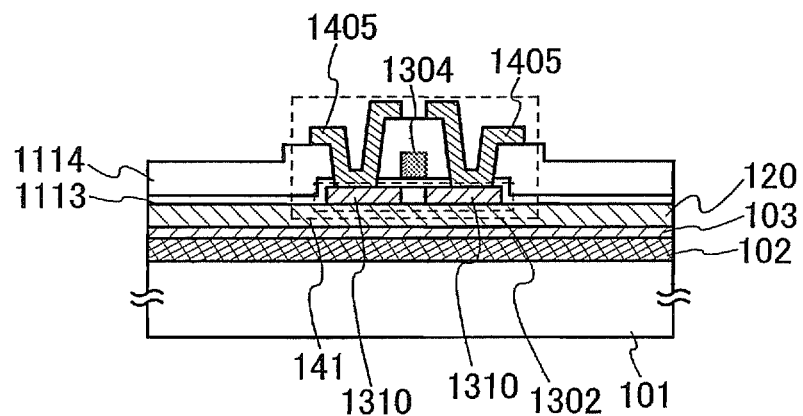

FIG. 16C shows an example of a top gate thin film transistor. The photocatalytic layer 102 and the organic compound layer 103 are provided over the substrate 101, and the thin film transistor 141 is provided over the organic compound layer 103. In the thin film transistor 141, a semiconductor layer 1302 and a gate insulating layer 1113 formed with an inorganic insulator are provided over the organic compound layer 103. Over the gate insulating layer 1113, a gate electrode 1304 corresponding to the semiconductor layer 1302 is formed. An insulating layer (not shown) which serves as a protective layer and an inorganic insulating layer 1114 which serves as an interlayer insulating layer are formed over the gate electrode 1304. The wirings 1405 connected to source and drain regions 1310 of the semiconductor layer are formed. Further, an insulating layer which serves as a protective layer may be formed over the wirings 1405.

The semiconductor layer 1302 is a layer which is formed using a semiconductor having a crystalline structure. A non-single crystal semiconductor or a single crystal semiconductor can be used. In particular, it is preferable to use a crystalline semiconductor obtained by irradiating an amorphous silicon film with a laser beam. In the case of crystallization by laser irradiation, it is possible to conduct crystallization in such a way that a melting zone in which a crystalline semiconductor that is melted is continuously moved along an irradiation direction of a laser beam is delivered, wherein the laser beam is a continuous wave laser beam or an ultrashort pulsed laser beam having a high repetition rate of 10 MHz or more and a pulse width of 1 nanosecond or less, preferably 1 to 100 picoseconds. By using such a crystallization method, a crystalline semiconductor having large grain diameter with a crystal grain boundary extending in one direction can be obtained. By making a drift direction of carriers conform to the direction where the crystal grain boundary extends, the electric field effect mobility in the transistor can be increased. For example, 400 cm$^2$/V·sec or more can be achieved.

Note that when the thin film transistor 141 having a crystalline semiconductor layer is formed, the organic compound layer 103 is preferably formed using a compound with high heat resistance. As the organic compound with high heat resistance, there are polyimide, polycarbonate, an epoxy resin, polyester, polyamide-imide, and the like.

The gate electrode 1304 can be formed with a metal or a poly-crystalline semiconductor to which an impurity having one conductivity type is added. In the case of using a metal, tungsten (W), molybdenum (Mo), titanium (Ti), tantalum (Ta), aluminum (Al), or the like can be used. Moreover, a metal nitride obtained by nitriding the metal can also be used. Alternatively, a structure in which a first layer including the metal nitride and a second layer including the metal are stacked may be used. In the case of a layered structure, an end portion of the first layer may protrude from an end portion of the second layer. By forming the first layer using the metal nitride, the first layer can be used as a metal barrier. In other words, the first layer can prevent the metal of the second layer from diffusing into the gate insulating layer 1113 and the semiconductor layer 1302 below the gate insulating layer 1113.

The thin film transistor formed by combining the semiconductor layer 1302, the gate insulating layer 1113, the gate electrode 1304, and the like can have any structure such as a single drain structure, an LDD (Lightly Doped Drain) structure, or a gate-overlapped drain structure. Here, a thin film transistor having a single drain structure is shown. Moreover, it is also possible to employ a multi-gate structure in which transistors to which gate voltage having the same electric potential is applied are connected in series, or a dual gate structure in which the semiconductor layer is sandwiched between the upper and lower gate electrodes.

In this embodiment mode, the inorganic insulating layer 1114 is formed of an inorganic insulator such as silicon oxide or silicon oxynitride.

The wirings 1405 formed over the inorganic insulating layer 1114 can be provided so as to intersect with a wiring to be formed in the same layer as the gate electrode 1304 and has a multilayer wiring structure. The multilayer wiring structure can be obtained by forming wirings over a plurality of stacked insulating layers which have a similar function to the inorganic insulating layer 1114. The wirings 1405 preferably have a combination of a low-resistant material such as aluminum and barrier metal using a refractory metal material such as titanium (Ti) or molybdenum (Mo). For example, a layered structure including titanium (Ti) and aluminum (Al), a layered structure including molybdenum (Mo) and aluminum (Al), and the like are given.

Next, an insulating layer 143 which covers an end portion of the first conductive layer 142 of FIG. 6A is formed. Next, a functional layer 144 is formed over the first conductive layer 142 and the insulating layer 143, and a second conductive layer 145 is formed over the functional layer 144. The first conductive layer 142, the insulating layer 143, and the second conductive layer 145 can be formed similarly to the first conductive layer 121, the insulating layer 122, and the second conductive layer 124 of FIGS. 5A to 5D, respectively. Next, an insulating layer may be formed over the second conductive layer 145. Further, a substrate 147 having flexibility may be provided over the second conductive layer 145 and the insulating layer 143 with an adhesive agent 146 interposed therebetween. Here, the element 126 can be formed with the first conductive layer 142, the functional layer 144, and the second conductive layer 145.

Figure 6B:
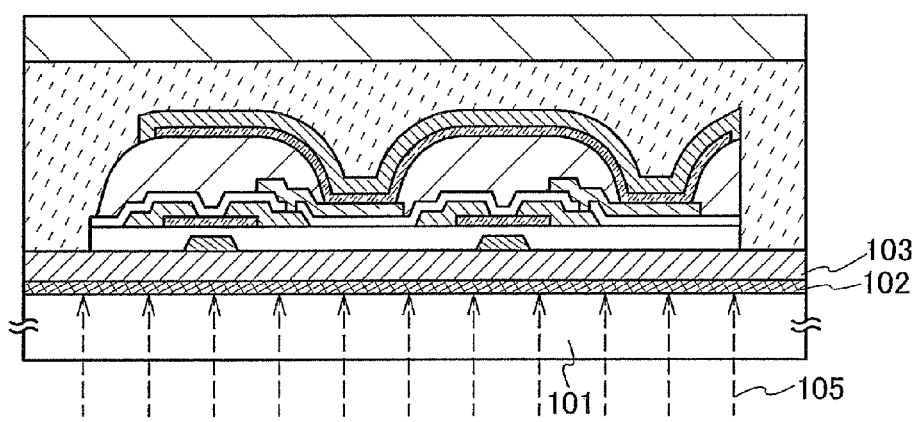

Next, as shown in FIG. 6B, the photocatalytic layer 102 is irradiated with the light 105 through the substrate 101 having the light transmitting property. As a result, the photocatalytic layer 102 is activated. Accordingly, the photocatalytic layer 102 and the organic compound layer 103 are separated from each other as shown in FIG. 6C.

Figure 6C:
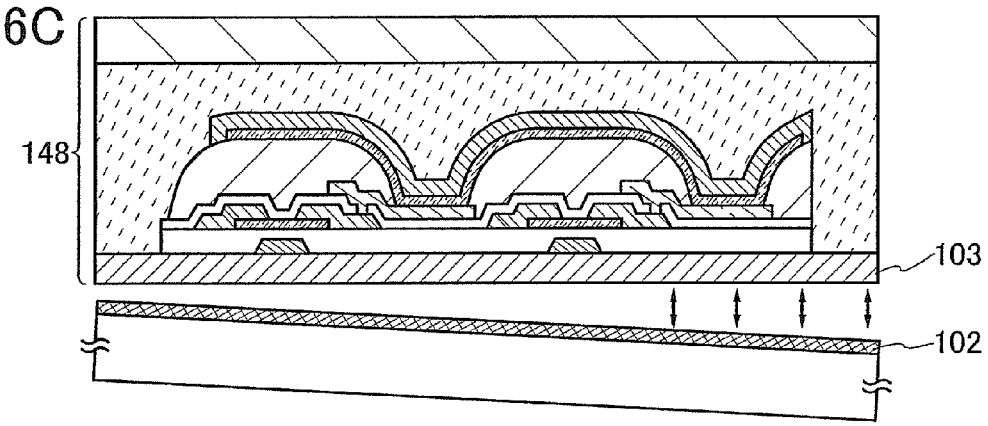
Figure 6D:
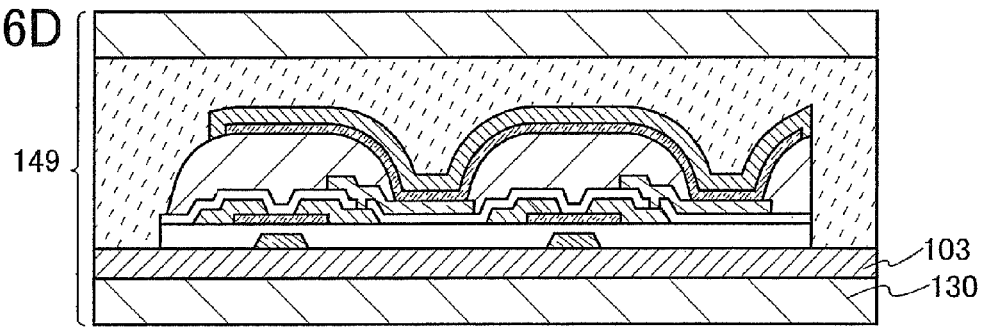

By the above-described steps, as shown in FIG. 6C, a semiconductor device 148 including the element forming layer and the organic compound layer 103 can be formed. Note that after the separation process shown in FIG. 6C, the surface of the organic compound layer 103 may be provided with the substrate 130 having flexibility, so that a semiconductor device 149 as shown in FIG. 6D may be formed.

Here, a structure of the element 126 which can be applied to this embodiment mode is shown below.

In the case where the element 126 is a memory element, a material whose crystalline state, conductivity, shape, or the like is changed by application of voltage or irradiation with light is used as the functional layer 123. Here, a structure of the memory element is shown below, with reference to FIGS. 13A to 13E.

Figure 13A:
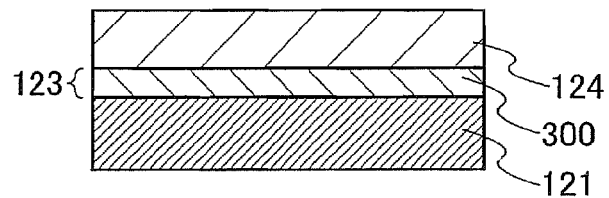
FIGS. 13A to 13E are cross sectional views illustrating a structure of a memory element applicable to the present invention.

As shown in FIG. 13A, a functional layer 123 is formed with a layer 300 including an organic compound. The layer 300 including the organic compound may be provided either in a single-layer structure or a layered structure by stacking a plurality of layers formed with different organic compounds.

The thickness of the layer 300 including the organic compound is preferably set so that the electrical resistance of the memory element changes by applying voltage to the first conductive layer 121 and the second conductive layer 124. The typical thickness of the layer including the organic compound ranges from 5 nm to 100 nm, preferably from 10 nm to 60 nm.

The layer 300 including the organic compound can be formed with an organic compound having a hole-transporting property or an organic compound having an electron-transporting property.

As the organic compound having the hole-transporting property, for example, phthalocyanine (abbreviation: H$_2$Pc), copper phthalocyanine (abbreviation: CuPc), and vanadyl phthalocyanine (VOPc) are given. Besides those, the following are given: 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4"-tri(N-carbazolyl)triphenylamine (abbreviation: TCTA); and the like. However, the present invention is not limited to these. Among the above-mentioned compounds, aromatic amine compounds typified by TDATA, MTDATA, m-MTDAB, TPD, NPB, DNTPD, BBPB, and TCTA are preferably used as the organic compound because they easily generate holes. The substances mentioned here mainly have a hole mobility of 10$^{-6}$ cm$^2$/Vs or higher.

As the organic compound having the electron-transporting property, the following metal complex having a quinoline skeleton or a benzoquinoline skeleton, or the like can be used: tris(8-quinolinolato)aluminum (abbreviation: Alq$_3$); tris(4-methyl-8-quinolinolato)aluminum (abbreviation: Almq$_3$);

bis(10-hydroxybenzo[h]-quinolinato)beryllium (abbreviation: BeBq$_2$); bis(2-methyl-8-quinolinolato)-4-phenylphenolato-aluminum (BAlq); and the like. Besides those, the following metal complex having an oxazole-based ligand or a thiazole-based ligand, or the like can be used: bis[2-(2-hydroxyphenyl)benzoxazolato]zinc (abbreviation: Zn(BOX)$_2$); bis[2-(2-hydroxyphenyl)benzothiazolato]zinc (abbreviation: Zn(BTZ)$_2$); and the like. Furthermore, in addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used. The substances mentioned here mainly have an electron mobility of $10^{-6}$ cm$^2$/Vs or higher.

Figure 13B:
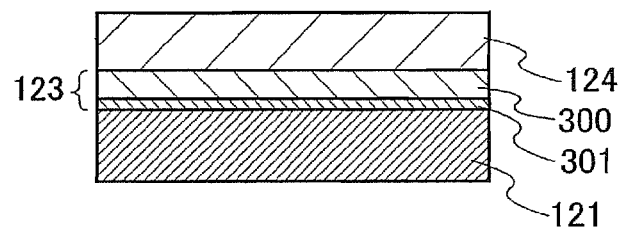

As shown in FIG. 13B, the functional layer 123 may be formed with the layer 300 including the organic compound and an insulating layer 301 formed between the first conductive layer 121 and the layer 300 including the organic compound.

The insulating layer 301 is a layer for injecting charges of holes or electrons from the first conductive layer or the second conductive layer to the layer including the organic compound, by a tunnel effect. The insulating layer 301 is formed to have the thickness capable of injecting charges to the layer 300 including the organic compound by a tunnel effect at a predetermined voltage. The typical thickness of the insulating layer 301 is greater than or equal to 1 nm and less than or equal to 4 nm, preferably greater than or equal to 1 nm and less than or equal to 2 nm. Since the insulating layer 301 is very thin such that the thickness of the insulating layer 301 is greater than or equal to 1 nm and less than or equal to 4 nm, a tunnel effect occurs in the insulating layer 301, resulting in the increase in the charge-injecting property to the layer 300 including the organic compound. Thus, if the insulating layer 301 is thicker than 4 nm, the tunnel effect does not occur in the insulating layer 301 and the electron injection into the layer 300 including the organic compound becomes difficult; thus, the voltage to be applied at the writing into the memory element increases. Moreover, since the insulating layer 301 is very thin such that the thickness of the insulating layer 301 is greater than or equal to 1 nm and less than or equal to 4 nm, throughput improves.

The insulating layer 301 is formed with an inorganic compound or an organic compound that is stable thermally and chemically.

As typical examples of the inorganic compound that forms the insulating layer 301, the following oxides having an insulating property are given: Li$_2$O, Na$_2$O, K$_2$O, Rb$_2$O, BeO, MgO, CaO, SrO, BaO, Sc$_2$O$_3$, ZrO$_2$, HfO$_2$, RfO$_2$, TaO$_2$, TcO$_2$, MnO$_2$, Fe$_2$O$_3$, CoO, PdO, Ag$_2$O, Al$_2$O$_3$, Ga$_2$O$_3$, Bi$_2$O$_3$, and the like.

As other typical examples of the inorganic compound that forms the insulating layer 301, the following fluorides having an insulating property are given: LiF, NaF, KF, RbF, CsF, BeF$_2$, MgF$_2$, CaF$_2$, SrF$_2$, BaF$_2$, AlF$_3$, NF$_3$, SF$_6$, AgF, MnF$_3$, and the like. Moreover, the following chlorides having an insulating property are given: LiCl, NaCl, KCl, BeCl$_2$, CaCl$_2$, BaCl$_2$, AlCl$_3$, GeCl$_4$, SnCl$_4$, AgCl, ZnCl$_2$, TiCl$_4$, TiCl$_3$, ZrCl$_4$, FeCl$_3$, PdCl$_2$, SbCl$_3$, SbCl$_2$, SrCl$_2$, TlCl$_3$, CuCl, CuC$_2$, MnCl$_2$, RuCl$_2$, and the like. The following bromides having an insulating property are given: KBr, CsBr, AgBr, BaBr$_2$, SiBr$_4$, LiBr, and the like. Furthermore, the following iodides having an insulating property are given: NaI, KI, BaI$_2$, TlI$_3$, AgI, TiI$_4$, CaI$_2$, SiI$_4$, CsI, and the like.

As other typical examples of the inorganic compound that forms the insulating layer 301, the following carbonates having an insulating property are given typically: Li$_2$CO$_3$, K$_2$CO$_3$, Na$_2$CO$_3$, MgCO$_3$, CaCO$_3$, SrCO$_3$, BaCO$_3$, MnCO$_3$, FeCO$_3$, CoCO$_3$, NiCO$_3$, CuCO$_3$, Ag$_2$CO$_3$, ZnCO$_3$, and the like. In addition, the following sulfates having an insulating property are given typically: Li$_2$SO$_4$, K$_2$SO$_4$, Na$_2$SO$_4$, MgSO$_4$, CaSO$_4$, SrSO$_4$, BaSO$_4$, Ti$_2$(SO$_4$)$_3$, Zr(SO$_4$)$_2$, MnSO$_4$, FeSO$_4$, Fe$_2$(SO$_4$)$_3$, CoSO$_4$, Co$_2$(SO$_4$)$_3$, NiSO$_4$, CuSO$_4$, Ag$_2$SO$_4$, ZnSO$_4$, Al$_2$(SO$_4$)$_3$, In$_2$(SO$_4$)$_3$, SnSO$_4$, Sn(SO$_4$)$_2$, Sb$_2$(SO$_4$)$_3$, Bi$_2$(SO$_4$)$_3$, and the like. In addition, the following nitrates having an insulating property are given typically: LiNO$_3$, KNO$_3$, NaNO$_3$, Mg(NO$_3$)$_2$, Ca(NO$_3$)$_2$, Sr(NO$_3$)$_2$, Ba(NO$_3$)$_2$, Ti(NO$_3$)$_4$, Sr(NO$_3$)$_2$, Ba(NO$_3$)$_2$, Ti(NO$_3$)$_4$, Zr(NO$_3$)$_4$, M(NO$_3$)$_2$, Fe(NO$_3$)$_2$, Fe(NO$_3$)$_3$, Co(NO$_3$)$_2$, Ni(NO$_3$)$_2$, Cu(NO$_3$)$_2$, AgNO$_3$, Zn(NO$_3$)$_2$, Al(NO$_3$)$_3$, In(NO$_3$)$_3$, Sn(NO$_3$)$_2$, and the like. Furthermore, nitrides having an insulating property, typified by AlN, SiN, and the like are given. The compositions of these inorganic compounds are not necessarily a strict integer ratio.

If the insulating layer 301 is formed with the inorganic compound, the thickness of the insulating layer is preferably greater than or equal to 1 nm and less than or equal to 2 nm. When the insulating layer has a thickness of 3 nm or more, the voltage to be applied at the writing increases.

As typical examples of the organic compound that forms the insulating layer 301, polyimide, acrylic, polyamide, benzocyclobutene, polyester, a novolac resin, a melamine resin, a phenol resin, an epoxy resin, a silicon resin, a furan resin, a diallylphthalate resin, and the like are given.

The insulating layer 301 can be formed by an evaporation method, an electron beam evaporation method, a sputtering method, a CVD method, or the like. Moreover, a spin coating method, a sol-gel method, a printing method, a droplet discharging method, or the like can be used.

Figure 13C:
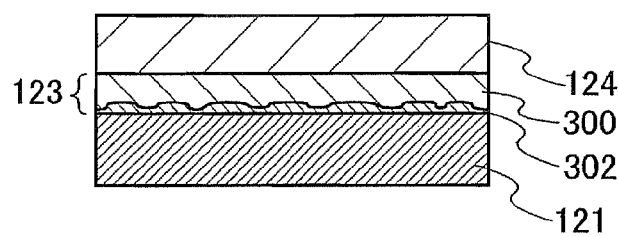

As shown in FIG. 13C, an insulating layer 302 having depressions and projections, which is continuous may be used for the functional layer 123, instead of the insulating layer 301. Note that, in this case, it is preferable that the thickness of the insulating layer at the projection portion be greater than or equal to 1 nm and less than or equal to 4 nm, and that of the insulating layer at the depression portion be greater than or equal to 1 nm and less than 2 nm.

Figure 13D:
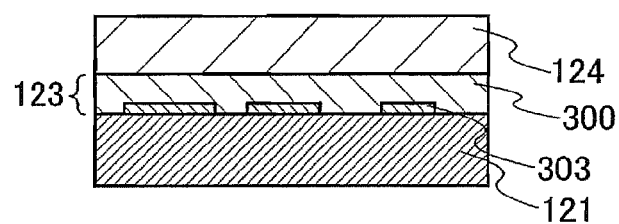

As shown in FIG. 13D, discontinuous insulating layers 303 dispersed over the first conductive layer 121, may be provided instead of the insulating layers 301 and 302. The discontinuous insulating layers 303 may have an island shape, a stripe shape, a net-like shape, or the like.

Moreover, insulating particles may be provided instead of the insulating layers 301 to 303. The insulating particles at this time have a grain size greater than or equal to of 1 nm and less than or equal to 4 nm.

Moreover, the insulating layers 301 to 303 or the insulating particles may be provided between the layer 300 including the organic compound and the second conductive layer 124.

When the insulating layer with a thickness of 4 nm or less, preferably 2 nm or less, is provided between the first conductive layer and the layer including the organic compound, or between the layer including the organic compound and the second conductive layer, a tunnel current flows to the insulating layer. Thus, it is possible to decrease unevenness in voltage to be applied and current value at writing into the memory element. Moreover, when the insulating layer with a thickness of 4 nm or less, preferably 2 nm or less, is provided between the first conductive layer and the layer including the organic compound, or between the layer including the organic compound and the second conductive layer, a charge-injecting property due to the tunnel effect increases, whereby the layer including the organic compound can be made thicker. Thus, short-circuiting at an initial state can be prevented. Accordingly, the reliability of the memory device and the semiconductor device can be improved.

Figure 13E:
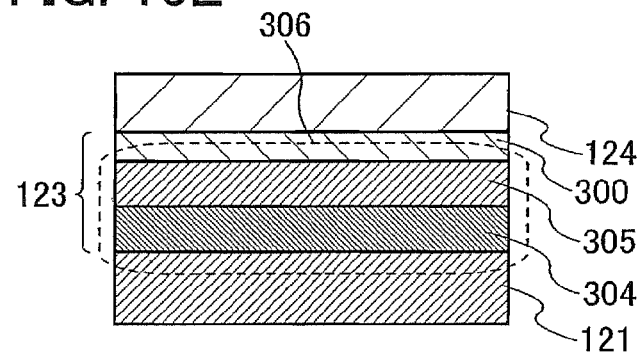

As a different structure from the above-mentioned one, the functional layer 123 may be formed using the layer 300 including the organic compound and an element 306 having a rectification which is formed between the layer 300 including the organic compound and the first conductive layer 121 or between the second conductive layer 124 and the layer 300 including the organic compound (FIG. 13E). As the element 306 having a rectification, typically, a Schottky diode, a diode having a PN junction, a diode having a PIN junction, or a transistor having a gate electrode and a drain electrode connected to each other is given. Needless to say, a diode having another structure can also be used. Here, a case is shown, in which a PN junction diode including semiconductor layers 304 and 305 is provided between the first conductive layer 121 and the layer 300 including the organic compound. One of the semiconductor layers 304 and 305 is an N-type semiconductor while the other is a P-type semiconductor. By providing the element having a rectification in this way, the selectivity of a memory element can be improved and operation margin of reading and writing can be improved.

In the case where the element 126 is an EL element, a light emitting material is used for the functional layer 123. Here, a structure of the EL element is described below, with reference to FIGS. 14A to 14E.

In addition, when a layer (hereinafter referred to as a light emitting layer 313) which has a light emitting function and is formed using an organic compound is formed in the functional layer 123, the element 126 serves as an organic EL element.

As the organic compound having a light emitting property, for example, the following are given: 9,10-di(2-naphthyl) anthracene (abbreviation: DNA); 2-tert-butyl-9,10-di(2-naphthypanthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-6-[p-(dimethylamino)styryl]-4H-pyran (abbreviation: DCM1); 4-(dicyanomethylene)-2-methyl-6-[2-(julolidin-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Moreover, compounds capable of emitting phosphorescence such as the following can be given: bis[2-(4',6'-difluorophenyl)pyridinato-$N,C^2$] (picolinato)iridium (abbreviation: FIrpic); bis{2-[3',5'-bis (trifluoromethyl)phenyl]pydinato-$N,C^2$}(picolinate)iridium (abbreviation: Ir($CF_3$ppy)$_2$(pic)); tris(2-phenylpyridinato-N, $C^2$)iridium (abbreviation: Ir(ppy)$_3$); (acetylacetonato)bis(2-phenylpyridinato-$N,C^2$)iridium (abbreviation: Ir(ppy)$_2$(acac)); (acetylacetonato)bis[2-(2'-thienyl)pyridinato-$N,C^3$] iridium (abbreviation: Ir(thp)$_2$(acac)); (acetylacetonato)bis (2-phenylquinolinato-$N,C^2$)iridium (abbreviation: Ir(pq)$_2$(acac)); (acetylacetonato)bis[2-(2'-benzothienyl)pyridinato-$N,C^3$]iridium (abbreviation: Ir(btp)$_2$(acac)), and the like.

Figure 14A:
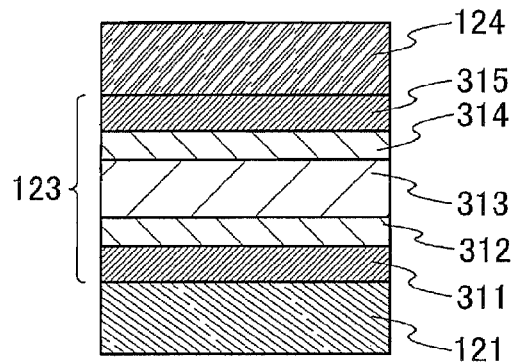
FIGS. 14A to 14E are cross sectional views illustrating structures of light emitting elements applicable to the present invention.

As shown in FIG. 14A, the element 126 which functions as a light emitting element may be formed by stacking a hole-injecting layer 311 formed with a hole-injecting material, a hole-transporting layer 312 formed with a hole-transporting material, the light emitting layer 313 formed with an organic compound having a light emitting property, an electron-transporting layer 314 formed with an electron-transporting material, an electron-injecting layer 315 formed with an electron-injecting material, and the second conductive layer 124, over the first conductive layer 121.

Here, the hole-transporting material cited in the description of the layer 300 including the organic compound in FIG. 13A can be used as appropriate as the hole-transporting material.

In addition to the above-mentioned hole-transporting materials, a conductive high-molecular compound which has been chemically doped, polyethylene dioxythiophene (abbreviation: PEDOT) doped with polystyrene sulfonate (abbreviation: PSS), doped polyaniline (abbreviation: PAni), or the like can be used as the hole-injecting material. Moreover, a thin film of an inorganic semiconductor such as molybdenum oxide ($MoO_x$), vanadium oxide ($VO_x$), or nickel oxide ($NiO_x$), or an ultrathin film of an inorganic insulator such as aluminum oxide ($Al_2O_3$) is also effective.

Here, as the electron-transporting material, the electron-transporting material cited in the description of the layer 300 including the organic compound shown in FIG. 13A can be used as appropriate.

As the electron-injecting material, in addition to the above-mentioned electron-transporting materials, an ultrathin film of an insulator is often used; for example, a halide of an alkali metal such as LiF or CsF, a halide of an alkaline earth metal such as $CaF_2$, or an oxide of an alkali metal such as $Li_2O$. Moreover, an alkali metal complex such as lithium acetylacetonate (abbreviation: Li(acac)) or 8-quinolinolato-lithium (abbreviation: Liq) is also effective. Further, a material in which the above-mentioned electron-transporting material and a metal having a low work function such as Mg, Li, or Cs are mixed by a co-evaporation method or the like can be used.

Figure 14B:
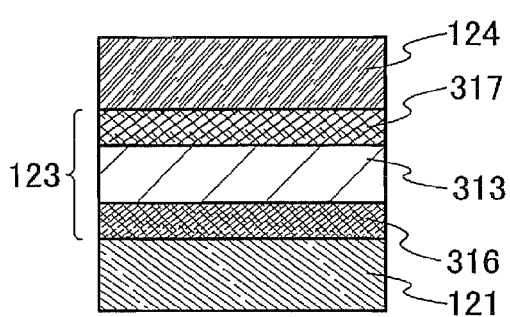

As shown in FIG. 14B, the element 126 which functions as a light emitting element may be formed using the first conductive layer 121, a hole-transporting layer 316 formed with an organic compound and an inorganic compound having an electron-accepting property with respect to the organic compound, the light emitting layer 313, an electron-transporting layer 317 formed with an organic compound and an inorganic compound having an electron-donating property with respect to the organic compound, and the second conductive layer 124.

The hole-transporting layer 316 formed with the organic compound and the inorganic compound having the electron-accepting property with respect to the organic compound is formed by appropriately using the above-mentioned organic compound having the hole-transporting property as the organic compound. As the inorganic compound, any inorganic compound can be used as long as electrons are easily accepted from the organic compound, and various metal oxides or metal nitrides can be used. In particular, an oxide of a transition metal belonging to any of Groups 4 to 12 of the periodic table of the elements is preferable because such an oxide is likely to have an electron-accepting property. Specifically, titanium oxide, zirconium oxide, vanadium oxide, molybdenum oxide, tungsten oxide, rhenium oxide, ruthenium oxide, zinc oxide, or the like is given. Of the metal oxides described above, an oxide of a transition metal belonging to any of Groups 4 to 8 of the periodic table of the elements is preferable for its high electron-accepting property. In particular, vanadium oxide, molybdenum oxide, tungsten oxide, and rhenium oxide are preferable because they can be evaporated in vacuum and are easily treated.

In the electron-transporting layer 317 formed with an organic compound and an inorganic compound having an electron-donating property with respect to the organic compound, the organic compound is formed by appropriately using the above-mentioned organic compound having an electron-transporting property. As the inorganic compound, any inorganic compound can be used as long as electrons are easily donated to the organic compound, and various metal oxides or metal nitrides can be used. In particular, an alkali metal oxide, an alkaline earth metal oxide, a rare earth metal oxide, an alkali metal nitride, an alkaline earth metal nitride, and a rare earth metal nitride are preferable because such oxides and nitrides are likely to have an electron-donating property. Specifically, lithium oxide, strontium oxide, barium oxide, erbium oxide, lithium nitride, magnesium nitride, calcium nitride, yttrium nitride, lanthanum nitride, or the like is given. In particular, lithium oxide, barium oxide, lithium nitride, magnesium nitride, and calcium nitride are preferable because they can be evaporated in vacuum and are easily treated.

Since the electron-transporting layer 317 or the hole-transporting layer 316 formed with the organic compound and the inorganic compound is superior in an electron-injecting/transporting property, various materials can be used to form the first conductive layer 121 and the second conductive layer 124 without much restriction by the work function, and moreover, the drive voltage can be decreased.

The functional layer 123 has a layer (hereinafter, referred to as a light emitting layer 319) which has a light emitting function and is formed using an inorganic compound; therefore, the element 126 functions as an inorganic EL element. The inorganic EL element is categorized as a dispersed inorganic EL element or a thin film inorganic EL element in accordance with the element structure. They are different in that the former dispersed inorganic EL element has an electroluminescent layer in which particles of a light emitting material are dispersed in a binder, and the latter thin film inorganic EL element has an electroluminescent layer formed of a thin film made of a light emitting material; however, a common point is that they both require electrons which are accelerated by a high electric field. As a mechanism of the obtained emission, there are two types: donor-acceptor recombination emission in which a donor level and an acceptor level are used, and local emission in which inner shell electron transition in a metal ion is used. Generally, the dispersed inorganic EL element typically has a donor-acceptor recombination emission and the thin film inorganic EL element typically has local emission. Hereinafter, a structure of an inorganic EL element is shown.

The light emitting material which can be used in the present invention is formed of a host material and an impurity element which becomes a luminescence center. By changing the impurity element to be included, various emission colors can be obtained. As a method for manufacturing the light emitting material, various methods such as a solid phase method, a liquid phase method (a coprecipitation method), or the like can be used. Alternatively, a spray pyrolysis method, a double decomposition method, a method by thermal decomposition reaction of a precursor, a reversed micelle method, a method in which these methods and high temperature baking are combined, a liquid phase method such as a freeze-drying method, or the like can be used.

The solid phase method is a method in which a compound including a host material and an impurity element or a compound including the impurity element are weighed, mixed in a mortar, heated in an electric furnace and baked to react so as to include an impurity element in the host material. The baking temperature is preferably 700° C. to 1500° C. This is because solid-phase reaction does not proceed when the temperature is too low, and the host material is decomposed when the temperature is too high. The baking may be performed in a powder state; however, it is preferably performed in a pellet state. Baking at a relatively high temperature is required. However, since it is a simple method, high productivity can be obtained; therefore, it is suitable for mass production.

The liquid phase method (coprecipitation method) is a method in which a host material or a compound including the host material, and an impurity element or a compound including the impurity element are reacted in a solution, dried, and then baked. Since the particles of the light emitting material are dispersed uniformly, the reaction occurs even if the particles are small and baking temperature is low.

As the host material to be used for the light emitting material, a sulfide, an oxide, or a nitride can be used. As a sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As a nitride, for example, aluminum nitride (AlN), gallium nitride (GaN), indium nitride (InN), or the like can be used. Alternatively, zinc selenide (ZnSe), zinc telluride (ZnTe), or the like can be also used. Furthermore, mixed crystal of a three-dimensional structure such as calcium sulfide-gallium ($CaGa_2S_4$), strontium sulfide-gallium ($SrGa_2S_4$), and barium sulfide-gallium ($BaGa_2S_4$) may be used.

As a luminescence center of the local emission, manganese (Mn), copper (Cu), samarium (Sm), terbium (Tb), erbium (Er), thulium (Tm), europium (Eu), cerium (Ce), praseodymium (Pr), or the like can be used. As charge compensation, a halogen element such as fluorine (F) or chlorine (Cl) may be added.

On the other hand, as a luminescence center of the donor-acceptor recombination emission, a light emitting material including a first impurity element forming a donor level and a light emitting material including a second impurity element forming an acceptor level can be used. As the first impurity element, for example, fluorine (F), chlorine (Cl), aluminum (Al), or the like can be used. As the second impurity element, for example, copper (Cu), silver (Ag), or the like can be used.

When a light emitting material of donor-acceptor recombination emission is synthesized by a solid phase method, a host material, a first impurity element or a compound including the first impurity element, and a second impurity element or a compound including the second impurity element are weighed, mixed in a mortar, heated in an electric furnace and baked. As the host material, the above-mentioned host materials can be used. As the first impurity element or the compound including the first impurity element, for example, fluorine (F), chlorine (Cl), aluminum sulfide ($Al_2S_3$), or the like can be used. As the second impurity element or the compound including the second impurity element, for example, copper (Cu), silver (Ag), copper sulfide ($Cu_2S$), silver sulfide ($Ag_2S$), or the like can be used. The baking temperature is preferably 700° C. to 1500° C. This is because a solid-phase reaction does not proceed when the temperature is too low, and the host material is decomposed when the temperature is too high. The baking may be performed in a powder state; however it is preferably performed in a pellet state.

As an impurity element in the case of using a solid-phase reaction, a combination of compounds formed of the first impurity element and the second impurity element may be used. In this case, since the impurity element is easily dispersed and the solid-phase reaction is easily advanced, a uniform light emitting material can be obtained. Furthermore, since no unnecessary impurity element is mixed, the light emitting material with high purity can be obtained. As the compound formed of the first impurity element and the second impurity element, for example, copper chloride (CuCl), silver chloride (AgCl), or the like can be used.

Note that the concentration of these impurity elements is in the range of 0.01 to 10 atom % with respect to the host material, preferably, 0.05 to 5 atom %.

Figure 14C:
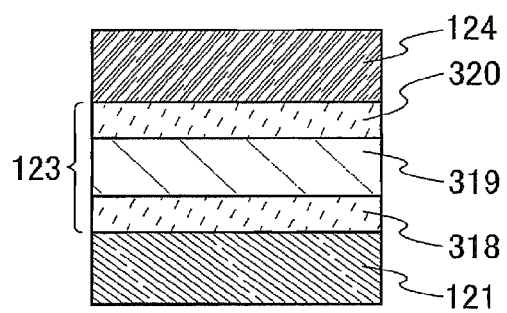

FIG. 14C shows a cross section of an inorganic EL element in which the functional layer 123 includes a first insulating layer 318, the light emitting layer 319, and a second insulating layer 320.

In the case of a thin film type inorganic EL, the light emitting layer 319 is a layer including the light emitting material, and can be formed by a vacuum evaporation method such as a resistance heating vapor evaporation method or an electron beam evaporation (EB evaporation) method, a physical vapor deposition (PVD) method such as a sputtering method, a metal organic CVD method, a chemical vapor deposition (CVD) method such as a low-pressure hydride transfer CVD method, an atomic layer epitaxy (ALE) method, or the like.

The first insulating layer 318 and the second insulating layer 320 are not particularly limited; however they preferably have a high dielectric strength voltage, a dense film quality, and a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film of these, or a layered film including two or more kinds of these can be used. The first insulating layer 318 and the second insulating layer 320 can be formed by sputtering, evaporation, CVD, or the like. The film thickness is not particularly limited; however, it is preferably in the range of 10 nm to 1000 nm. Note that since the light emitting element in this embodiment mode is not required to have a hot electron, the light emitting element has advantages in that a thin film can be formed and driving voltage can be reduced. The light emitting element preferably has a thickness of 500 nm or less, more preferably a thickness of 100 nm or less.

Note that although not shown, a buffer layer may be provided between the light emitting layer and the insulating layer or between the light emitting layer and the electrode. This buffer layer facilitates carrier injection and functions to suppress mixture of the two layers. Although a material of the buffer layer is not particularly limited, the host material of the light emitting layer such as ZnS, ZnSe, ZnTe, CdS, SrS, BaS, CuS, $Cu_2S$, LiF, $CaF_2$, $BaF_2$, or $MgF_2$ can be used.

Figure 14D:
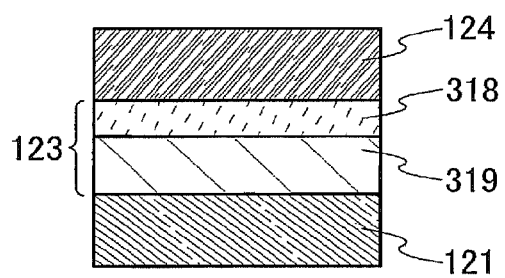

In addition, as shown in FIG. 14D, the functional layer 123 may be formed with the light emitting layer 319 and the first insulating layer 318. In this case, FIG. 14D shows a state in which the first insulating layer 318 is provided between the second conductive layer 124 and the light emitting layer 319. Note that the first insulating layer 318 may be provided between the first conductive layer 121 and the light emitting layer 319.

Furthermore, the functional layer 123 may be formed only with the light emitting layer 319. That is, the element 126 may be formed with the first conductive layer 121, the functional layer 123, and the second conductive layer 124.

In the case of the dispersed inorganic EL, particulate light emitting materials are dispersed in a binder, thereby forming a membranous electroluminescent layer. When a particle having a desired size cannot be obtained by a method for manufacturing the light emitting material, the material can be processed by crushing in a mortar or the like to obtain adequate particulate light emitting materials. The binder is a substance for fixing the particulate light emitting material in a dispersed state, and holding it in a form of an electroluminescent layer. The light emitting material is uniformly dispersed in the electroluminescent layer by the binder and fixed.

In the case of the dispersed inorganic EL, the electroluminescent layer can be formed by a droplet discharge method in which an electroluminescent layer can be selectively formed, a printing method (screen printing, offset printing, or the like), a coating method such as a spin coating method, a dipping method, a dispenser method, or the like. The film thickness is not particularly limited; however, it is preferably in the range of 10 nm to 1000 nm. In the electroluminescent layer including a light emitting material and a binder, the ratio of the light emitting material is preferably greater than or equal to 50 wt % and less than or equal to 80 wt %.

Figure 14E:
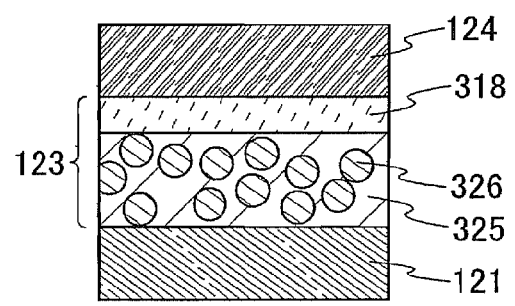

An element in FIG. 14E includes the first conductive layer 121, the functional layer 123, and the second conductive layer 124. The functional layer 123 includes a light emitting layer in which a light emitting material 326 is dispersed in a binder 325, and the insulating layer 318. Note that the insulating layer 318 is in contact with the second conductive layer 124 in FIG. 14E; however, the insulating layer 318 may be in contact with the first conductive layer 121. In addition, the element may include insulating layers which are in contact with the first conductive layer 121 and the second conductive layer 124, respectively. Besides, the element is not required to have insulating layers which are in contact with the first conductive layer 121 and the second conductive layer 124, respectively.

As the binder which can be used in this embodiment mode, an organic material or an inorganic material can be used. In addition, a mixed material of an organic material and an inorganic material can be used. As the organic material, like a cyanoethyl cellulose resin, a polymer having a relatively high dielectric constant; an organic resin such as polyethylene, polypropylene, a polystyrene resin, a silicone resin, an epoxy resin, vinylidene fluoride; or the like can be used. Alternatively, a thermally stable high molecular material such as aromatic polyamide or polybenzimidazole, or a siloxane resin may be used. Note that the siloxane resin corresponds to a resin containing a Si—O—Si bond. In siloxane, a skeleton structure is constituted by a bond of silicon (Si) and oxygen (O). As a substituent, an organic group including at least hydrogen (for example, alkyl group, or aromatic hydrocarbon) is used. As the substituent, a fluoro group may also be used. Alternatively, an organic group including at least hydrogen and fluoro group may be used as a substituent. Alternatively, a resin material such as a vinyl resin like polyvinyl alcohol, polyvinyl butyral, or the like, a phenol resin, a novolac resin, an acrylic resin, a melamine resin, an urethane resin, or an oxazole resin (polybenzoxazole) can be used. Furthermore, a photo-curing resin material or the like can be used. The dielectric constant can be adjusted by adequately mixing fine particles with a high dielectric constant such as barium titanate ($BaTiO_3$) or strontium titanate ($SrTiO_3$) into these resins.

The inorganic material included in the binder can be formed of silicon oxide ($SiO_x$), silicone nitride ($SiN_x$), silicon including oxygen and nitrogen, aluminum nitride (AlN), aluminum including oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or another material selected from a substance including other inorganic materials. By adding the inorganic material having a high dielectric constant to the organic material (using a doping method or the like), the dielectric constant of the electroluminescent layer made from the light emitting material and the binder can be controlled more efficiently, and the dielectric constant can be increased further.

In a manufacturing process, a light emitting material is dispersed in a solution including a binder. As a solvent of solution including the binder which can be used for this embodiment mode, a solvent in which a binder material is dissolved, and a solution having a viscosity suitable for a method for forming a light emitting layer (various wet processes) and for a desired film thickness can be formed, is selected as appropriate. In the case where the organic solvent or the like can be used, for example, a siloxane resin is used as a binder, propylene glycol monomethylether, propylene glycol monomethylether acetate (also referred to as PGMEA), 3-methoxy-3-methyl-1-butanol (also referred to as MMB), or the like can be used.

The inorganic EL light emitting element can obtain light emission by applying voltage between a pair of electrode layers sandwiching the electroluminescent layer; however, the light emitting element can operate either in AC drive or DC drive.

In the case where the element 126 is a diode or a photoelectric conversion element, a material whose electric property is changed by irradiation with light is used for the functional layer 123. As a material whose electric property is changed by irradiation with light, there are an inorganic semiconductor material, an organic compound, and the like.

An inorganic semiconductor can be formed using amorphous silicon, amorphous silicon germanium, microcrystal silicon, microcrystal silicon germanium, or the like by a CVD method, a sputtering method, or the like. As an organic compound, an organic semiconductor material is preferably used; typically, it is desirable to use a π-electron conjugated high molecular material that has skeleton including a conjugated double bond. Typically, soluble high molecular materials may be used, such as polythiophene, poly(3-alkylthiophene), a polythiophene derivative, and pentacene. Alternatively, the semiconductor layers can be formed by forming a soluble precursor and then treating it. The organic semiconductor material obtained by using a precursor includes polythienylenevinylene, poly(2,5-thienylenevinylene), polyacetylene, a polyacetylene derivative, polyallylenevinylene, and the like. The precursor is converted into the organic semiconductor not only by performing heat treatment but also by adding a reaction catalyst such as a hydrogen chloride gas. These soluble organic semiconductor materials can be dissolved in a solvent, typically such as toluene, xylene, chlorobenzene, dichlorobenzene, anisole, chloroform, dichloromethane, γ-butyrlactone, butylcellosolve, cyclohexane, NMP (N-methyl-2-pyrrolidone), cyclohexanone, 2-butanone, dioxane, dimethylformamide (DMF), and tetrahydrofuran (THF). Furthermore, the functional layer 123 can be formed as a bonding layer of a charge-generating layer and a charge-accepting layer formed with an organic compound.

Here, a mode in which the functional layer 123 is formed as a bonding layer of a charge-generating layer and a charge-accepting layer is described with reference to FIGS. 15A to 15D.

Figure 15A:
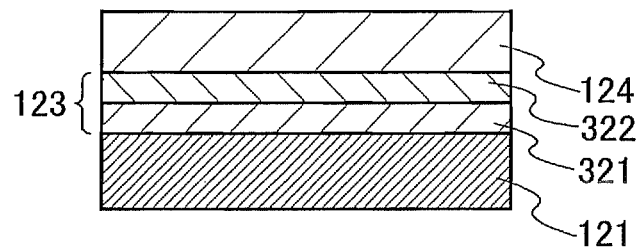
FIGS. 15A to 15D are cross sectional views illustrating structures of a photoelectric conversion element or a diode applicable to the present invention.

As shown in FIG. 15A, a photoelectric conversion element and a diode each have a layered structure in which the first conductive layer 121, a charge-generating layer 321, a charge-accepting layer 322, and the second conductive layer 124 are provided sequentially.

The first conductive layer 121 or the second conductive layer 124 is formed with a conductive layer having a light transmitting property. The charge-generating layer 321 and the charge-accepting layer 322 may be formed by appropriately selecting the above-mentioned organic compound having the hole-transporting property and organic compound having the electron-transporting property cited in the description of the layer 300 including the organic compound shown in FIG. 13A. Moreover, as the organic compound having the electron-transporting property, a perylene derivative, a naphthalene derivative, a quinone derivative, methylviologen, fullerene, an organic metal compound containing ruthenium, platinum, titanium, or the like may be used. Here, the charge-generating layer 321 is formed with a compound having a hole-transporting property, and the charge-accepting layer 322 is formed with a compound having an electron-transporting property.

Figure 15B:
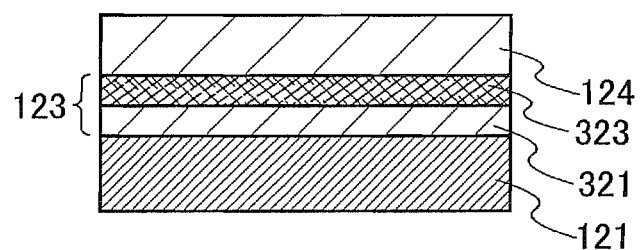

As shown in FIG. 15B, an electron-transporting layer 323 formed with an organic compound having an electron-transporting property and an inorganic compound having an electron-donating property with respect to the organic compound may be provided instead of the charge-accepting layer 322. The electron-transporting layer 323 can be formed by appropriately selecting a compound shown as the electron-transporting layer 317 in FIG. 14B, which is formed with the organic compound having the electron-transporting property and the inorganic compound having the electron-donating property with respect to the organic compound.

Figure 15C:
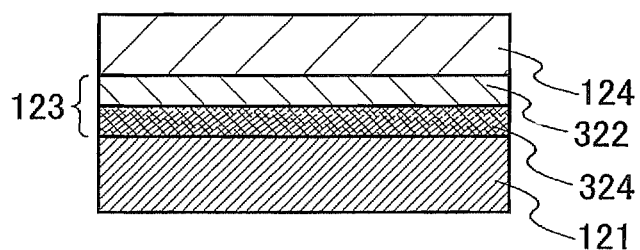

As shown in FIG. 15C, an electron-generating layer 324 formed with an organic compound having a hole-transporting property and an inorganic compound having an electron-accepting property with respect to the organic compound may be provided instead of the charge-generating layer 321. The electron-generating layer 324 can be formed by appropriately selecting a compound shown as the hole-transporting layer 316 in FIG. 14B, which is formed with the organic compound having the electron-transporting property and the inorganic compound having the electron-accepting property with respect to the organic compound.

Figure 15D:
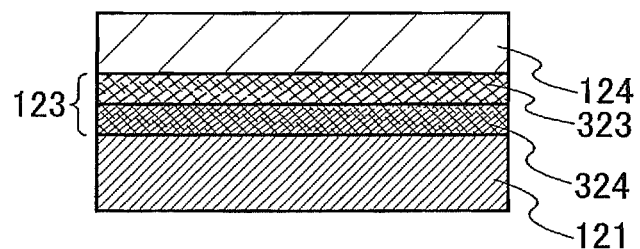

As shown in FIG. 15D, the electron-generating layer 324 formed with an organic compound having a hole-transporting property and an inorganic compound having an electron-accepting property with respect to the organic compound, and the electron-transporting layer 323 formed with the organic compound having the electron-transporting property and the inorganic compound having the electron-donating property with respect to the organic compound, may be provided.

When the layer including the organic compound is formed with the charge-generating layer and the charge-accepting layer which are joined, electrons and holes generated in the charge-generating layer can be used as electron carriers and hole carriers to become photocurrent. Accordingly, a solar cell and a photoelectric conversion device capable of converting light energy into electrical energy can be manufactured.

When the charge-generating layer or the charge-accepting layer is formed with an organic compound and an inorganic compound, electron and hole generating efficiency can be improved. Accordingly, a photoelectric conversion element and a solar cell having high energy conversion efficiency can be achieved.

Embodiment Mode 6

This embodiment mode will describe a typical example of the structure of the element forming layer 104 in Embodiment Modes 1 to 4, with reference to FIGS. 7A to 8D. FIGS. 7A to 7D show a process of manufacturing a passive matrix liquid crystal display device, and FIGS. 8A to 8D show a process of manufacturing an active matrix liquid crystal display device.

Note that Embodiment Mode 1 is used for description in this embodiment mode; however, any of Embodiment Modes 2 to 4 can be applied. This embodiment mode describes a mode in which the element forming layer 104 includes a liquid crystal element having a first conductive layer, a liquid crystal layer, and a second conductive layer.

Figure 7A:
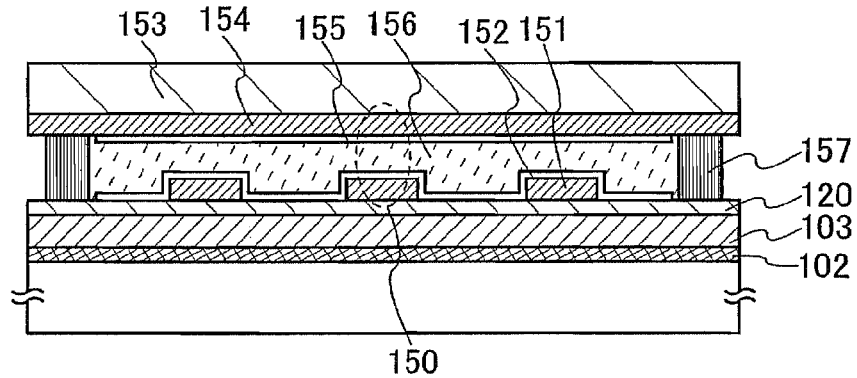
FIGS. 7A to 7D are cross sectional views illustrating a manufacturing process of a semiconductor device of the present invention.

Similarly to Embodiment Mode 1, as shown in FIG. 7A, the photocatalytic layer 102 is formed over the substrate 101 having the light transmitting property, and the organic compound layer 103 is formed over the photocatalytic layer 102. Next, the insulating layer 120 may be formed over the organic compound layer 103. First conductive layers 151 are formed over the insulating layer 120. The first conductive layers 151 are preferably formed to be parallel to each other. Next, an insulating layer 152 which functions as an alignment film is formed over the first conductive layers 151.

By a similar step to the above-described one, a substrate 153 having flexibility is provided with second conductive layers 154, and the second conductive layer is provided with an insulating layer 155 which functions as an alignment film. The second conductive layers 154 are preferably formed to be parallel to each other, similarly to the first conductive layers 151.

The insulating layers 152 and 155 which function as the alignment films can be formed in such a way that a high molecular compound layer such as polyimide or polyvinyl alcohol is formed by a printing method, a roll coating method, or the like, and then rubbing treatment is performed. In addition, the insulating layers 152 and 155 which function as the alignment films can be formed by obliquely evaporating SiO onto a substrate. Further, the insulating layers 152 and 155 which function as the alignment films can be formed by irradiating a photoreactive-type high molecular compound with polarized UV light, and polymerizing the photoreactive-type high molecular compound.

In this embodiment mode, the first conductive layers 151 and the second conductive layers 154 can be formed using the material and the method for manufacturing the first conductive layer 121 and the second conductive layer 124 shown in Embodiment Mode 5, as appropriate. Note that in the case where a liquid crystal display device is a transmissive liquid crystal display device, the first conductive layers 151 and the second conductive layers 154 are formed with conductive layers having light transmitting properties. Further, in the case where a liquid crystal display device is a reflective liquid crystal display device, one of the first conductive layer 151 and the second conductive layer 154 is formed with a conductive layer having a light transmitting property, and the other of the first conductive layer 151 and the second conductive layer 154 is formed with a conductive layer having a reflective property.

In order to keep a space between the substrate 101 having the light transmitting property and the substrate 153 having flexibility, a spacer may be provided between the insulating layers 152 and 155. Further, after a spacer is provided over the insulating layer 120 or the substrate 153 having flexibility, the insulating layer 152 or the insulating layer 155 may be formed. As the spacer, an organic resin is applied, and the organic resin is formed into a desired shape, typically the organic resin is etched into a pillar shape or a columnar shape. In addition, a bead spacer may be used as a spacer.

Note that a colored layer may be provided between the second conductive layer 154 and the substrate 153 having flexibility. The colored layer is required to perform color display, and in the case of an RGB system, colored layers corresponding to respective colors of red, green, and blue are provided corresponding to each pixel.

Next, the substrate 101 having the light transmitting property and the substrate 153 having flexibility are attached to each other using a sealing material 157. A liquid crystal layer 156 is formed between the substrate 101 having the light transmitting property and the substrate 153 having flexibility. The substrate 101 having the light transmitting property and the substrate 153 having flexibility are attached to each other using the sealing material such that the first conductive layers 151 and the second conductive layers 154 intersect with each other. The liquid crystal layer 156 can be formed by a vacuum injection method using capillary phenomenon, and injecting a liquid crystal material into a region surrounded by the substrate 101 having the light transmitting property, the substrate 153 having flexibility, and the sealing material 157. One of the substrate 101 having the light transmitting property and the substrate 153 having flexibility is provided with the sealing material 157 and a liquid crystal material is dropped in a region surrounded by the sealing material, and then, the substrate having the light transmitting property and the substrate having flexibility are pressure-bonded to each other using the sealing material in reduced pressure, so that the liquid crystal layer 156 can be formed.

The sealing material 157 can be formed using a heat curing type epoxy resin, a UV curing type acrylic resin, thermoplastic nylon, polyester, or the like by a dispenser method, a printing method, a thermo-compression bonding method, or the like. Note that filler is dispersed in the sealing material 157, so that the substrate 101 having the light transmitting property and the substrate 153 having flexibility can keep a space therebetween.

As the substrate 153 having flexibility, a similar one to the substrate having flexibility which can be provided over the surface of the element forming layer 104 shown in Embodiment Mode 1 can be selected as appropriate.

Figure 7B:
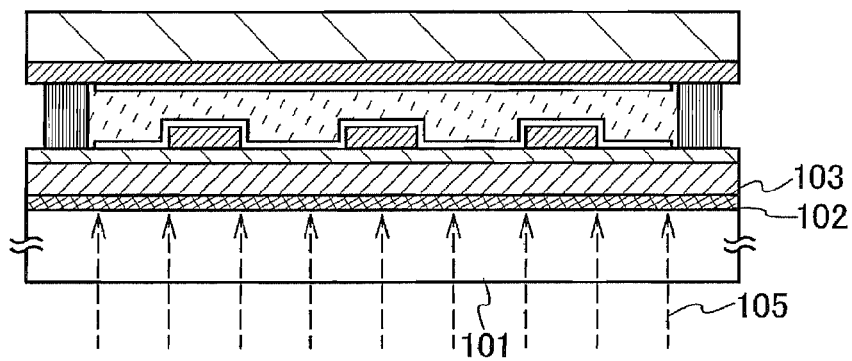

Next, as shown in FIG. 7B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 7C.

Figure 7C:
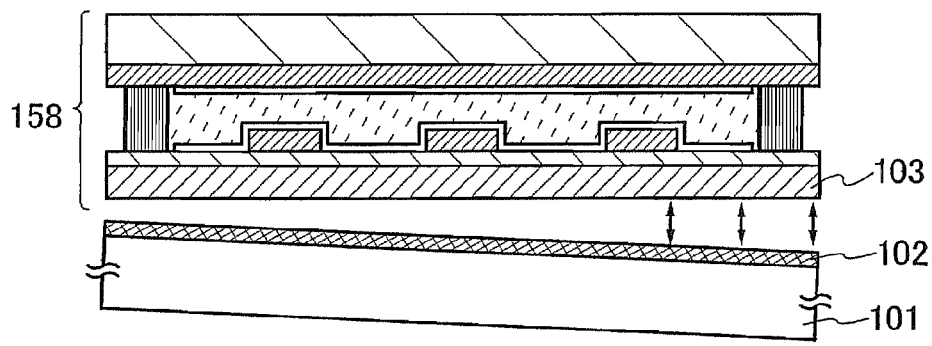
Figure 7D:
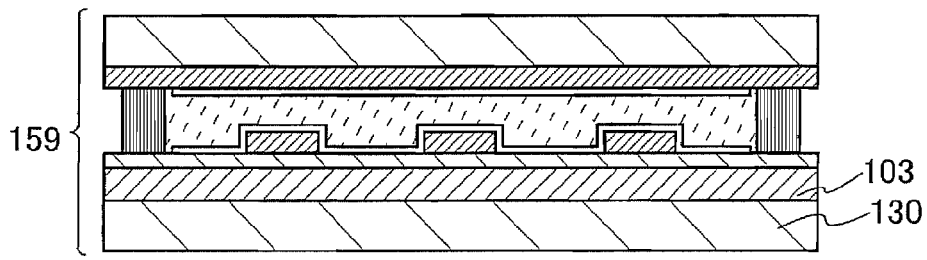

By the above-described steps, as shown in FIG. 7C, a semiconductor device 158 which includes a liquid crystal element 150 and the organic compound layer 103 and which functions as a liquid crystal display device can be formed. Note that after a separating step shown in FIG. 7C, the surface of the organic compound layer 103 may be provided with the substrate 130 having flexibility, so that a semiconductor device 159 as shown in FIG. 7D may be formed.

Figure 8A:
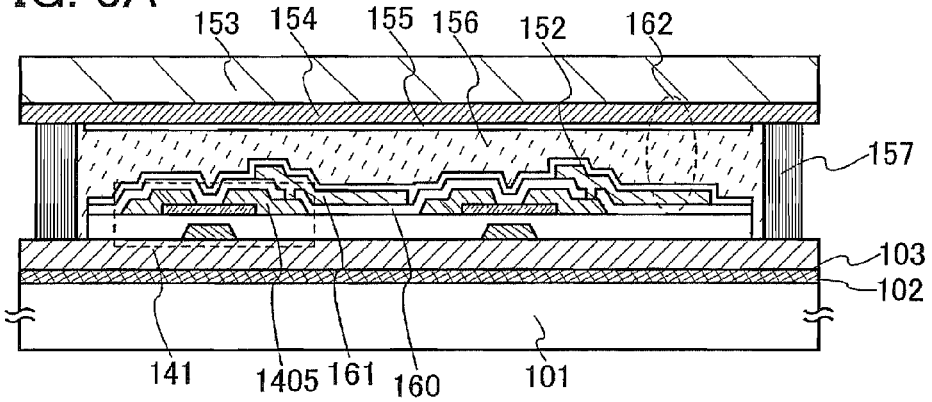
FIGS. 8A to 8D are cross sectional views illustrating a manufacturing process of a semiconductor device of the present invention.

In addition, as shown in FIG. 8A, an element forming layer may be provided with a switching element which is connected to a liquid crystal element 162. As a switching element, there are a thin film transistor, MIM (Metal-Insulator-Metal), a diode, and the like. A mode in which the thin film transistor 141 is used as a switching element is shown here.

That is, as shown in FIG. 8A, the photocatalytic layer 102 is formed over the substrate 101 having the light transmitting property, and the organic compound layer 103 is formed over the photocatalytic layer 102. Next, the thin film transistor 141 which functions as a switching element is formed over the organic compound layer 103. Next, a first conductive layer 161 connected to the wirings of the thin film transistor 141 is formed over an insulating layer 160. Note that the wirings 1405 of the thin film transistor 141 and the first conductive layer 161 are connected to each other with the insulating layer 160 interposed therebetween; however, the present invention is not limited to this structure, and the first conductive layer 161 may be formed with the wiring of the thin film transistor 141. Note that the first conductive layer 161 is formed in each pixel.

In addition, the substrate 153 having flexibility is provided with the second conductive layers 154 and the insulating layer 155 which functions as an alignment film. The second conductive layers 154 may be formed over the entire surface of a pixel portion so that the second conductive layers 154 can serve as a common electrode of each pixel.

Next, the substrate 101 having the light transmitting property and the substrate 153 having flexibility are attached to each other with the sealing material 157. In addition, the liquid crystal layer 156 is formed between the substrate 101 having the light transmitting property and the substrate 153 having flexibility.

Figure 8B:
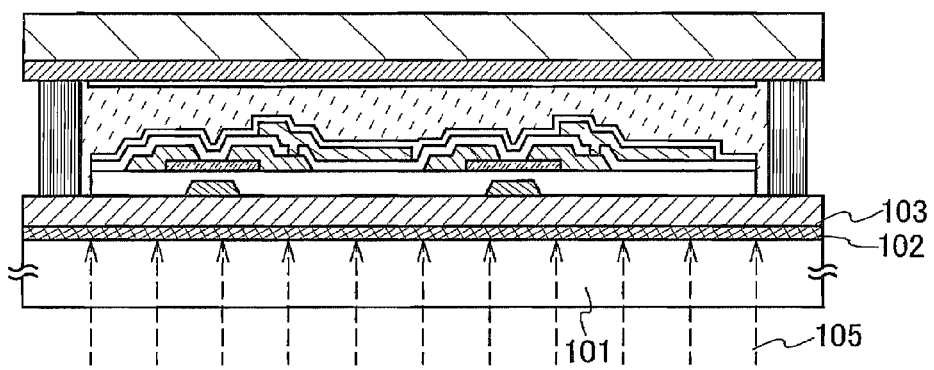

Next, as shown in FIG. 8B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 8C.

Figure 8C:
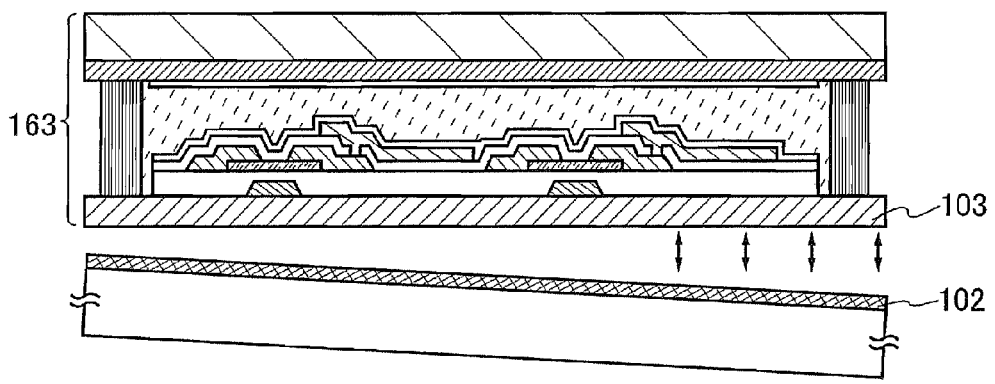
Figure 8D:
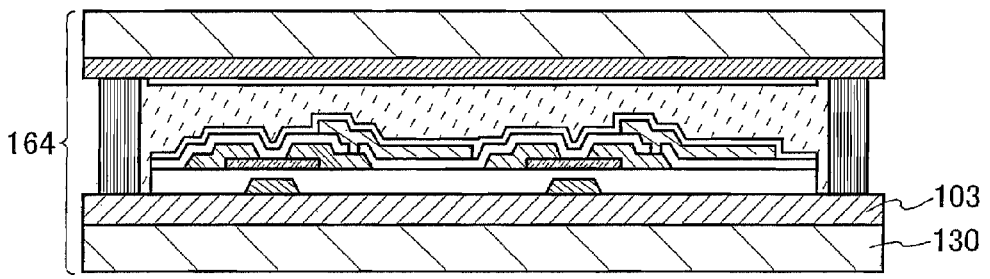

By the above-described steps, as shown in FIG. 8C, a semiconductor device 163 which includes the liquid crystal element 162 and the organic compound layer 103 can be formed. Note that after a separating step shown in FIG. 8C, the surface of the organic compound layer 103 may be provided with the substrate 130 having flexibility, so that a semiconductor device 164 as shown in FIG. 8D may be formed.

By the above-described steps, a semiconductor device having flexibility can be formed.

Embodiment Mode 7

This embodiment mode will describe a typical example of the structure of the element forming layer 104 in Embodiment Modes 1 to 4, with reference to FIGS. 9A to 10D. FIGS. 9A to 9D show a process of manufacturing a passive matrix electrophoretic display device having an electrophoresis element, and FIGS. 10A to 10D show a process of manufacturing an active matrix electrophoretic display device having an electrophoresis element. Note that Embodiment Mode 1 is used for description in this embodiment mode; however, any of Embodiment Modes 2 to 4 can be applied. An electrophoresis element means an element in which a microcapsule containing black and white particles which are charged positively and negatively is arranged between the first conductive layer and the second conductive layer, and a potential difference is generated between the first conductive layer and the second conductive layer, so that the black and white particles can move between electrodes to perform display.

Figure 9A:
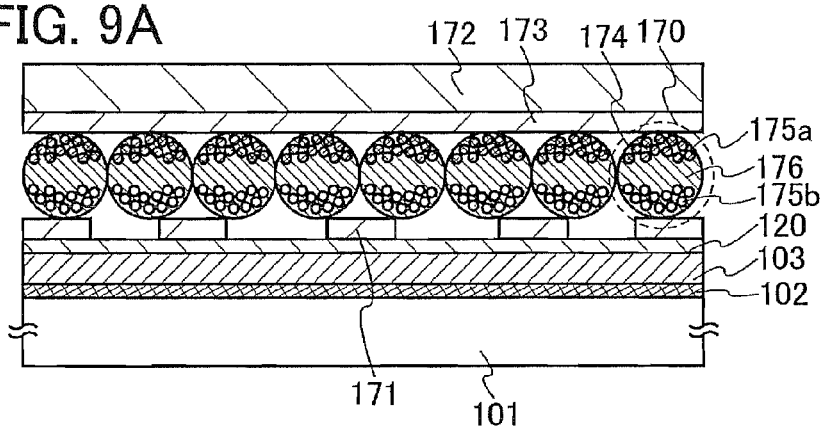
FIGS. 9A to 9D are cross sectional views illustrating a manufacturing process of a semiconductor device of the present invention.

Similarly to Embodiment Mode 1, as shown in FIG. 9A, the photocatalytic layer 102 is formed over the substrate 101 having the light transmitting property, and the organic compound layer 103 is formed over the photocatalytic layer 102. Next, the insulating layer 120 may be formed over the organic compound layer 103. Next, first conductive layers 171 are formed over the insulating layer 120. The first conductive layers 171 are preferably formed to be parallel to each other.

By a similar step to the above-described one, a substrate 172 having flexibility is provided with second conductive layers 173. The second conductive layers 173 are preferably formed to be parallel to each other.

The first conductive layers 171 and the second conductive layers 173 can be formed using the material and the method for manufacturing the first conductive layer 121 and the second conductive layer 124 shown in Embodiment Mode 5, as appropriate.

Next, the substrate 101 having the light transmitting property and the substrate 172 having flexibility are attached to each other using a sealing material. An electrophoresis element is formed between the substrate 101 having the light transmitting property and the substrate 172 having flexibility. The substrate 101 having the light transmitting property and the substrate 172 having flexibility are attached to each other using the sealing material such that the first conductive layers 171 and the second conductive layers 173 intersect with each other. Further, the electrophoresis element includes the first conductive layer 171, a microcapsule 170, and the second conductive layer 173. In addition, the microcapsule 170 is fixed between the first conductive layer 171 and the second conductive layer 173 with a binder.

Figure 17A:
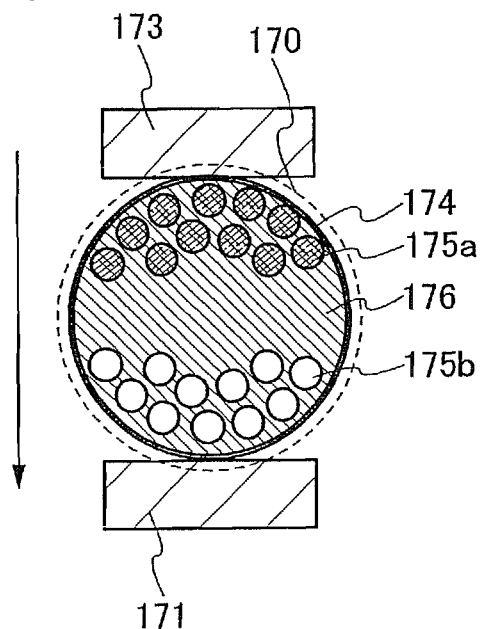
FIGS. 17A to 17D are cross sectional views illustrating structures of electrophoresis elements applicable to the present invention.
Figure 17B:
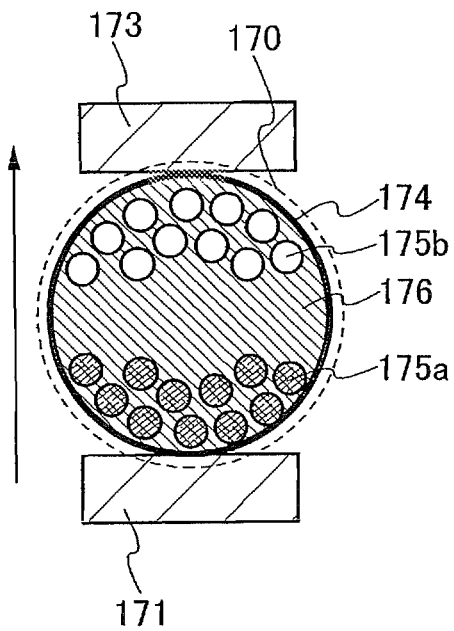
Figure 17C:
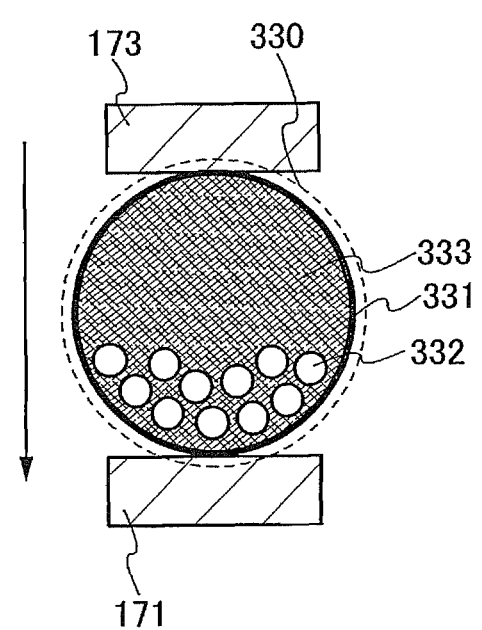
Figure 17D:
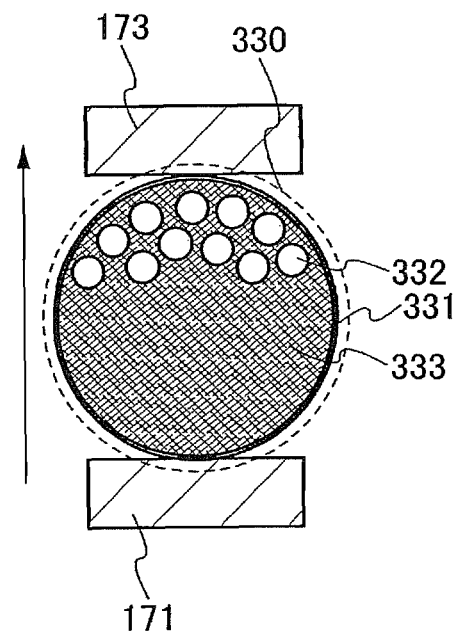

Next, a structure of the microcapsule is shown with reference to FIGS. 17A to 17D. As shown in FIGS. 17A and 17B, in the microcapsule 170, a transparent dispersion medium 176, a charged black particle 175a, and a charged white particle 175b are dispersed in a fine transparent container 174. Note that a blue particle, a red particle, a green particle, a yellow particle, a blue-green particle, or a purplish red particle may be used instead of the black particle 175a. Further, as shown in FIGS. 17C and 17D, a microcapsule 330 in which a colored disperse medium 333 and a white particle 332 are dispersed in a fine transparent container 331 may be used. Note that the colored disperse medium 333 may be colored in any of black, blue, red, green, yellow, blue green, and reddish violet. In addition, when each of a microcapsule in which blue particles are dispersed, a microcapsule in which red particles are dispersed, and a microcapsule in which green particles are dispersed are provided in one pixel, color display can be performed. In addition, when each of a microcapsule in which yellow particles are dispersed, a microcapsule in which blue green particles are dispersed, and a microcapsule in which reddish violet particles are dispersed are provided in one pixel, color display can be performed. Further, when each of a microcapsule having a blue dispersion medium, a microcapsule having a red dispersion medium, and a microcapsule having a green dispersion medium are arranged in one pixel, and each of the microcapsules includes either white particles or black particles, color display can be performed. In addition, when each of a microcapsule having a yellow dispersion medium, a microcapsule having a blue green dispersion medium, and a microcapsule having a reddish violet dispersion medium are arranged in one pixel, color display can be performed.

Next, a display method using an electrophoresis element is shown. Specifically, FIGS. 17A and 17B are used to show a display method of the microcapsule 170 having two color particles. Here, a white particle and a black particle are used as two color particles, and a microcapsule having a transparent dispersion medium is shown. Note that a particle having another color particle may be used instead of the black particle of the two color particles.

In the microcapsule 170, when the black particulate 175a is charged positively and the white particle 175b is charged negatively, voltage is applied to the first conductive layers 171 and the second conductive layers 173. As shown in FIG. 17A, when an electric field is generated in a direction from the second conductive layer to the first conductive layer here, the black particle 175a migrates to the second conductive layer 173 side, and the white particle 175b migrates to the first conductive layer 171 side. Accordingly, when the microcapsule is seen from the first conductive layer 171 side, white is observed, and when the microcapsule is seen from the second conductive layer 173 side, black is observed.

On the other hand, when voltage is applied in a direction from the first conductive layers 171 to the second conductive layers 173 as shown in FIG. 17B, the black particle 175a migrates to the first conductive layer 171 side and the white particle 175b migrates to the second conductive layer 173 side. Accordingly, when the microcapsule is seen from the first conductive layer 171 side, black is observed, and when the microcapsule is seen from the second conductive layer 173 side, white is observed.

Next, a display method of the microcapsule 330 having the white particle and the colored dispersion medium is shown. Although an example in which a dispersion medium is colored in black is shown here, a dispersion medium colored in another color can be similarly used.

In the microcapsule 330, when the white particle 332 is charged negatively, voltage is applied to the first conductive layer 171 and the second conductive layer 173. As shown in FIG. 17C, when an electric field is generated in a direction from the second conductive layer to the first conductive layer here, the white particle 332 migrates to the first conductive layer 171 side. Accordingly, when the microcapsule is seen from the first conductive layer 171 side, white is observed, and when the microcapsule is seen from the second conductive layer 173 side, black is observed.

On the other hand, as shown in FIG. 17D, when an electric field is generated in a direction from the first conductive layer to the second conductive layer, the white particle 332 migrates to the second conductive layer 173 side. Accordingly, when the microcapsule is seen from the first conductive layer 171 side, black is observed, and when the microcapsule is seen from the second conductive layer 173 side, white is observed.

Although an electrophoresis element is used for description here, a display device using a twist ball display method may be used instead of the electrophoresis element. A twist ball display method means a method in which a spherical particle which is white on one hemispherical surface and black on the other hemispherical surface is arranged between the first conductive layer and the second conductive layer, and a potential difference is generated between the first conductive layer and the second conductive layer to control a direction of the spherical particle, so that display is performed.

As the substrate 172 having flexibility, a similar one to the substrate having flexibility which can be provided over the surface of the element forming layer 104 shown in Embodiment Mode 1 can be selected as appropriate.

Figure 9B:
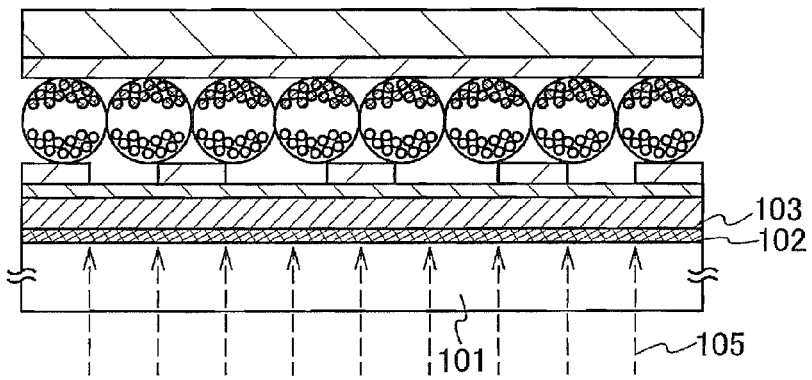

Next, as shown in FIG. 9B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 9C.

Figure 9C:
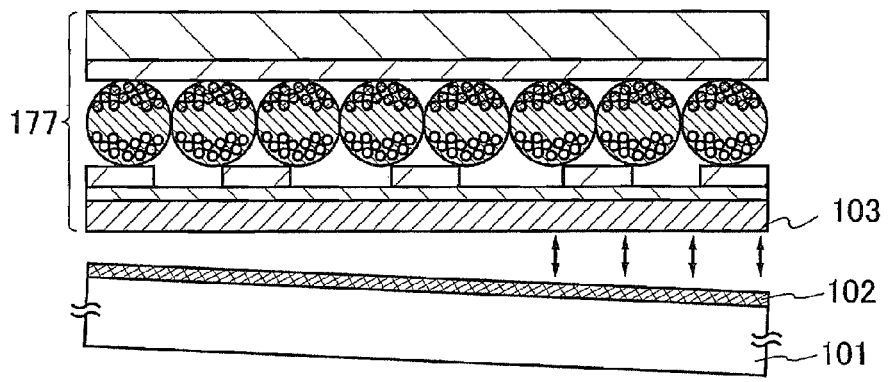
Figure 9D:
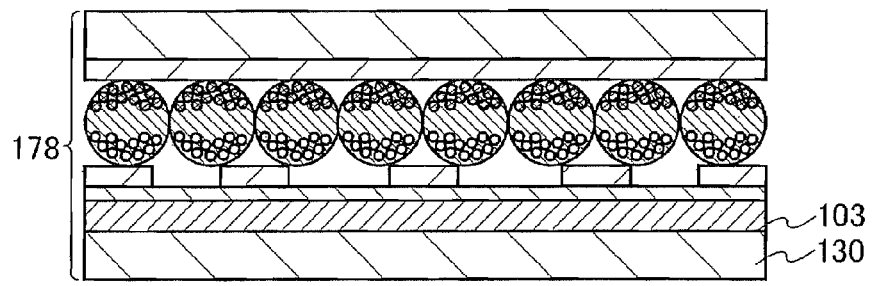

By the above-described steps, as shown in FIG. 9C, a semiconductor device 177 which includes the electrophoresis element and the organic compound layer 103 can be formed. Note that after a separating step shown in FIG. 9C, the surface of the organic compound layer 103 may be provided with the substrate 130 having flexibility, so that a semiconductor device 178 as shown in FIG. 9D may be formed.

Figure 10A:
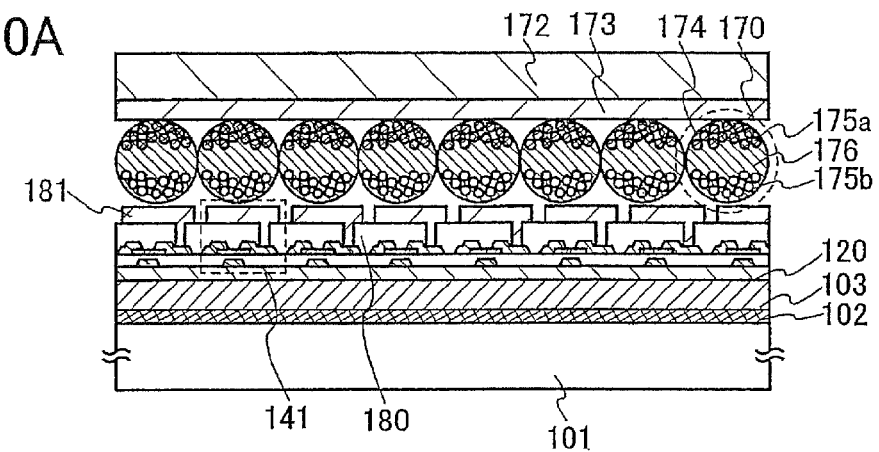
FIGS. 10A to 10D are cross sectional views illustrating a manufacturing process of a semiconductor device of the present invention.

In addition, as shown in FIG. 10A, a switching element may be connected to the electrophoresis element. As a switching element, there are a thin film transistor, MIM (Metal-Insulator-Metal), a diode, and the like. A mode in which the thin film transistor 141 is used as a switching element is shown here.

That is, as shown in FIG. 8A, the photocatalytic layer 102 is formed over the substrate 101 having the light transmitting property, and the organic compound layer 103 is formed over the photocatalytic layer 102. Next, the insulating layer 120 is formed over the organic compound layer 103, and the thin film transistor 141 which functions as a switching element is formed over the organic compound layer 103. Next, a first conductive layer 181 connected to the wiring of the thin film transistor 141 is formed over an insulating layer 180. Note that the wiring of the thin film transistor 141 and the first conductive layer 181 are connected to each other with the insulating layer 180 interposed therebetween; however, the present invention is not limited to this structure, and the first conductive layer 181 may be formed with the wiring of the thin film transistor 141. Note that the first conductive layer 181 is formed in each pixel.

In addition, the substrate 172 having flexibility is provided with the second conductive layers 173. The second conductive layers 173 may be formed over the entire surface of a pixel portion so that the second conductive layers 173 can serve as a common electrode of each pixel.

Next, the substrate 101 having the light transmitting property and the substrate 172 having flexibility are attached to each other with a sealing material. In addition, an electrophoresis element is formed between the substrate 101 having the light transmitting property and the substrate 172 having flexibility.

Figure 10B:
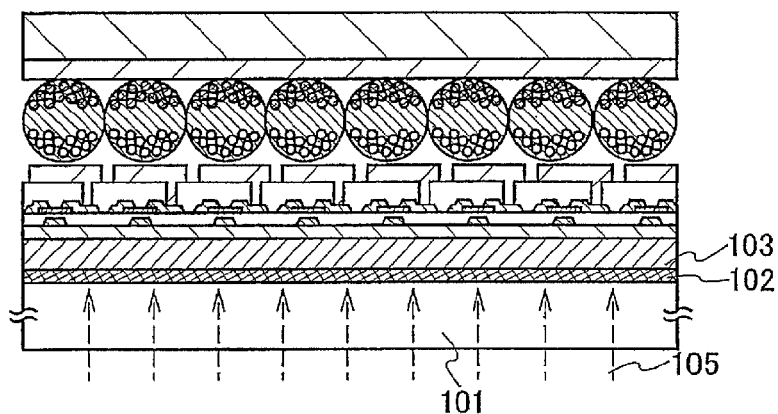
Figure 10C:
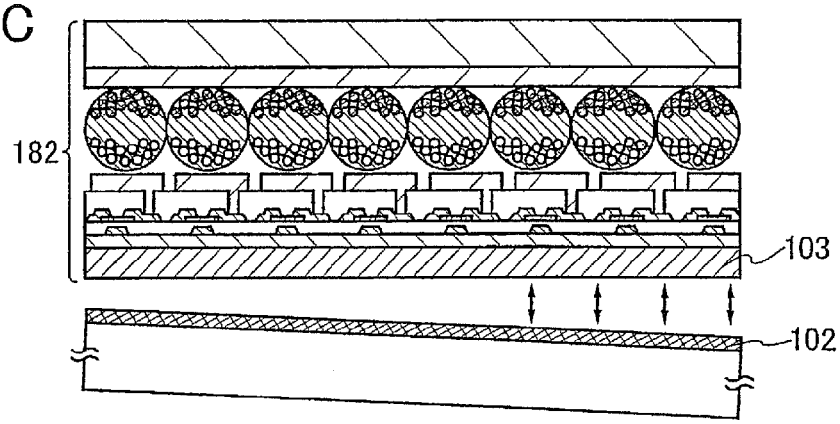

Next, as shown in FIG. 10B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 10C.

A display device having an electrophoresis element and a display device using a twist ball display method keep a state similar to when an electric field is applied, for a long term after a field effect transistor is removed. Therefore, a display state can be held even after the power is turned off. Accordingly, low power consumption is possible.

Figure 10D:
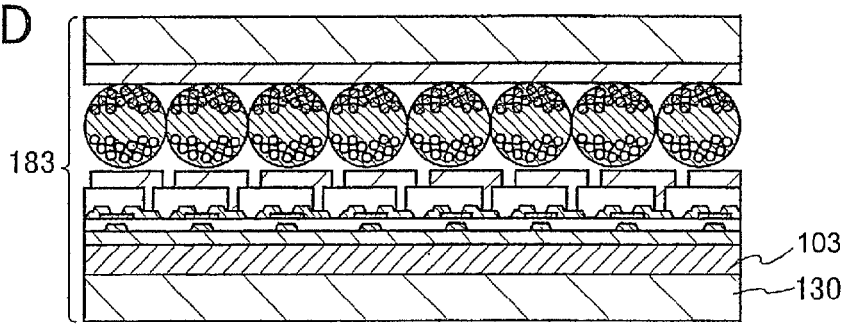

By the above-described steps, a semiconductor device 182 which includes the electrophoresis element and the organic compound layer 103 can be formed. Note that after a separating step shown in FIG. 10C, the surface of the organic compound layer 103 may be provided with the substrate 130 having flexibility, so that a semiconductor device 183 as shown in FIG. 10D may be formed.

FIGS. 9A to 9D and 10A to 10D above illustrate an element forming layer 104 made according to Embodiment Mode 1 in which organic compound layer 103 is over photocatalytic layer 102. FIGS. 34A to 34D and 35A to 35D illustrate an element forming layer 104 made according to Embodiment Mode 2 in which the order is reversed with photocatalytic layer 102 being over the organic compound layer 103.

Additional examples are shown in FIGS. 36A-39D, where FIGS. 36A-37D correspond to FIGS. 9A-10D but substitute the organic compound layer 112 from Embodiment Mode 3 for organic compound layer 103 and FIGS. 38A-39D correspond to FIGS. 9A-10D but substitute the organic compound layer 114 from Embodiment Mode 4 for organic compound layer 103.

Embodiment Mode 8

This embodiment mode will describe a typical example of the structure of the element forming layer 104 in Embodiment Modes 1 to 4, with reference to FIGS. 11A to 11D. FIGS. 11A to 11D show a process of manufacturing a semiconductor device having a thin film transistor. Note that Embodiment Mode 1 is used for description in this embodiment mode; however, any of Embodiment Modes 2 to 4 can be applied.

Figure 11A:
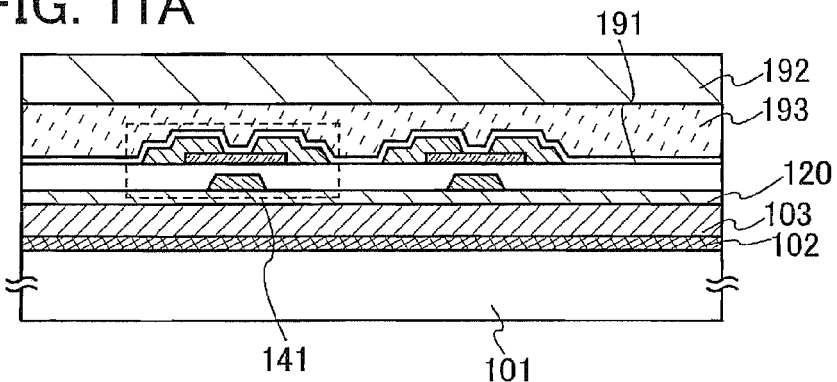
FIGS. 11A to 11D are cross sectional views illustrating a manufacturing process of a semiconductor device of the present invention.

Similarly to Embodiment Mode 1, as shown in FIG. 11A, the photocatalytic layer 102 is formed over the substrate 101 having the light transmitting property, and the organic compound layer 103 is formed over the photocatalytic layer 102. Next, the insulating layer 120 may be formed over the organic compound layer 103. Next, the thin film transistor 141 is formed over the organic compound layer 103. Here, reference numerals 191, 192, and 193 show an interlayer insulating layer, a substrate having flexibility, and an adhesive agent, respectively.

Figure 11B:
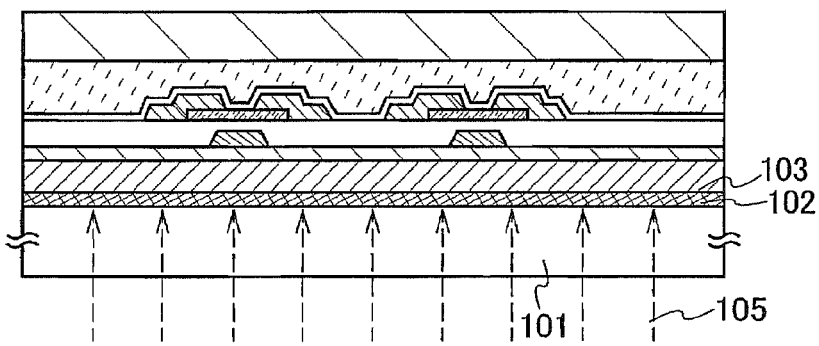
Figure 11C:
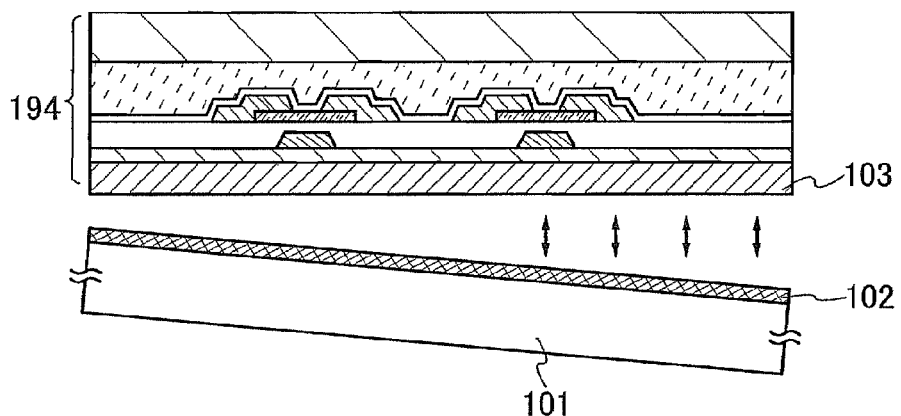

Next, as shown in FIG. 11B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 11C.

Figure 11D:
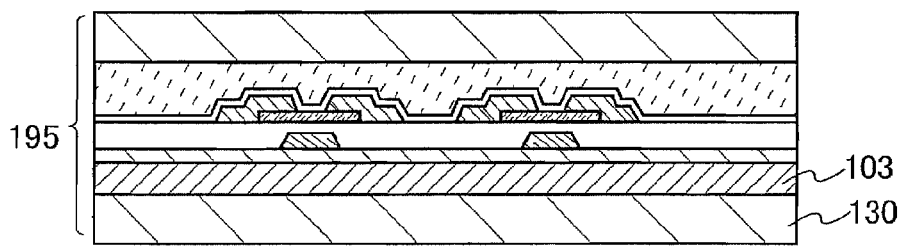

By the above-described steps, a semiconductor device 194 which includes the thin film transistor 141 and the organic compound layer 103 can be formed. Note that after a separating step shown in FIG. 11C, the surface of the organic compound layer 103 may be provided with the substrate 130 having flexibility, so that a semiconductor device 195 as shown in FIG. 11D may be formed.

Embodiment Mode 9

This embodiment mode will describe a typical example of the structure of the element forming layer 104 in Embodiment Modes 1 to 4, with reference to FIGS. 12A to 12D. FIGS. 12A to 12D show a process of manufacturing a semiconductor device which functions as a solar cell. Note that Embodiment Mode 1 is used for description in this embodiment mode; however, any of Embodiment Modes 2 to 4 can be applied.

Figure 12A:
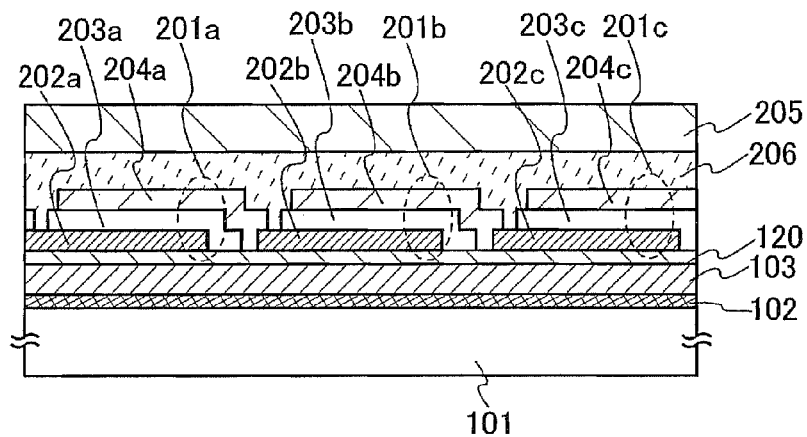
FIGS. 12A to 12D are cross sectional views illustrating a manufacturing process of a semiconductor device of the present invention.

Similarly to Embodiment Mode 1, as shown in FIG. 12A, the photocatalytic layer 102 is formed over the substrate 101 having the light transmitting property, and the organic compound layer 103 is formed over the photocatalytic layer 102. Next, the insulating layer 120 may be formed over the organic compound layer 103.

Next, first conductive layers 202a to 202c are formed over the insulating layer 120. Then, photoelectric conversion layers 203a to 203c are formed so as to expose a part of the first conductive layers 202a to 202c. Next, second conductive layers 204a to 204c are formed over the photoelectric conversion layers 203a to 203c and a part of an exposed portion of each of the first conductive layers 202a to 202c. Here, a photoelectric conversion element 201a is formed with the first conductive layer 202a, the photoelectric conversion layer 203a, and the second conductive layer 204a. In addition, a photoelectric conversion element 201b is formed with the first conductive layer 202b, the photoelectric conversion layer 203b, and the second conductive layer 204b. Further, a photoelectric conversion element 201c is formed with the first conductive layer 202c, the photoelectric conversion layer 203c, and the second conductive layer 204c. Note that in order to connect the photoelectric conversion elements 201a to 201c in series, the second conductive layer 204a of the photoelectric conversion element 201a is formed so as to be in contact with the first conductive layer 202b of the second photoelectric conversion element 201b. In addition, the second conductive layer 204b of the photoelectric conversion element 201b is formed so as to be in contact with the first conductive layer 202c of the third photoelectric conversion element 201c. The second conductive layer 204c of the photoelectric conversion element 201c is formed so as to be in contact with the first conductive layer of a fourth photoelectric conversion element.

The first conductive layer, the functional layer, and the second conductive layer of the photoelectric conversion element or the diode shown in Embodiment Mode 5 can be used as appropriate for the first conductive layers 202a to 202c, the photoelectric conversion layers 203a to 203c, and the second conductive layers 204a to 204c, respectively.

An adhesive agent 206 may be used to attach the second conductive layers 204a to 204c and a substrate 205 having flexibility. The adhesive agent 127 shown in Embodiment Mode 5 can be used as the adhesive agent 206, as appropriate. In addition, as the substrate 205 having flexibility, a similar one to the substrate having flexibility which can be provided over the surface of the element forming layer 104 shown in Embodiment Mode 1 can be selected as appropriate.

Figure 12B:
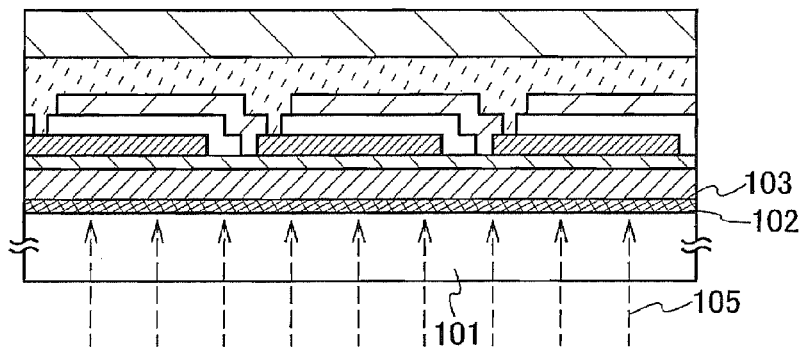
Figure 12C:
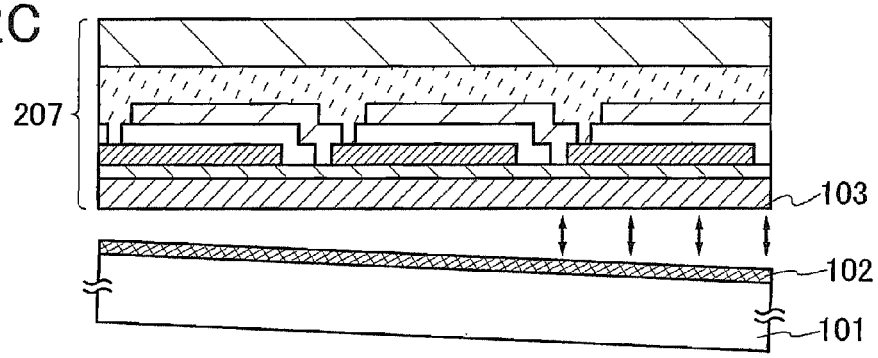

Next, as shown in FIG. 12B, the photocatalytic layer 102 is irradiated with the light 105 through the substrate 101 having the light transmitting property. As a result of this, the photocatalytic layer 102 is activated. Accordingly, the photocatalytic layer 102 and the organic compound layer 103 are separated from each other as shown in FIG. 12C.

Figure 12D:
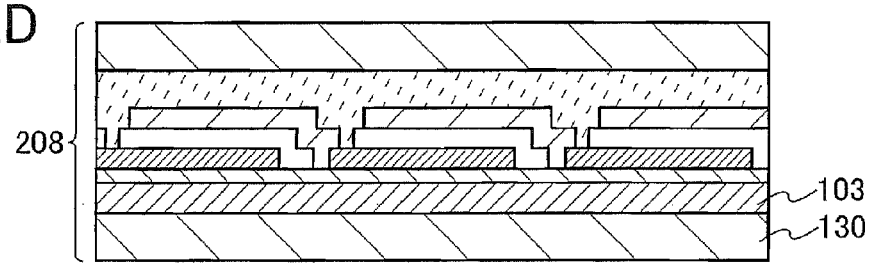

By the above-described steps, a semiconductor device 207 which functions as a solar cell can be formed. Note that after a separating step shown in FIG. 12C, the surface of the organic compound layer 103 may be provided with the substrate 130 having flexibility, so that a semiconductor device 208 as shown in FIG. 12D may be formed.

Embodiment 1

Figures 18A, 18B:
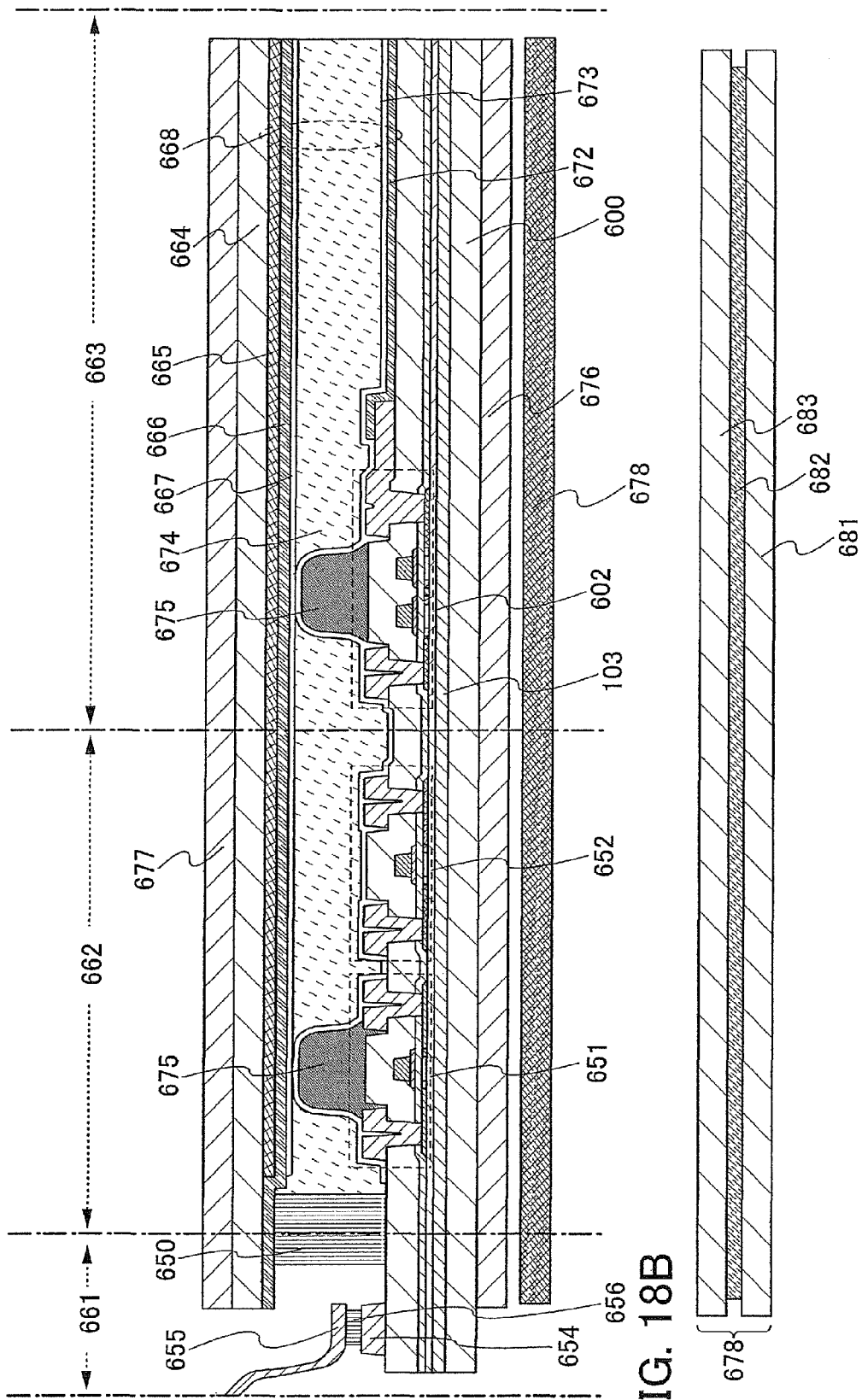
FIGS. 18A and 18B are cross sectional views illustrating a structure of a semiconductor device of the present invention.

This embodiment will describe a liquid crystal display panel formed using the present invention, with reference to FIGS. 18A and 18B. In a liquid crystal display panel, a first substrate 600 having flexibility, a second substrate 664 having flexibility, and a liquid crystal layer 674 are sealed with a sealing material 650. The sealing material 650 preferably includes a holding material which holds a space between substrates, typified by filler. In addition, the first substrate 600 having flexibility is bonded to the organic compound layer 103 using an adhesive agent (not shown).

A driver circuit portion 662 and a pixel portion 663 are formed in such a way that they are surrounded by the sealing material 650, the first substrate 600 having flexibility, and the second substrate 664 having flexibility. Moreover, a terminal portion 661 is provided outside the sealing material 650.

The second substrate 664 having flexibility is provided with a colored layer 665 which functions as a color filter or a black matrix, a second pixel electrode 666, and an insulating layer 667 which functions as an alignment film. In addition, one or both of the first substrate 600 having flexibility and the second substrate 664 having flexibility is provided with a polarizing plate.

At the terminal portion 661, a connecting terminal connected to a source or gate wiring of each TFT (a connecting terminal 654 connected to the gate wiring shown in FIG. 18A) is formed. The connecting terminal is connected to an FPC (Flexible Printed Circuit) 655 which serves as an input terminal through an anisotropic conductive film 656 and the connecting terminal receives a video signal or a clock signal through the anisotropic conductive film 656.

In the driver circuit portion 662, a circuit for driving a pixel, such as a source driver and a gate driver is formed. Here, an N-channel TFT 651 and a P-channel TFT 652 are arranged. Note that the N-channel TFT 651 and the P-channel TFT 652 form a CMOS circuit.

In the pixel portion 663, a plurality of pixels is formed, and a liquid crystal element 668 is formed in each pixel. The liquid crystal element 668 is a portion in which a first pixel electrode 672, the second pixel electrode 666, and the liquid crystal layer 674 which fills the gap between the first pixel electrode 672 and the second pixel electrode 666 overlap with each other. The first pixel electrode 672 included in the liquid crystal element 668 is electrically connected to a TFT 602. The second pixel electrode 666 of the liquid crystal element 668 is formed on the second substrate 664 side. An insulating layer 673 which functions as an alignment film is formed between the first pixel electrode 672 and the liquid crystal layer 674, and the insulating layer 667 which functions as an alignment film is formed between the second pixel electrode 666 and the liquid crystal layer 674.

It is preferable that the first substrate 600 and the second substrate 664 be kept apart with a fixed distance therebetween in order to decrease display unevenness. Therefore, spacers 675, which are gap-holding materials, are distributed between the first substrate 600 and the second substrate 664. Note that here the spacers 675 are formed over an insulating layer which covers the TFTs 651 and 652, and an alignment film is formed over the spacers 675 and the first pixel electrode. In addition, the shape of the spacer 675 is columnar, and the spacer 675 has a curvature at an edge portion. That is, a radius R of curvature of an upper end portion of a columnar spacer is 2 μm or less, preferably 1 μm or less. Equal pressure is applied due to such a shape, and excess pressure can be prevented from being applied to one point. Note that a lower end of the spacer indicates a lower end of the columnar spacer on the side of the first substrate having flexibility. In addition, an upper end indicates the top portion of the columnar spacer. Further, when the width of a central portion of the columnar spacer in a height direction is L1 and the width of an end portion of the columnar spacer on the side of the second substrate having flexibility is L2, 0.8≤L2/L1≤3 is satisfied. In addition, an angle between a tangent plane at the center of the side surface of the columnar spacer and a surface of the first substrate having flexibility or an angle between a tangent plane at the center of the side surface of the columnar spacer and a surface of the second substrate having flexibility is preferably in the range of 65° to 115°. Further, the height of the spacer is preferably in the range of 0.5 μm to 10 μm or in the range of 1.2 μm to 5 μm.

The first substrate 600 having flexibility and the second substrate 664 having flexibility are provided with polarizing plates 676 and 677 respectively. In addition, the polarizing plates 676 and 677 may be provided with a retardation plate.

The liquid crystal display panel has a backlight 678. The backlight can be formed with a light emitting member, and a cold-cathode tube, an LED, an EL light emitting device, or the like can be used typically. The backlight of this embodiment preferably has flexibility. Furthermore, the backlight may be provided with a reflecting plate and an optical film.

Embodiment 2

This embodiment will show a backlight which can be used in the above embodiment below.

As the backlight 678 shown in FIG. 18B, the EL light emitting device having one or both of the organic EL element and the inorganic EL element in the above-described embodiment mode can be used. In addition, without using the present invention, an EL light emitting device, in which a third substrate 681 having flexibility is provided with a layer 682 having a light emitting element which includes a first conductive layer, a light emitting layer, and a second conductive layer, and the third substrate 681 having flexibility and the layer 682 having the light emitting element are sealed with a fourth substrate 683 having flexibility, can be used. Note that the light emitting element can be formed in such a way that the first conductive layer, the light emitting layer, and the second conductive layer are formed using an ink jet method, an evaporation method, a sputtering method, a printing method, or the like, as appropriate.

Note that as the fourth substrate 683 having flexibility of the EL light emitting device which can be used for the backlight 678, the polarizing plate 676 shown in FIG. 18A may be used. In this case, a layer having a light emitting element is formed over the third substrate 681 having flexibility, and the third substrate 681 having flexibility and the layer 682 having the light emitting element are sealed with the polarizing plate 676. Then, the polarizing plate 676 and the first substrate 600 having flexibility can be attached to each other with an adhesive agent having a light transmitting property. Accordingly, the number of substrates having flexibility for forming the backlight can be reduced.

After the layer 682 having the light emitting element is formed over the third substrate 681 having flexibility, the layer 682 having the light emitting element and the third substrate. 681 having flexibility can be attached to the polarizing plate 676 provided on the first substrate 600 having flexibility with an adhesive agent. Accordingly, the number of substrates having flexibility for forming the backlight can be reduced.

After the layer 682 having the light emitting element is formed on one surface of the polarizing plate 676, the third substrate 681 having flexibility may be attached to one surface of the layer 682 having the light emitting element and the polarizing plate 676 using an adhesive agent, and then the other surface of the polarizing plate 676 and the first substrate 600 having flexibility may be attached to each other using an adhesive agent. Further, after the layer 682 having the light emitting element is formed on one surface of the polarizing plate 676, the other surface of the polarizing plate 676 and the first substrate 600 having flexibility may be attached to each other using an adhesive agent, and then the third substrate 681 having flexibility may be attached to one surface of the polarizing plate 676 using an adhesive agent. Accordingly, the number of substrates having flexibility for forming the backlight can be reduced.

Furthermore, the polarizing plate 676 may be used instead of the first substrate 600 having flexibility. That is, the polarizing plate 676 which seals the third substrate 681 having flexibility and the layer 682 having the light emitting element may be attached to the organic compound layer 103 shown in FIG. 18A, using an adhesive agent. Accordingly, the number of substrates having flexibility for forming the liquid crystal display panel can be reduced.

Light emitting elements with a large area which cover a pixel portion can be formed as light emitting elements formed in the layer 682 having the light emitting element of this embodiment. Elements which emit white light are preferably used as such light emitting elements.

In addition, light emitting elements with a line shape may be formed as light emitting elements formed in the layer 682 having the light emitting element. Elements which emit white light can be used as the light emitting elements. Further, light emitting elements are preferably arranged such that a blue light emitting element, a red light emitting element, and a green light emitting element are provided in each pixel. In this case, the colored layer 665 shown in FIG. 18A is not necessarily required to be provided. Note that when the colored layer 665 shown in FIG. 18A is provided, color purity is increased and a liquid crystal display panel capable of performing bright display is provided.

In addition, as a light emitting element formed in the layer 682 having the light emitting element, an element which emits white light can be used in each pixel. Further, a sub-pixel including a blue light emitting element, a sub-pixel including a red light emitting element, and a sub-pixel including a green light emitting element may be provided in each pixel. Accordingly, a liquid crystal display panel capable of high-definition display is provided.

Note that the structure of the backlight can also be used for other liquid crystal display panels than one in the present invention.

Embodiment 3

In this embodiment, as a backlight which can be used in the above examples, a backlight in which a substrate having flexibility is provided with an LED is described below.

Figure 19A:
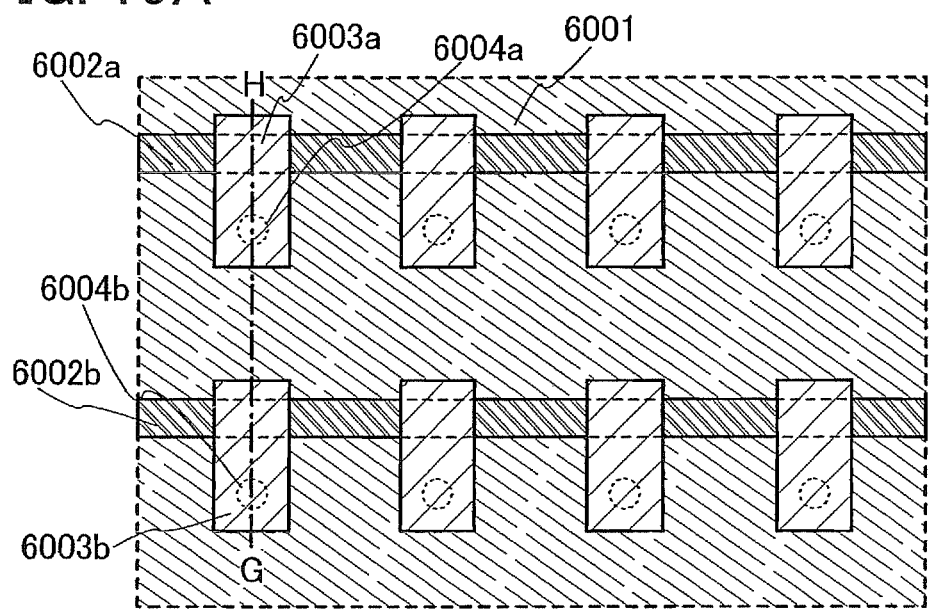
FIGS. 19A and 19B are cross sectional views illustrating a structure of a backlight applicable to the present invention.
Figure 19B:
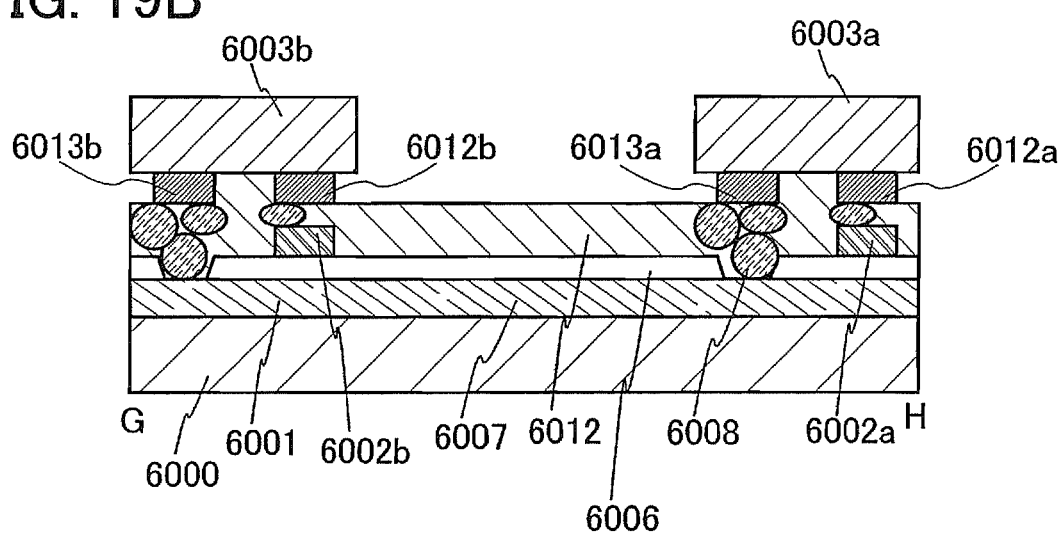

FIG. 19A is a top view of a backlight, and FIG. 19B is a cross sectional view along a line H-G of FIG. 19A. In FIGS. 19A and 19B, a common electrode layer 6001 having a reflective property is provided over a substrate 6000 having flexibility, and a wiring layer 6002a and a wiring layer 6002b which function as anodes are formed over an insulating layer 6006. A light emitting diode 6003a and a light emitting diode 6003b are provided over the wiring layer 6002a and the wiring layer 6002b respectively. A connecting terminal 6012a of the light emitting diode 6003a is electrically connected to the wiring layer 6002a with conductive particles 6008 in an anisotropic conductive film. In addition, a connecting terminal 6013a of the light emitting diode 6003a is electrically connected to the common electrode layer 6001 with the conductive particles 6008 in the anisotropic conductive film at an opening (a contact hole) 6004b which is formed in the insulating layer 6006. Similarly, a connecting terminal 6012b of the light emitting diode 6003b is electrically connected to the wiring layer 6002a with the conductive particles 6008 in the anisotropic conductive film, and a connecting terminal 6013b of the light emitting diode 6003b is electrically connected to the common electrode layer 6001 at an opening (a contact hole) 6004a which is formed in the insulating layer 6006.

Note that as the anisotropic conductive film, the conductive particles 6008 are dispersed in an organic resin 6012, and the conductive particles 6008 in the organic resin are connected to each other by pressure bonding from one direction. Further, the anisotropic conductive film is provided over the entire surface of the substrate having flexibility here; however, only connecting portions of the light emitting diode and the wiring layer may be selectively provided with the anisotropic conductive film. Furthermore, an anisotropic conductive resin may be used instead of the anisotropic conductive film.

The common electrode layer 6001 serves as a reflecting electrode which reflects incident light. Therefore, light emitted from the light emitting diodes 6003a and 6003b can be efficiently delivered to a liquid crystal display device.

Figure 20A:
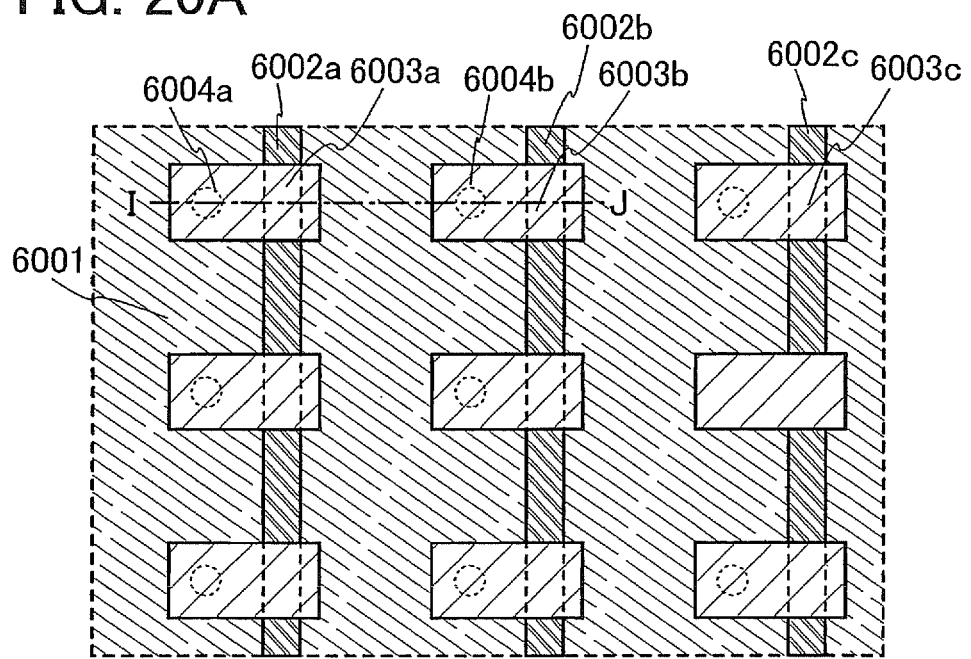
FIGS. 20A and 20B are cross sectional views illustrating a structure of a backlight applicable to the present invention.
Figure 20B:
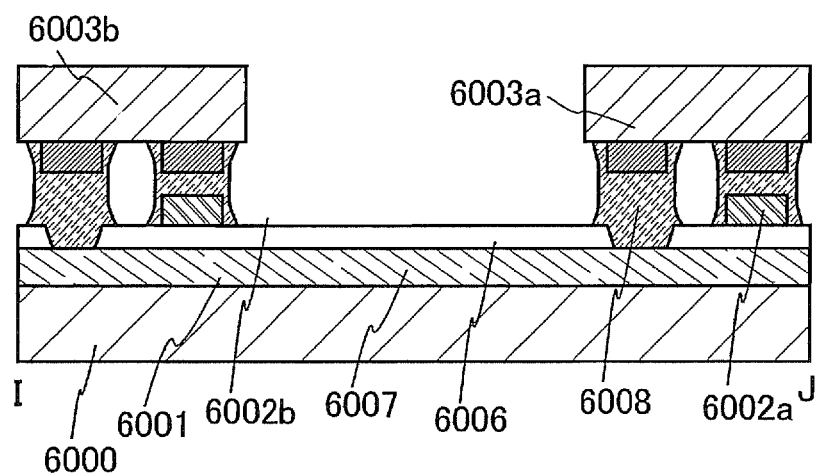

FIG. 20A is a top view of a backlight, and FIG. 20B is a cross sectional view along a line 14 of FIG. 20A. The backlight of FIGS. 20A and 20B is an example in which a light emitting diode and a common electrode layer or a wiring layer are connected with a bump or a conductive metal paste (e.g., a silver (Ag) paste). In FIG. 20A, the wiring layer 6002a, the wiring layer 6002b, and a wiring layer 6002c are formed linearly. A voltage to be applied to the wiring layer is easily controlled when light emitting diodes of the same color are arranged with respect to each wiring layer, such that a light emitting diode (the light emitting diode 6003a or the like) which is connected to the wiring layer 6002a is a red light emitting diode (R), a light emitting diode (the light emitting diode 6003b or the like) which is connected to the wiring layer 6002b is a green light emitting diode (G), and a light emitting diode (a light emitting diode 6003c or the like) which is connected to the wiring layer 6002c is a blue light emitting diode (B). The light emitting diode 6003a is electrically connected to the common electrode layer 6001 and the wiring layer 6002a with a conductive paste 6008, and the light emitting diode 6003b is electrically connected to the common electrode layer 6001 and the wiring layer 6002a with the conductive paste 6008.

Figure 21A:
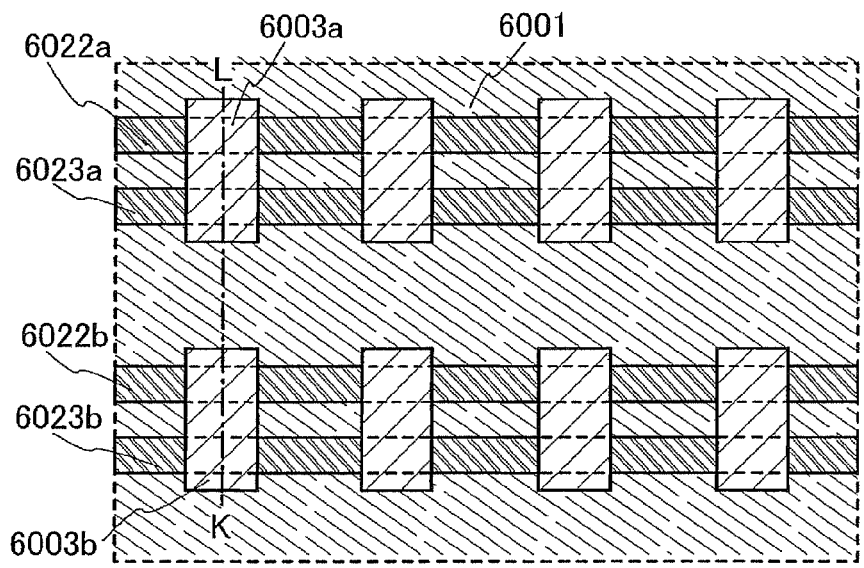
FIGS. 21A to 21C are cross sectional views illustrating a structure of a backlight applicable to the present invention.
Figure 21B:
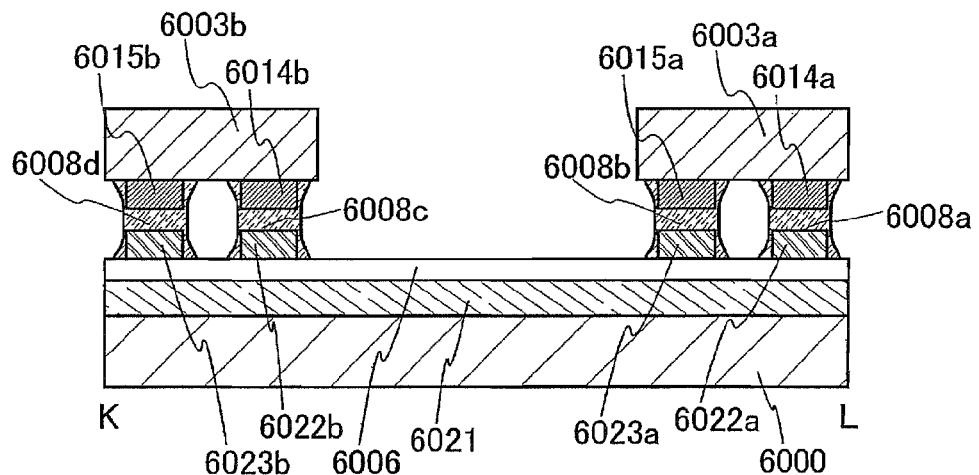
Figure 21C:
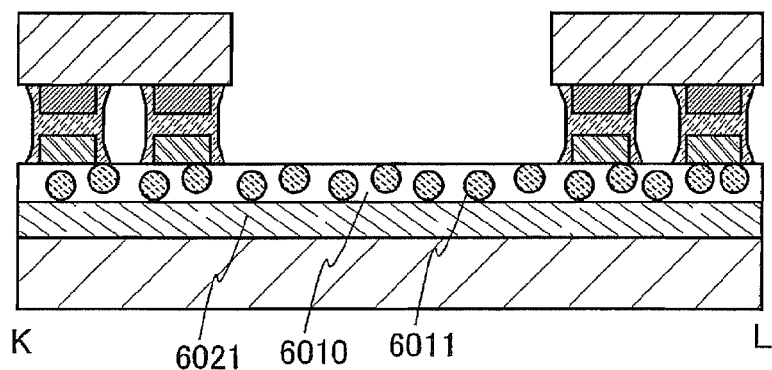

FIG. 21A is a top view of a backlight, and FIGS. 21B and 21C are cross sectional views along a line K-L of FIG. 21A. The backlight of FIGS. 21A to 21C has a structure in which a reflective electrode layer and a common electrode layer are separately provided.

In FIG. 21B, a reflective electrode layer 6021 is formed over the substrate 6000 having flexibility, and the insulating layer 6006 is formed over the reflective electrode layer 6021. Wiring layers 6022a and 6022b and common electrode layers 6023a and 6023b are formed over the insulating layer 6006. In addition, the light emitting diode 6003a is provided over the wiring layer 6022a and the common electrode layer 6023a. Further, the light emitting diode 6003b is provided over the wiring layer 6022b and the common electrode layer 6023b. A connecting terminal 6014a of the light emitting diode 6003a is electrically connected to the wiring layer 6022a through a conductive paste 6008a, and a connecting terminal 6015a of the light emitting diode 6003a is electrically connected to the common electrode layer 6023a through a conductive paste 6008b. A connecting terminal 6014b of the light emitting diode 6003b is electrically connected to the wiring layer 6022b through a conductive paste 6008c, and a connecting terminal 6015b of the light emitting diode 6003b is electrically connected to the common electrode layer 6023b through a conductive paste 6008d.

A reflective electrode layer 6021 which reflects incident light is formed over the substrate having flexibility. Therefore, light emitted from the light emitting diodes 6003a and 6003b can be efficiently delivered to a liquid crystal display device.

FIG. 21C shows a structure in which an insulating layer 6010 including a light scattering particle 6011 is provided over the reflective electrode layer 6021. The light scattering particle 6011 includes an effect of scattering incident light and light reflected by the reflective electrode layer 6021. In this embodiment, the reflective electrode layer may perform specular reflection with its mirror surface. Further, a reflective electrode layer which has unevenness on its surface and is whitened may be used to perform diffuse reflection.

Figure 22A:
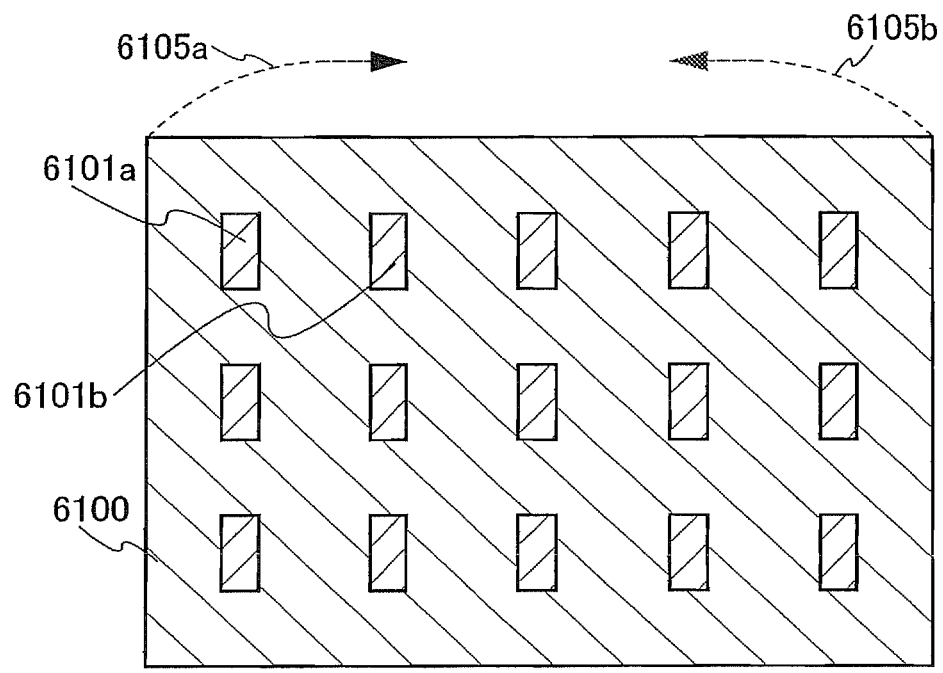
FIGS. 22A and 22B are cross sectional views illustrating structures of backlights applicable to the present invention.

An example in which a plurality of light emitting diodes is provided over a substrate having flexibility is described with reference to FIGS. 22A and 22B. A product which includes the backlight having flexibility is often bent in a particular direction. When seen from the top surface, the backlight in FIG. 22A is a rectangle which is long sideways, and the backlight is often bent in the directions shown by an arrow 6105a and an arrow 6105b. When a top surface shape of the plurality of light emitting diodes provided over a substrate 6100 having flexibility is rectangular, light emitting diodes 6101a and 6101b are arranged such that short sides of the light emitting diodes 6101a and 6101b are parallel to the long side of the substrate 6100 having flexibility which is bent with frequency.

Figure 22B:
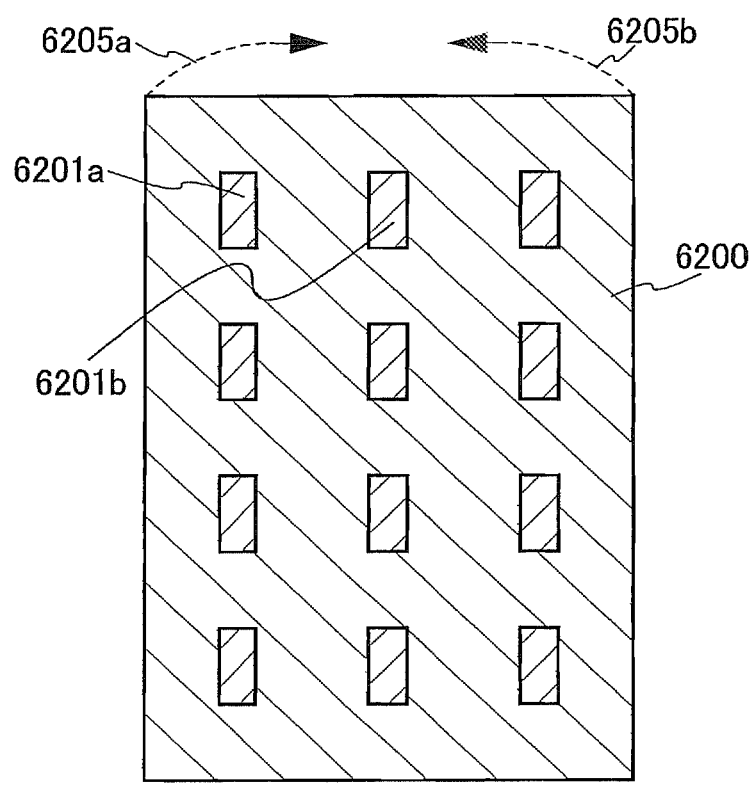

The backlight shown in FIG. 22B uses a substrate 6200 having flexibility which is vertically long, and the substrate 6200 having flexibility is often bent in the directions of an arrow 6205*a* and an arrow 6205*b*. In this case, when seen from a top surface, a plurality of light emitting diodes provided over the substrate 6200 having flexibility is rectangular. Light emitting diodes 6201*a* and 6201*b* are arranged such that short sides of the light emitting diodes 6201*a* and 6201*b* are parallel to the side of the substrate 6200 having flexibility which is bent with frequency. In this manner, in the case where there are a direction in which a substrate having flexibility is often bent and a direction in which the substrate having flexibility is not often bent depending on an intended purpose and the shape of a display device, when a side to be bent and a short side of the light emitting diode are arranged to be parallel in advance so as to be easily bent, the display device becomes hard to be damaged. Therefore, reliability can be increased.

Figure 23A:
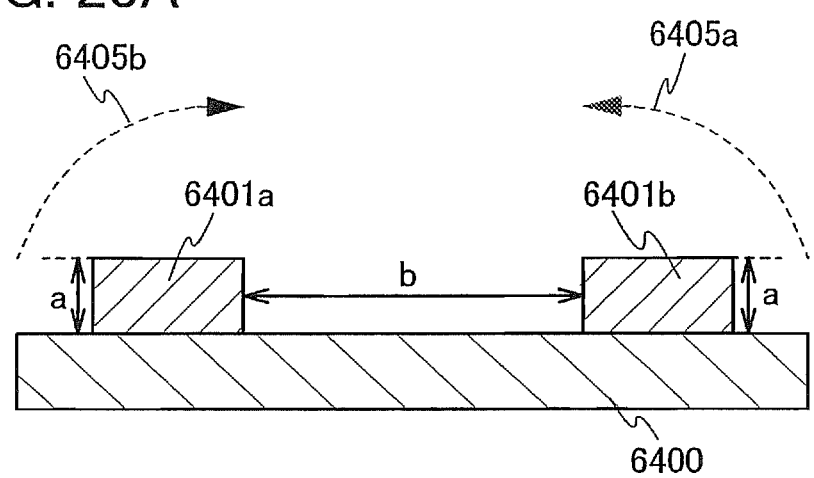
FIGS. 23A and 23B are cross sectional views illustrating a structure of a backlight applicable to the present invention.
Figure 23B:
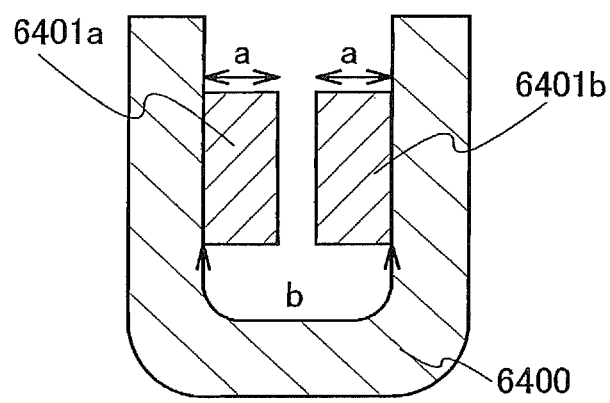

FIGS. 23A and 23B show a light emitting diode 6401*a* and a light emitting diode 6401*b* adjacently provided with a space b therebetween, over a substrate 6400 having flexibility. The light emitting diode 6401*a* and the light emitting diode 6401*b* each have a thickness a. FIG. 23B is a diagram in which the substrate 6400 having flexibility which is provided with the light emitting diode 6401*a* and the light emitting diode 6401*b* is bent in directions of an arrow 6405*a* and an arrow 6405*b*. As in FIGS. 23A and 23B, when the space b between the adjacent light emitting diodes is more than twice as large as the thickness a, that is, when b>2a is satisfied, the substrate 6400 having flexibility can be bent easily without the light emitting diode 6401*a* and the light emitting diode 6401*b* coming into contact with each other.

Figure 24A:
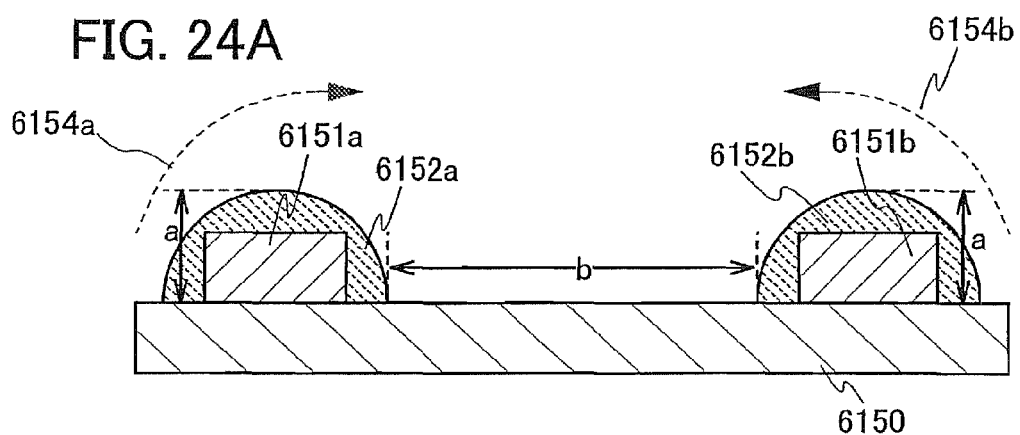
FIGS. 24A and 24B are cross sectional views illustrating a structure of a backlight applicable to the present invention.
Figure 24B:
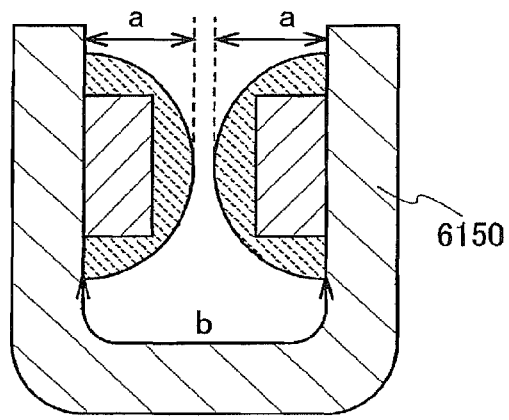

FIGS. 24A and 24B show an example of a structure in which a light emitting diode is covered with a resin layer. As shown in FIG. 24A, a light emitting diode 6151*a* covered with a resin layer 6152*a* and a light emitting diode 6151*b* covered with a resin layer 6152*b* are formed over a substrate 6150 having flexibility. In addition, distance between the resin layer 6152*a* and the resin layer 6152*b* is set to be the space b. Each of maximum thicknesses of the resin layer 6152*a* and the resin layer 6152*b* is the thickness a. FIG. 24B shows a diagram in which the substrate 6150 having flexibility which is provided with the light emitting diode 6151*a*, the resin layer 6152*a*, the light emitting diode 6151*b*, and the resin layer 6152*b* is bent in directions of the arrow 6154*a* and the arrow 6154*b*. As in FIGS. 24A and 24B, when the space b between the adjacent resin layers and light emitting diodes covered with the resin layers is more than twice as large as the maximum thickness a of the resin layers covering the light emitting diodes, that is, when b>2a is satisfied, the substrate 6150 having flexibility can be bent easily without the light emitting diode 6151*a* covered with the resin layer 6152*a* and the light emitting diode 6151*b* covered with the resin layer 6152*b* coming into contact with each other.

Figure 25:
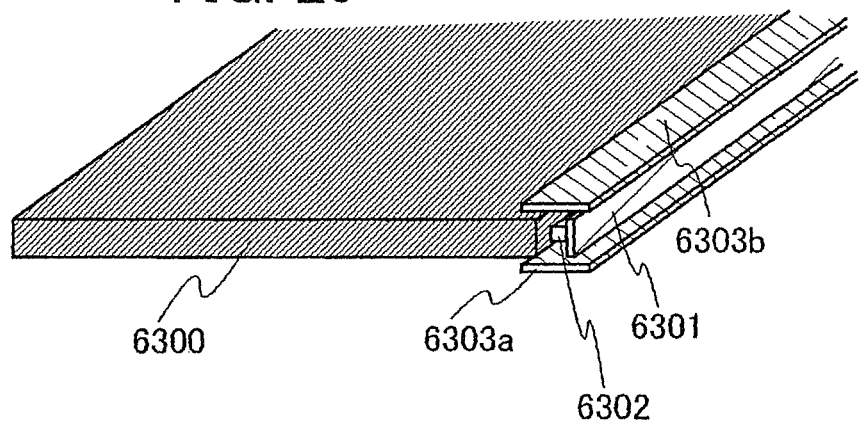
FIG. 25 is a cross sectional view illustrating a structure of a backlight applicable to the present invention.

A sidelight type backlight having flexibility shown in FIG. 25 includes a light guide plate 6300 having flexibility, a light emitting diode 6302 provided over a substrate 6301 having flexibility, and reflective sheets 6303*a* and 6303*b* which reflect light emitted from the light emitting diode 6302. The reflective sheets 6303*a* and 6303*b* are provided so that light is efficiently led to the light guide plate. A reflective plate, which is bent in a cylinder shape typified by a conventional reflector plate, is not easily bent. However, the reflective sheets 6303*a* and 6303*b* having a shape which is not fixed in a cylinder shape in FIG. 25 as shown in this embodiment mode can be easily bent.

When a backlight having flexibility with the above structure is used for a display device having flexibility which is formed using a transposition process of the present invention, an electronic apparatus having flexibility can be formed.

Note that the structure of the backlight can also be used for other liquid crystal display panels than one in the present invention.

Embodiment 4

Next, an EL display panel is described with reference to FIG. 26.

Figure 26:
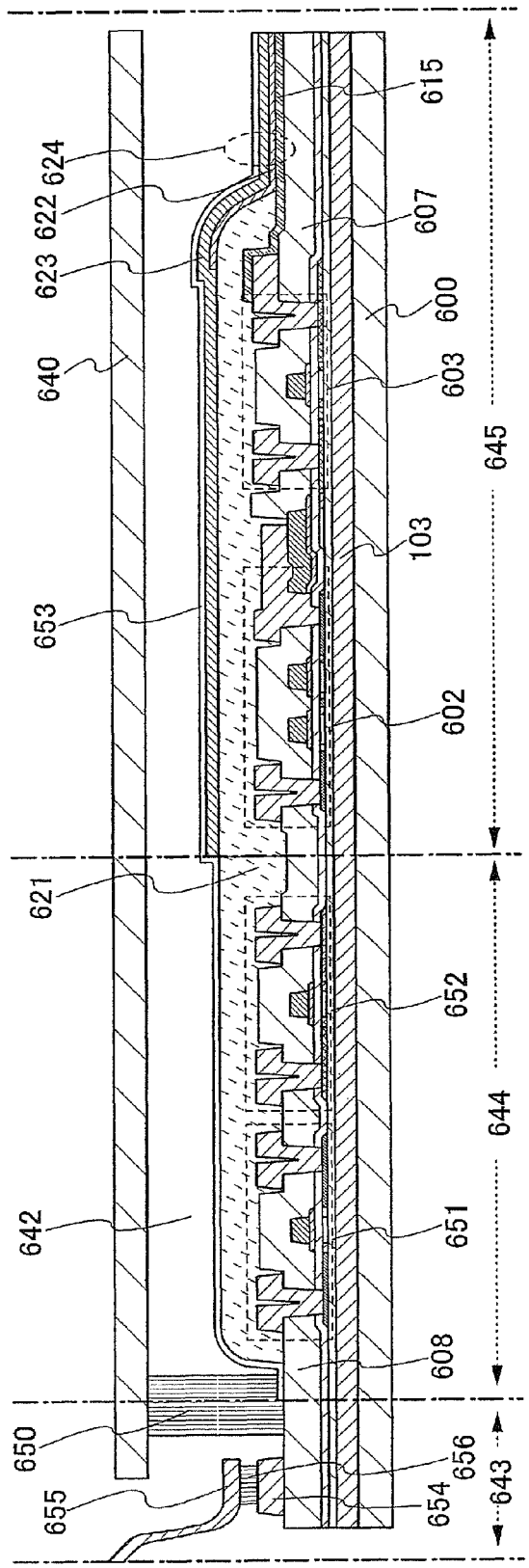
FIG. 26 is a cross sectional view illustrating a structure of a semiconductor device of the present invention.

FIG. 26 shows a cross sectional view of an EL display panel. In the EL display panel, an insulating layer 608 which is provided over the first substrate 600 having flexibility and a second substrate 640 having flexibility are sealed with the sealing material 650. As the sealing material 650, an epoxy based resin having high viscosity including filler is preferably used. A sealing material is desirably a material which transmits as little moisture and oxygen as possible. In addition, the first substrate 600 having flexibility is provided with the organic compound layer 103.

A driver circuit portion 644 and a pixel portion 645 are included on an inner side of the sealing material 650, the first substrate 600 having flexibility, and the second substrate 640 having flexibility. The terminal portion 643 is included on an outer side of the sealing material 650.

At the terminal portion 643, a connecting terminal connected to a source or gate wiring of each TFT (the connecting terminal 654 connected to the source wiring shown in FIG. 26) is formed. The connecting terminal is connected to the FPC (Flexible Printed Circuit) 655 which serves as an input terminal through the anisotropic conductive film 656, and the connecting terminal receives a video signal or a clock signal through the anisotropic conductive film 656.

In the driver circuit portion 644, a circuit for driving a pixel, such as a source driver and a gate driver is formed. Here, the N-channel TFT 651 which is formed similarly to the switching TFT 602 in the pixel portion and the P-channel TFT 652 which is formed similarly to the driving TFT 603 in a pixel portion are arranged. Note that the N-channel TFT 651 and the P-channel TFT 652 form a CMOS circuit.

In the pixel portion 645, pixels each including the switching TFT 602, the driving TFT 603, and a light emitting element 624 are arranged in matrix. The organic EL element or the inorganic EL element shown in the above-described embodiment mode can be used as appropriate for the light emitting element 624. Here, reference numerals 607, 615, 622, and 623 show an interlayer insulating layer, a first electrode, a light emitting layer, and a second electrode, respectively.

Figure 31:
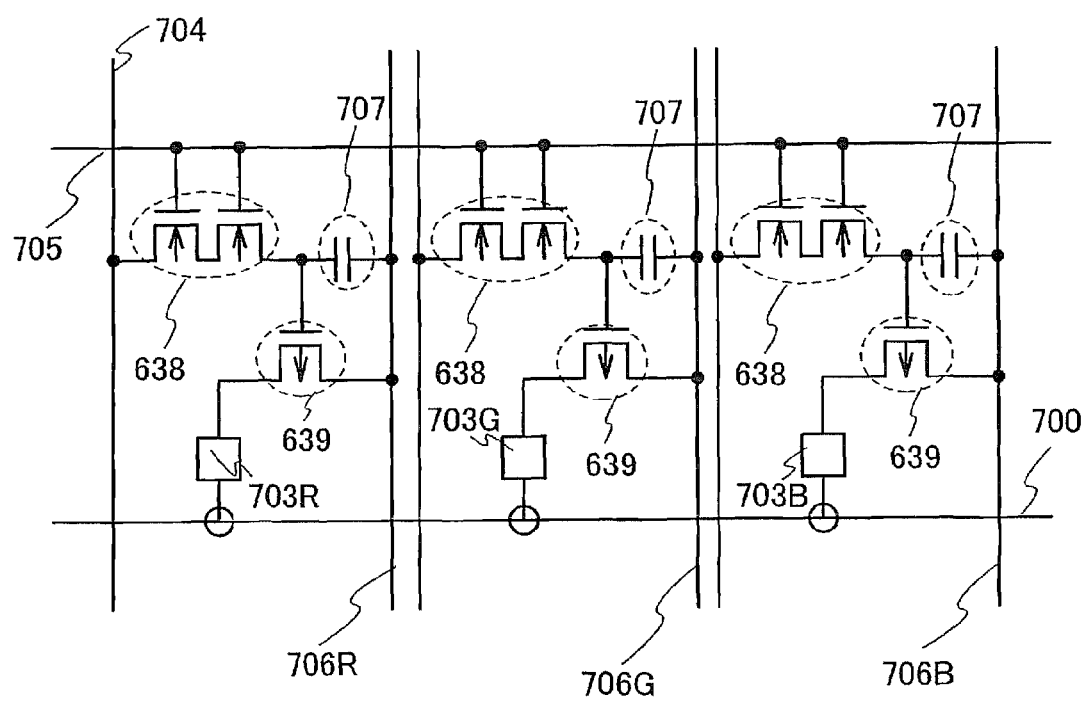
FIG. 31 is a diagram illustrating an equivalent circuit which is adaptable to a semiconductor device of the present invention.

Here in this embodiment, FIG. 31 shows an equivalent circuit diagram of a pixel when a light emitting display device having an organic EL element performs full-color display. In FIG. 31, a TFT 638 surrounded by dashed lines corresponds to the switching TFT 602 in FIG. 26, and a TFT 639 surrounded by dashed lines corresponds to the driving TFT 603.

In the pixel expressing a red color, a drain region of the driving TFT 639 is connected to an OLED 703R for emitting red light, while a source region thereof is provided with an anode side power source line (R) 706R. The OLED 703R is provided with a cathode side power source line 700. The switching TFT 638 is connected to a gate wiring 705 and a gate electrode of the driving TFT 639 is connected to a drain region of the switching TFT 638. The drain region of the switching TFT 638 is connected to a capacitor element 707 connected to the anode side power source line (R) 706R.

In the pixel expressing a green color, a drain region of the driving TFT is connected to an OLED 703G for emitting green light, while a source region thereof is provided with an anode side power source line (G) 706G. The switching TFT 638 is connected to the gate wiring 705 and the gate electrode of the driving TFT 639 is connected to the drain region of the switching TFT 638. The drain region of the switching TFT 638 is connected to the capacitor element 707 connected to the anode side power source line (G) 706G.

In the pixel expressing a blue color, a drain region of the driving TFT is connected to an OLED 703B for emitting blue light, while a source region thereof is provided with an anode side power source line (B) 706B. The switching TFT 638 is connected to the gate wiring 705 and the gate electrode of the driving TFT 639 is connected to the drain region of the switching TFT 638. The drain region of the switching TNT 638 is connected to the capacitor element 707 connected to the anode side power source line (B) 706B.

Different voltages in accordance with EL materials are applied respectively to the pixels with different colors.

Here, a source wiring 704 is formed in parallel to the anode side power source lines 706R, 706G, and 706B; however, the present invention is not limited to this. The gate wiring 705 may be formed in parallel to the anode side power source lines 706R, 706G, and 706B. Moreover, the driving TFT 639 may have a multi-gate electrode structure.

In the light emitting device, the driving method of screen display is not particularly limited. For example, a dot-sequential driving method, a line-sequential driving method, a plane-sequential driving method, or the like may be used. Typically, the line sequential driving method is used, and may be combined with a time-division grayscale driving method or an area grayscale driving method, as appropriate. In addition, a video signal to be inputted into a source line of the light emitting device may be an analog signal or a digital signal. A driving circuit or the like may be designed as appropriate in accordance with the video signal.

Further, in a light emitting device using a digital video signal, there are two kinds of driving methods in which video signals inputted into a pixel are constant voltage (CV) and in which video signals inputted into a pixel are constant current (CC). Further, as for the driving method using video signals with constant voltage (CV), there are two kinds of methods in which voltage of a signal that is applied to a light emitting element is constant (CVCV), and in which current of a signal that is applied to a light emitting element is constant (CVCC). In addition, as for the driving method using video signals with constant current (CC), there are two kinds of methods in which voltage of a signal that is applied to a light emitting element is constant (CCCV), and in which current of a signal that is applied to a light emitting element is constant (CCCC).

In the light emitting device, a protective circuit for preventing electrostatic breakdown (such as a protective diode) may be provided.

A protective layer 653 may be formed over the light emitting element 624 of the pixel portion and the insulating layer 621. The protective layer is formed to prevent entry of moisture, oxygen, and the like into the light emitting element 624 and the insulating layer 621. The protective layer 653 is preferably formed by a thin film forming method such as a plasma CVD method or a sputtering method, with an insulating material such as silicon nitride, silicon oxide, silicon nitride oxide, silicon oxynitride, aluminum oxynitride, aluminum oxide, diamond like carbon (DLC), or carbon containing nitrogen (CN).

In this embodiment, since a source driver, a gate driver, and a TFT of a pixel portion are formed over one substrate, a light emitting display panel can be thinned.

A space may be provided in a region 642 between the second substrate 640 and the protective layer 653, which is filled with inert gas such as nitrogen gas. The entry of moisture or oxygen into the light emitting element and the insulating layer can be suppressed.

The second substrate 640 can be provided with a colored layer. In this case, when a light emitting element capable of white light emission is provided for each pixel and a colored layer for expressing R, G, or B is provided separately, full-color display can be achieved. Moreover, when a light emitting element capable of blue light emission is provided for each pixel and a color conversion layer is provided separately, full-color display can be achieved. Such an EL display module has high color purity of RGB and allows high-definition display. Moreover, a light emitting element expressing red, green, or blue light emission can be formed for each pixel and a colored layer can also be used.

Further, in the case where light from the light emitting element 624 is emitted to the first substrate 600 side, a surface of the first substrate 600 may be provided with a polarizing plate and a retardation plate. Meanwhile, in the case where light from the light emitting element 624 is emitted to a second substrate 640 side, a surface of the second substrate 640 may be provided with a polarizing plate and a retardation plate. Furthermore, in the case where light from the light emitting element 624 is emitted to both of the first substrate 600 having flexibility side and the second substrate 640 having flexibility side, surfaces of the first substrate 600 having flexibility and the second substrate 640 having flexibility may be provided with polarizing plates and retardation plates.

By connecting the light emitting display panel to an external circuit such as a power source circuit or a controller, a light emitting display module can be formed.

Embodiment 5

Next, an example in which the liquid crystal display panel or the EL display panel described above has an FPC or a driver IC mounted thereon is described. Here, a chip-like driver circuit formed by TFTs is called a driver IC.

Figure 27:
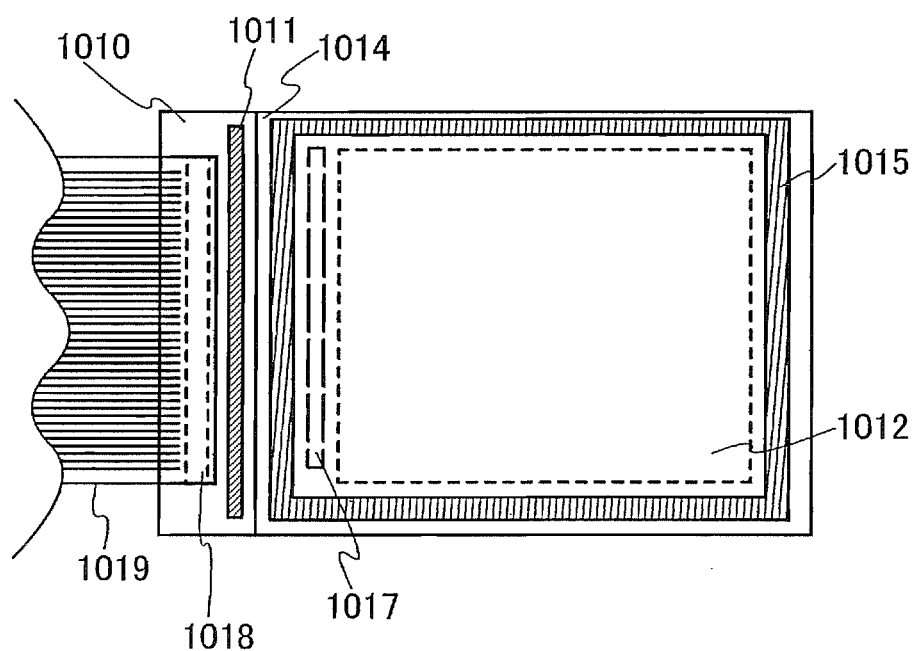
FIG. 27 is a top view illustrating a structure of a semiconductor device of the present invention.

FIG. 27 shows an example of employing a COG method which is preferable for a small size with a narrow frame (for example, 1.5 inch diagonal).

In FIG. 27, driver ICs 1011 are mounted onto a substrate 1010, and an FPC 1019 is mounted onto a terminal portion 1018 disposed at an end of the driver IC. A plurality of the driver ICs 1011 to be mounted are preferably formed over a rectangular substrate having a side of 300 mm to 1000 mm or more in terms of improving productivity. That is to say, a plurality of circuit patterns each having a driver circuit portion and an input/output terminal as a unit may be formed over the substrate, and the driver ICs may be obtained by dividing the substrate at the last. The driver IC may have a rectangular shape whose long side has a length of 15 to 80 mm and short side has a length of 1 to 6 mm in consideration of the length of the pixel portion on a side or the pixel pitch.

The superiority of the outside dimension of the driver IC to the IC chip lies in the length of the long side. When the driver IC has a long side of 15 to 80 mm, the number of chips to be mounted is fewer than that in the case of using the IC chip, thereby increasing the yield of the production. When the driver IC is formed over a glass substrate, the shape of the substrate used as a host material is not limited and the productivity is not lowered. This is a great advantage in comparison with the case of obtaining IC chips from a circular silicon wafer.

Further, a TAB method is also applicable. In that case, a plurality of tapes may be attached and the driver ICs may be mounted to the tapes. Similarly to a COG method, a single driver IC may be mounted to a single tape. In such a case, a metal chip or the like for fixing the driver IC is preferably attached together in point of the mechanical strength.

A connection region 1017 between the pixel portion 1102 and the driver ICs 1011 is provided so that the second conductive layer in the light emitting element is in contact with the wiring of the lower layer.

Moreover, the sealing substrate 1014 is fixed to the substrate 1010 by the sealing material 1015 surrounding the pixel portion 1012 and a filling material surrounded by the sealing material 1015.

The driver IC may be replaced by an IC chip formed by a Si chip.

Embodiment 6

Figure 28A:
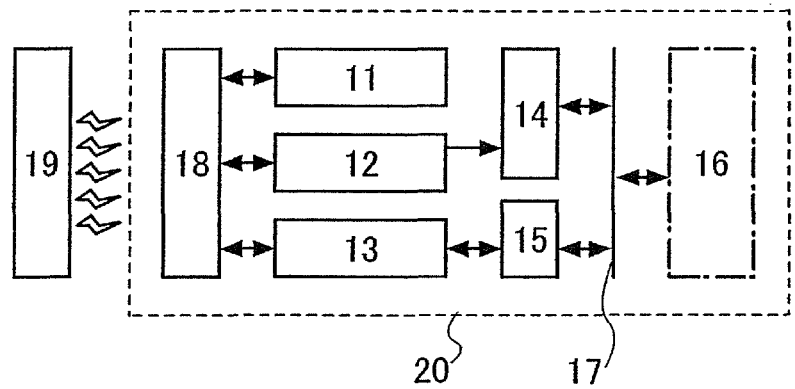
FIGS. 28A to 28C are diagrams illustrating structures of semiconductor devices of the present invention.

Structures of semiconductor devices typified by RFID tags capable of wireless data communication will be described in this embodiment, with reference to FIGS. 28A to 28C. As shown in FIG. 28A, a semiconductor device 20 of this embodiment has a function of data communication without contact, and includes a power supply circuit 11, a clock generation circuit 12, a data demodulation/modulation circuit 13, a control circuit 14 for controlling other circuits, an interface circuit 15, a memory circuit 16, a bus 17, and an antenna 18.

Figure 28B:
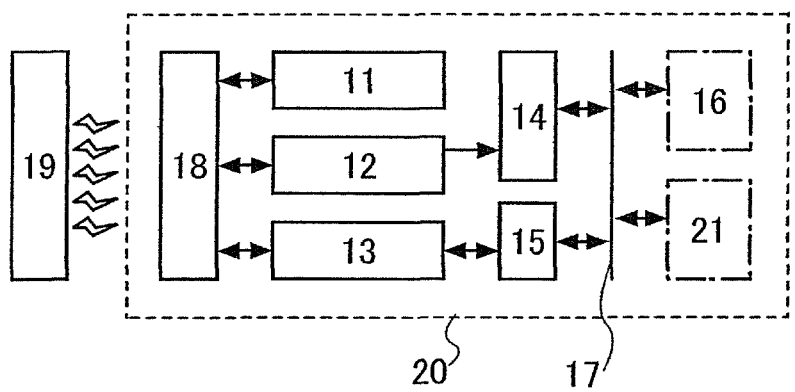

Further, as shown in FIG. 28B, the semiconductor device 20 of this embodiment has a function of data communication without contact, and may include a central processing unit 21, in addition to the power supply circuit 11, the clock generation circuit 12, the data demodulation/modulation circuit 13, the control circuit 14 for controlling other circuits, the interface circuit 15, the memory circuit 16, the bus 17, and the antenna 18.

Figure 28C:
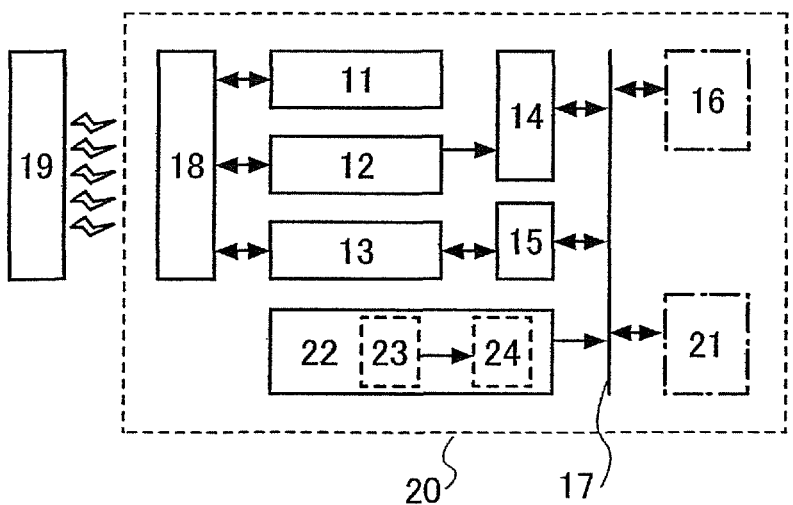

As shown in FIG. 28C, the semiconductor device 20 of this embodiment has a function of data communication without contact, and may include a detecting portion 22 including a detecting element 23 and a detection control circuit 24, in addition to the power supply circuit 11, the clock generation circuit 12, the data demodulation/modulation circuit 13, the control circuit 14 for controlling other circuits, the interface circuit 15, the memory circuit 16, the bus 17, the antenna 18, and the central processing unit 21.

When the semiconductor device of this embodiment includes the power supply circuit 11, the clock generation circuit 12, the data demodulation/modulation circuit 13, the control circuit 14 for controlling other circuits, the interface circuit 15, the memory circuit 16, the bus 17, the antenna 18, the central processing unit 21, the detecting portion 22 including the detecting element 23 and the detection control circuit 24, and the like, a small semiconductor device having multi-function can be formed.

The power supply circuit 11 generates various kinds of power sources to be supplied to various circuits inside of the semiconductor device 20 based on alternating current signals inputted from the antenna 18. In addition, the power supply circuit 11 may include one or more of the solar cells shown in Embodiment Modes 1 to 5. The clock generation circuit 12 generates various clock signals to be supplied to various circuits inside of the semiconductor device 20 based on alternating current signals inputted from the antenna 18. The data demodulation/modulation circuit 13 has a function of demodulating/modulating data for communicating with a reader/writer 19. The control circuit 14 has a function of controlling the memory circuit 16. The antenna 18 has a function of sending and receiving electromagnetic waves or radio waves. The reader/writer 19 controls communication with the semiconductor device and processing of data of communication. Note that the semiconductor device of the present invention is not limited to the above-described structures. For example, the semiconductor device may further include other elements such as a limiter circuit of power voltage and hardware only for processing codes.

The memory circuit 16 includes the memory element shown in the above embodiment mode. Since a memory element which includes a functional layer having a layer including an organic compound can realize miniaturization at the same time, reduction in thickness, and increase in capacitance, when the memory circuit 16 is provided using the memory element having the layer including the organic compound, a small and lightweight semiconductor device can be achieved.

The detecting portion 22 can detect temperature, pressure, flow rate, light, magnetism, sonic waves, acceleration, humidity, a component contained in a gas, a component contained in a fluid, and other characteristics by physical means or chemical means. The detecting portion 22 includes the detecting element 23 for detecting a physical quantity or a chemical quantity and the detection control circuit 24, which converts a physical quantity or a chemical quantity detected by the detecting element 23 into an appropriate signal such as an electronic signal. The detecting element 23 can be formed by using an element such as a resistor, a capacitive coupling element, an inductive-coupling element, a photovoltaic element, a photoelectric conversion element, a thermo-electromotive force element, a transistor, a thermistor, a diode, or the like, and one or more of the photoelectric conversion element, the diode, and the transistor shown in the above embodiment modes may be included in the detecting element 23. Note that a plurality of detecting portions 22 may be provided. In this case, a plurality of physical quantities or chemical quantities can be detected at the same time.

Further, the physical quantities mentioned here indicate temperature, pressure, flow rate, light, magnetism, sonic waves, acceleration, humidity, and the like. The chemical quantities mentioned here indicate chemical substances and the like such as a gas component such as a gas and a component contained in a fluid such as an ion. In addition to the above, the chemical quantities further include an organic compound like a certain biologic material contained in blood, sweat, urine, and the like (e.g., a blood-sugar level contained in blood). In particular, in order to detect a chemical quantity, a certain substance is inevitably detected selectively, and therefore, a substance to be detected and a substance which is selectively reacted are provided in advance in the detecting element 23. For example, in the case of detecting a biologic material, enzyme, an antibody molecule, a microbial cell, and the like, which are selectively reacted with the biologic material to be detected by the detecting element 23, are preferably immobilized to a high molecule and the like.

Figure 29A:
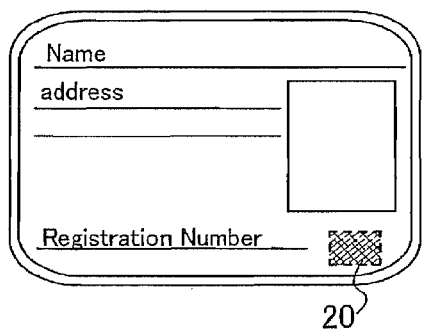
FIGS. 29A to 29F are diagrams illustrating applications of semiconductor devices of the present invention.
Figure 29B:
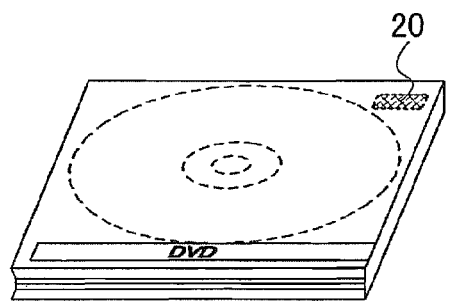
Figure 29C:
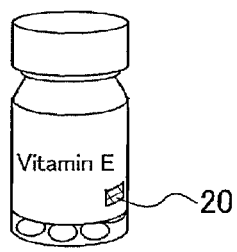
Figure 29D:
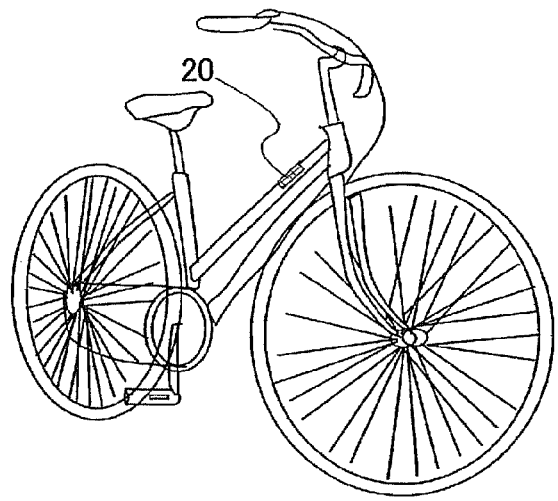
Figure 29E:
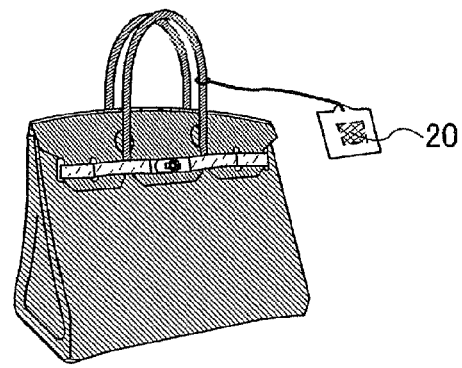
Figure 29F:
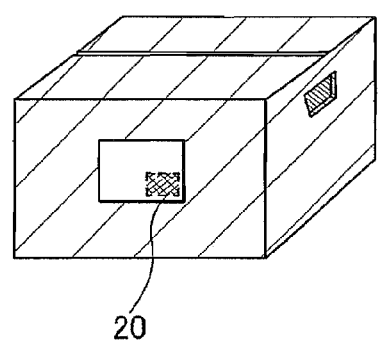

According to this embodiment, a semiconductor device which serves as an RFID tag can be formed. An application range of the RFID tag is wide. For example, the RFID tag can be, for example, used by being attached to bills, coins, securities, bearer bonds, certificates (such as a driver's license and a certificate of residence, see FIG. 29A), wrapping containers (such as a wrapping paper and a bottle, see FIG. 29C), recording media (such as DVD software and a video tape see FIG. 29B), vehicles (such as a bicycle, see FIG. 29D), belongings (such as a bag and eye glasses), foods, plants, animals, human bodies, clothes, livingwares, tags for commodities such as electronic appliances and baggage (see FIGS. 29E and 29F), and the like. The electronic appliances indicate a liquid crystal display device, an EL display device, a television device (also simply referred to as a television or a television receiver), a cellular phone, and the like.

Further, the semiconductor device 20 of this embodiment can be fixed to goods by mounting it on a printed substrate, or by attaching the semiconductor device to a surface of the goods, embedding the semiconductor device in the goods, or the like. For example, the semiconductor device may be embedded in a paper of a book, or embedded in an organic resin of a package that is formed using the organic resin. Since the semiconductor device 20 of this embodiment is small, thin, and lightweight, after fixing it to goods, design of the goods is not impaired by the semiconductor device. By providing semiconductor devices 20 of this embodiment to bills, coins, securities, bearer bonds, certificates, and the like, identification functions can be provided to these things. By utilizing the identification functions, forgery of these things can be prevented. In addition, by providing the semiconductor devices of this embodiment to wrapping containers, recording media, belongings, foods, clothes, livingwares, electronic appliances, and the like, an inspection system or the like can be improved efficiently.

Embodiment 7

Figure 30:
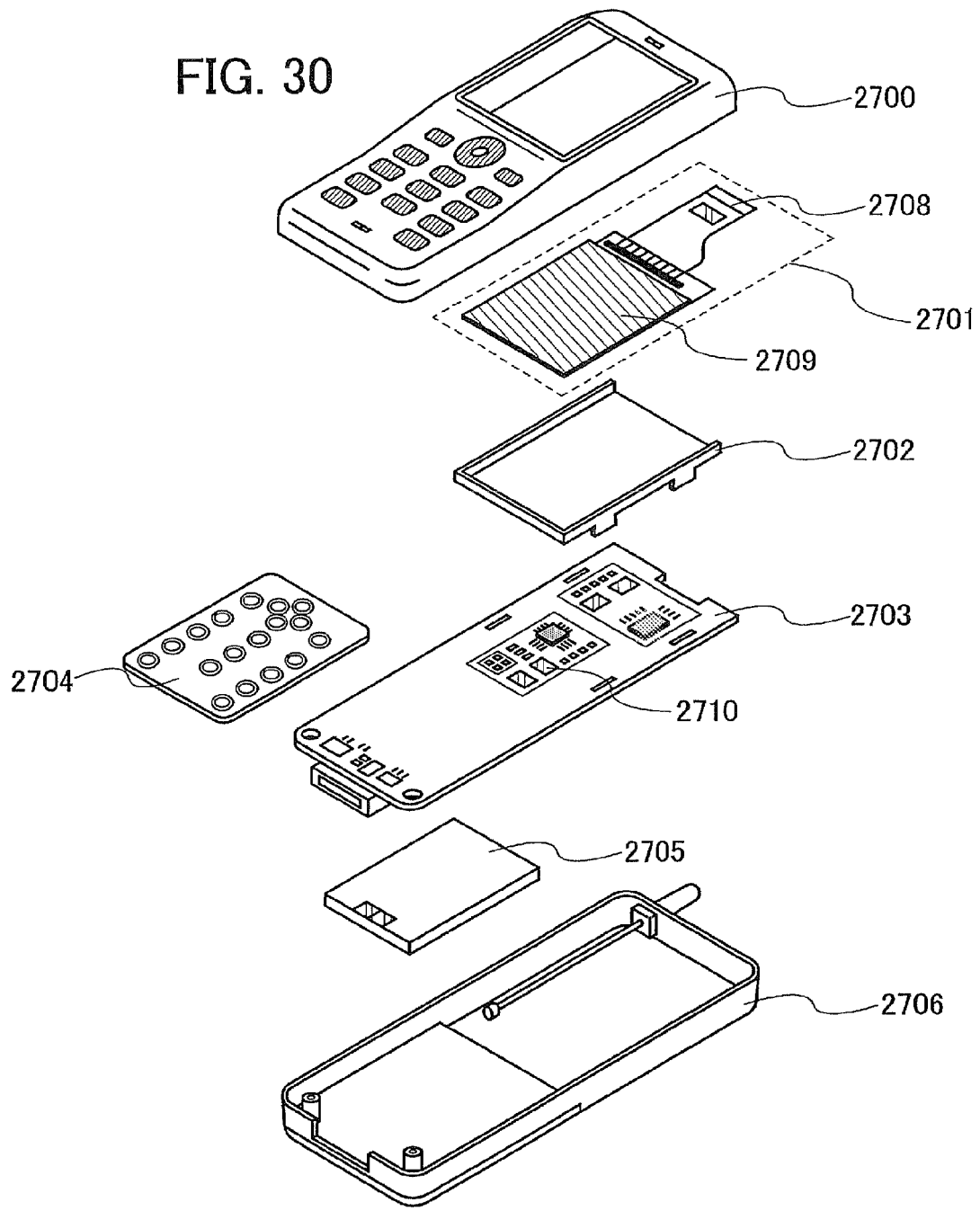
FIG. 30 is a perspective view illustrating an electric apparatus having a semiconductor device of the present invention.

Next, an example of an electronic appliance equipped with a semiconductor device of the present invention will be described with reference to FIG. 30. A mobile phone is shown as an example here. The mobile phone includes casings 2700 and 2706, a panel 2701, a housing 2702, a printed wiring board 2703, operation buttons 2704, and a buttery 2705 (see FIG. 30). The panel 2701 is built in the housing 2702 and is freely detachable. The housing 2702 is firmly attached to the printed wiring board 2703. The shape and the size of the housing 2702 are changed as appropriate in accordance with an electronic appliance to which the panel 2701 is built in. A plurality of semiconductor devices that are packaged is mounted over the printed wiring board 2703. The semiconductor device shown in the above embodiment modes and embodiments can be used as one of the plurality of semiconductor devices 2710. The plurality of semiconductor devices mounted over the printed wiring board 2703 has any function of a controller, a central processing unit (CPU), a memory, a power supply circuit, an audio processing circuit, a transmitting/receiving circuit, and the like.

The panel 2701 is connected to the printed wiring board 2703 through a connection film 2708. The panel 2701, the housing 2702, and the printed wiring board 2703 are housed inside of the casings 2700 and 2706 along with the operation buttons 2704 and the buttery 2705. A pixel region 2709 included in the panel 2701 is arranged such that the pixel region 2709 can be recognized by sight through an opening window. A semiconductor device as shown in Embodiments 5 and 6 can be used as the panel 2701.

As set forth above, the semiconductor device of the present invention is small, thin, and lightweight, and therefore, a limited space inside of the casings 2700 and 2706 of the electronic appliance can be efficiently utilized.

Note that the casings 2700 and 2706 only show example of an exterior shape of the mobile phone, and electronic appliance to which this embodiment is applied can be varied in accordance with its performance and intended purpose.

Embodiment 8

Electronic appliances having the semiconductor devices shown in the embodiment modes and embodiments include a television device (also referred to as a TV or a television receiving device, simply), a camera such as a digital camera or a digital video camera, a mobile telephone device (also referred to as a cellular phone device or a cellular phone, simply), a mobile information terminal such as a PDA, a mobile game machine, a monitor for a computer, a computer, an audio reproducing device such as a car audio component, an image reproducing device equipped with a recording medium, such as a home-use game machine, and the like. The specific examples are described with reference to FIGS. 32A to 32F.

Figure 32A:
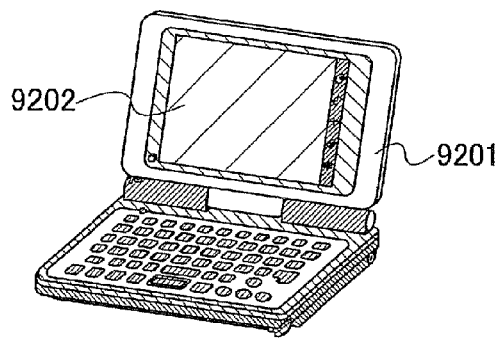
FIGS. 32A to 32F are perspective views illustrating electric apparatuses each having a semiconductor device of the present invention.

A mobile information terminal shown in FIG. 32A includes a main body 9201, a display portion 9202, and the like. By using the liquid crystal display device or the light emitting display device shown in the above embodiment modes and embodiments for the display portion 9202, an inexpensive mobile information terminal which is thin, light weight, and conveniently portable can be provided.

Figure 32B:
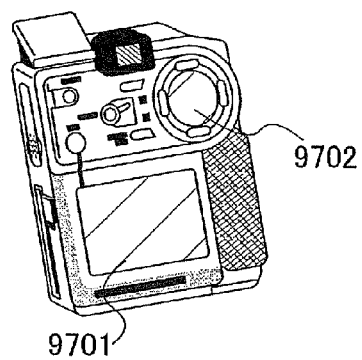

A digital video camera shown in FIG. 32B includes a display portion 9701, a display portion 9702, and the like. By using the liquid crystal display device or the light emitting display device shown in the above embodiment modes and embodiments for the display portion 9701, an inexpensive digital video camera which is thin, light weight, and conveniently portable can be provided.

Figure 32C:
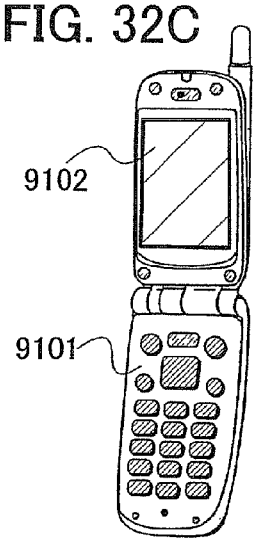

A mobile terminal shown in FIG. 32C includes a main body 9101, a display portion 9102, and the like. By using the liquid crystal display device or the light emitting display device shown in the above embodiment modes and embodiments for the display portion 9102, an inexpensive mobile terminal which is thin, light weight, and conveniently portable can be provided.

Figure 32D:
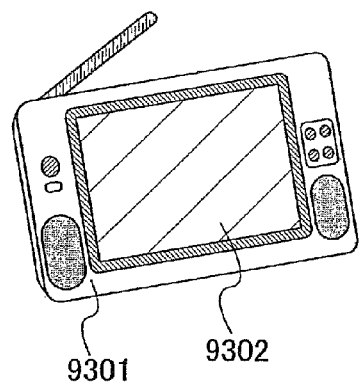

A mobile television device shown in FIG. 32D includes a main body 9301, a display portion 9302, and the like. By using the liquid crystal display device or the light emitting display device shown in the above embodiment modes and embodiments for the display portion 9302, an inexpensive mobile television device which is thin, light weight, and conveniently portable can be provided. Such a television device can be widely applied within the range of a small size which is mounted in a mobile terminal such as a mobile phone to a middle size which is portable, and even applied to a large size (for example 40 inches or larger).

Figure 32E:
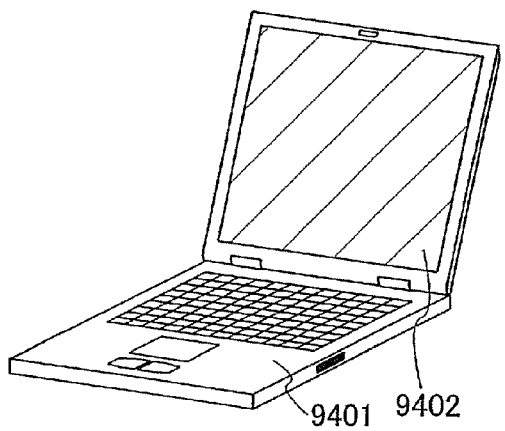

A mobile computer shown in FIG. 32E includes a main body 9401, a display portion 9402, and the like. By using the liquid crystal display device or the light emitting display device shown in the above embodiment modes and embodiments for the display portion 9402, an inexpensive mobile computer which is thin, light weight, and conveniently portable can be provided.

Figure 32F:
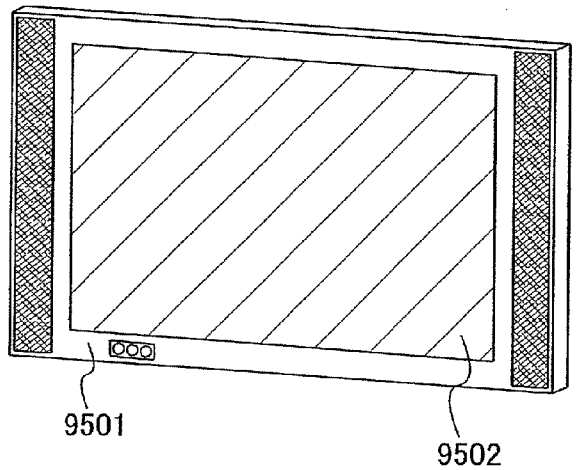

A television device shown in FIG. 32F includes a main body 9501, a display portion 9502, and the like. By using the liquid crystal display device or the light emitting display device shown in the above embodiment modes and embodiments for the display portion 9502, an inexpensive television device which is thin, light weight, and conveniently portable can be provided. Therefore, the television device can be used as a wall-hanging television or an electric signboard.

Embodiment 9

This embodiment shows an electric characteristic of an organic semiconductor transistor included in a semiconductor device having flexibility which is formed using the method shown in Embodiment Mode 1.

A manufacturing process of a semiconductor device of this embodiment is shown with reference to FIGS. 1A to 1E.

As shown in FIG. 1A, the photocatalytic layer 102 and the organic compound layer 103 were sequentially formed over the substrate 101. A glass substrate was used for the substrate 101. As the photocatalytic layer 102, a composition including titanium oxide and butyl acetate (product name: Ti-03, made by Kojundo Chemical Laboratory. Co., Ltd) was applied onto the substrate 101 using a spin coater, and baking was performed at 600° C. for 15 minutes using a horizontal diffusion furnace, so that a thin titanium oxide film was formed. As the organic compound layer 103, the photocatalytic layer 102 was spin-coated with a composition (product name: SUN-EVER SE-5291, made by Nissan Chemical Industries, Ltd.), and then baking was performed at 180° C. for 30 minutes using an oven, so that the organic compound layer 103 including polyimide was formed.

Next, the element forming layer 104 was formed over the organic compound layer 103. As the element forming layer, a layer having an organic semiconductor transistor was formed. A method for forming the organic semiconductor transistor is shown below. A composition including a silver particle (made by Harima Chemicals, INC.) was discharged at a predetermined position using an ink-jet method, and baking was performed at 180° C. for 60 minutes using an oven, so that a gate electrode including silver was formed.

Next, a composition (product name: SUNEVER SE-5291, made by Nissan Chemical Industries, Ltd.) was applied using a spin coater, and then baking was performed at 180° C. for 30 minutes using an oven. Further, a solution in which 1 wt. % of polyvinyl cinnamate (made by Aldrich Chemical Company, Inc.) was dissolved in methyl ethyl ketone was applied using a spin coater, and baking was performed at 80° C. for 10 minutes using a hot plate, so that a gate insulating film was formed.

Next, a composition including a silver particle (made by Harima Chemicals, INC.) was discharged at a predetermined position using an ink-jet method, and baking was performed at 180° C. for 60 minutes using an oven, so that a source electrode and a drain electrode which include silver were formed.

Next, a semiconductor layer was formed by depositing purified pentacene using a metal mask, so that an organic semiconductor transistor was formed.

Next, as shown in FIG. 1B, the substrate 101 was irradiated with the light 105 from a metal halide lamp (160 W) from a back surface (a glass side) for 15 minutes, so that the photocatalytic layer 102 was activated.

Next, a film with an adhesive agent was attached onto the organic semiconductor transistor.

Figure 33:
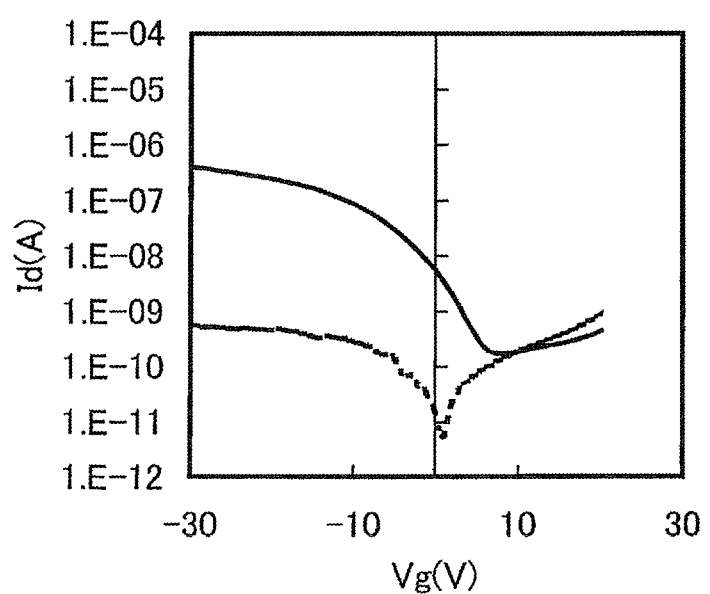
FIG. 33 is a graph illustrating electric characteristics of a semiconductor device of the present invention.
Figure 34A:
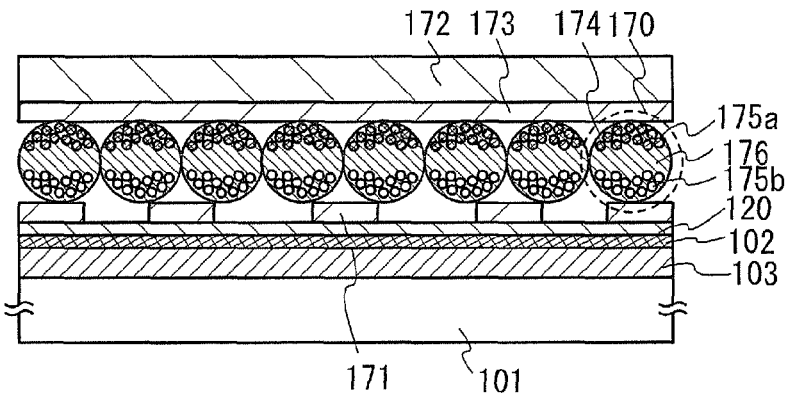
FIGS. 34A to 34D are cross sectional views illustrating a manufacturing process of a semiconductor device of the present invention.
Figure 34B:
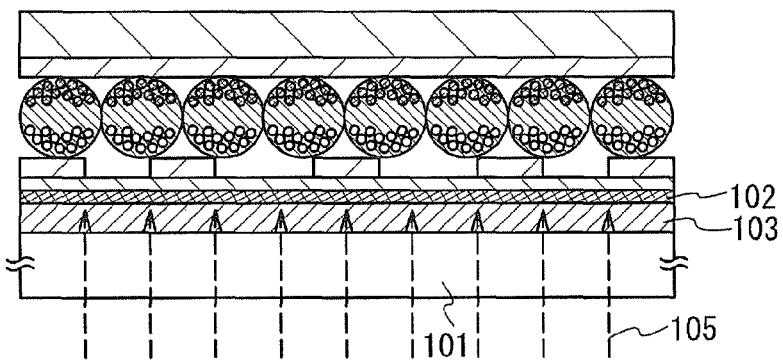
Figure 34C:
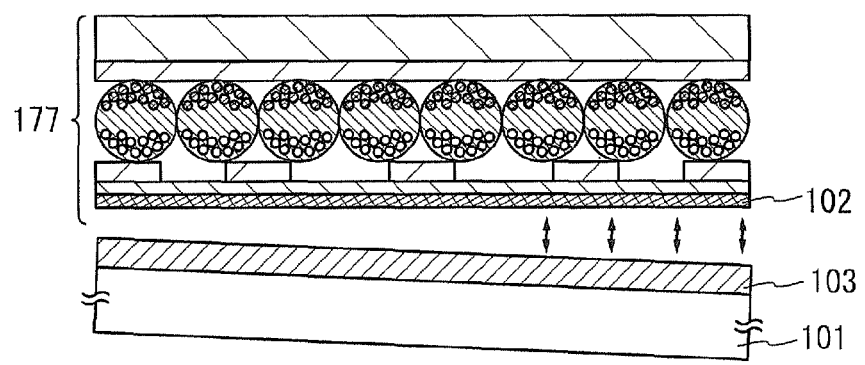
Figure 34D:
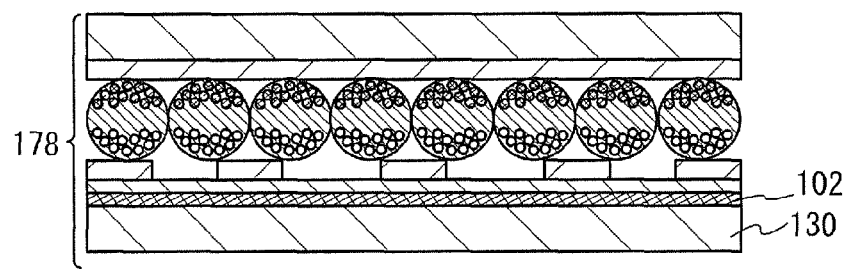
Figure 35A:
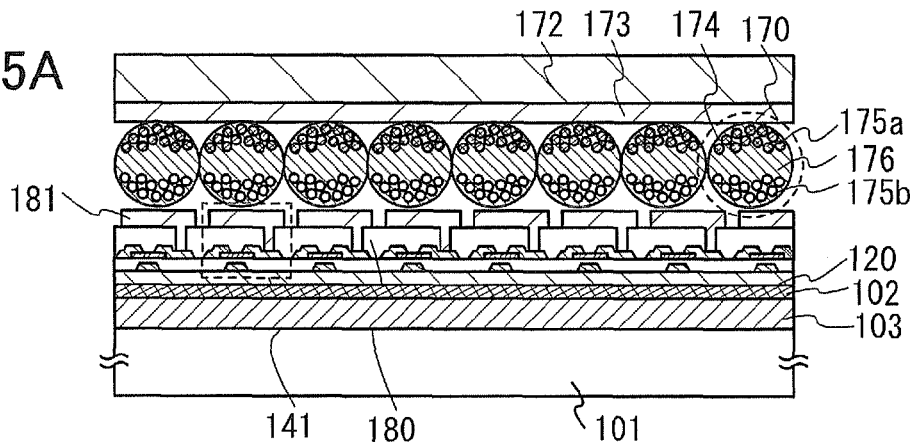
FIGS. 35A to 35D are cross sectional views illustrating a manufacturing process of a semiconductor device of the present invention.
Figure 35B:
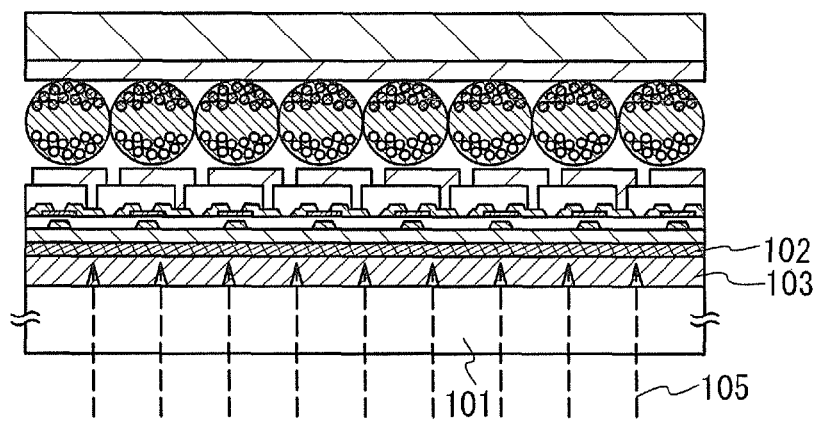
Figure 35C:
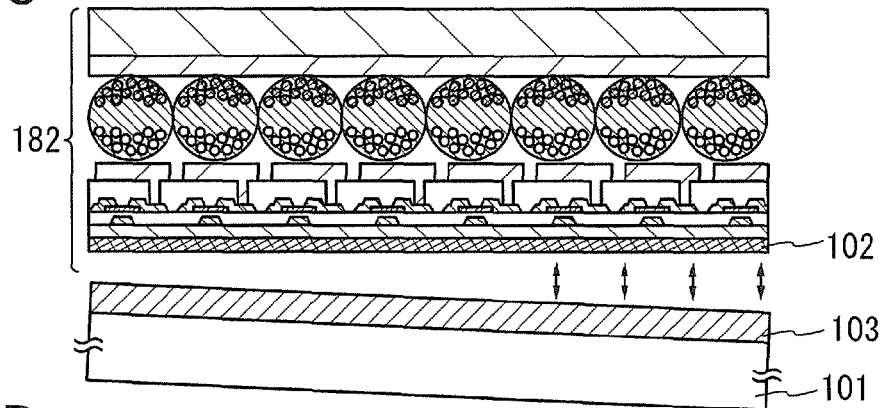
Figure 35D:
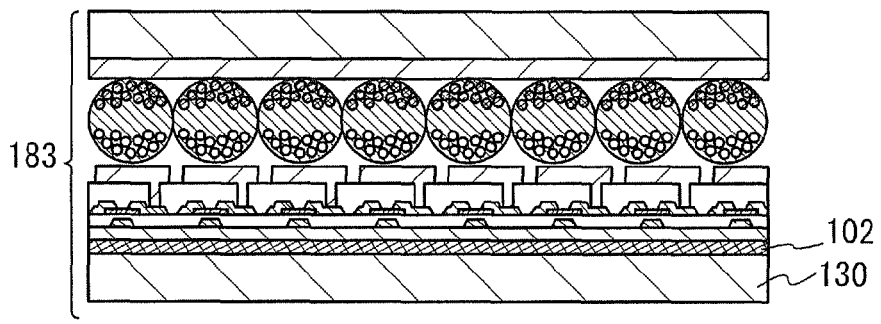
Figure 36A:
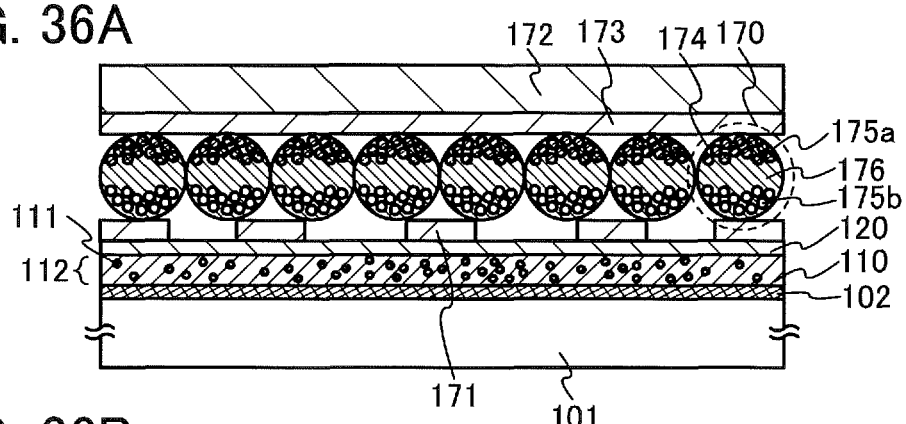
FIGS. 36A to 36D are cross sectional views illustrating a manufacturing process of a semiconductor device of the present invention.
Figure 36B:
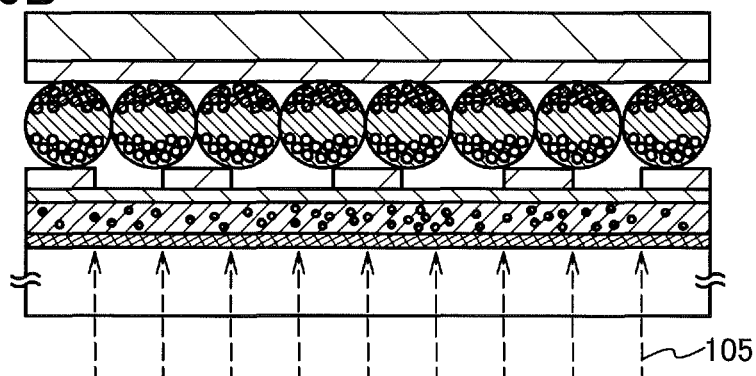
Figure 36C:
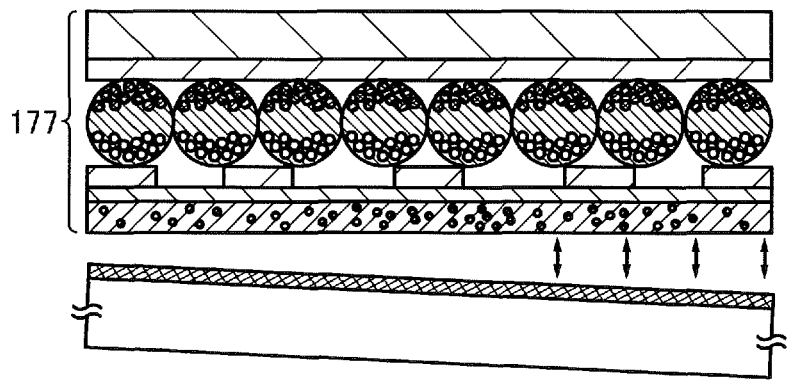
Figure 36D:
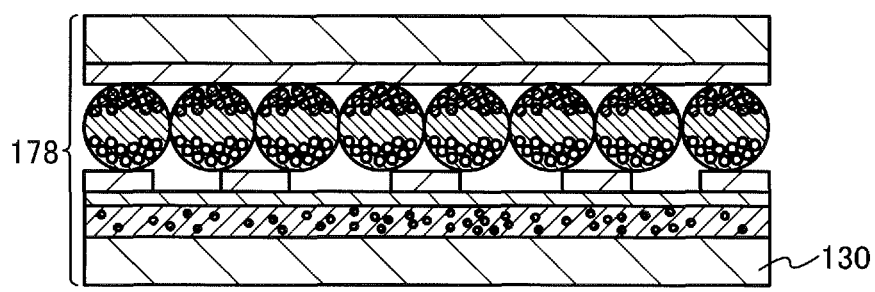
Figure 37A:
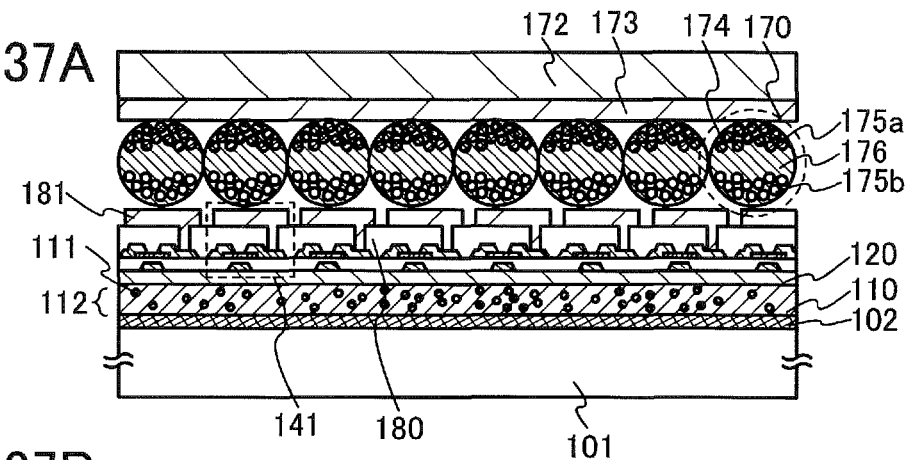
FIGS. 37A to 37D are cross sectional views illustrating a manufacturing process of a semiconductor device of the present invention.
Figure 37B:
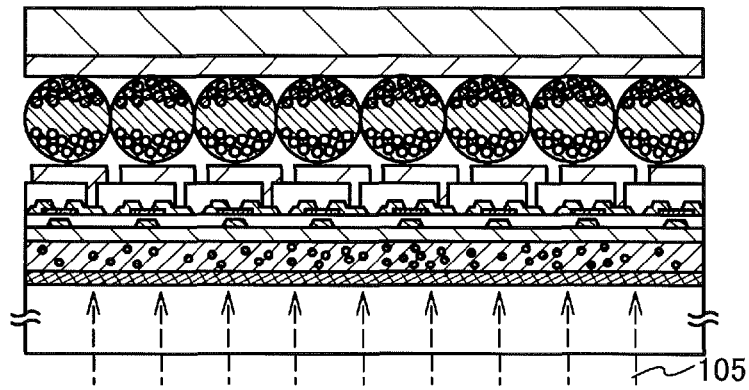
Figure 37C:
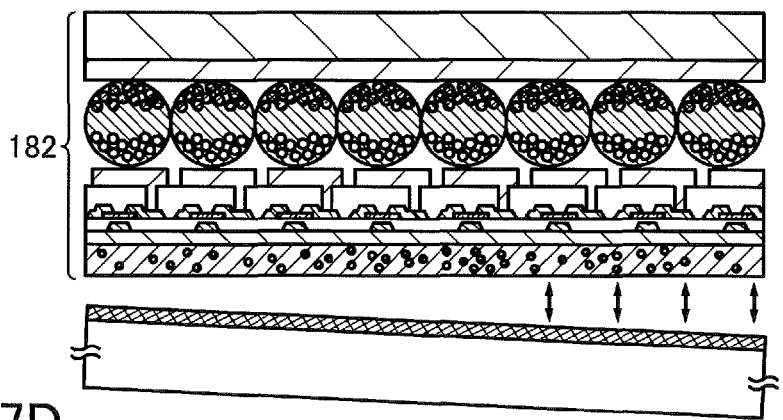
Figure 37D:
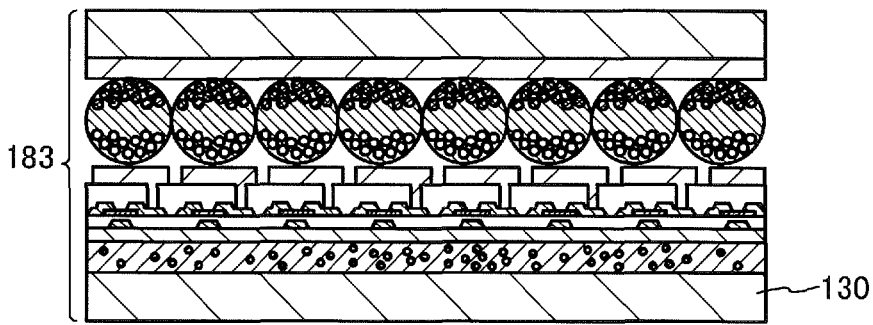
Figure 38A:
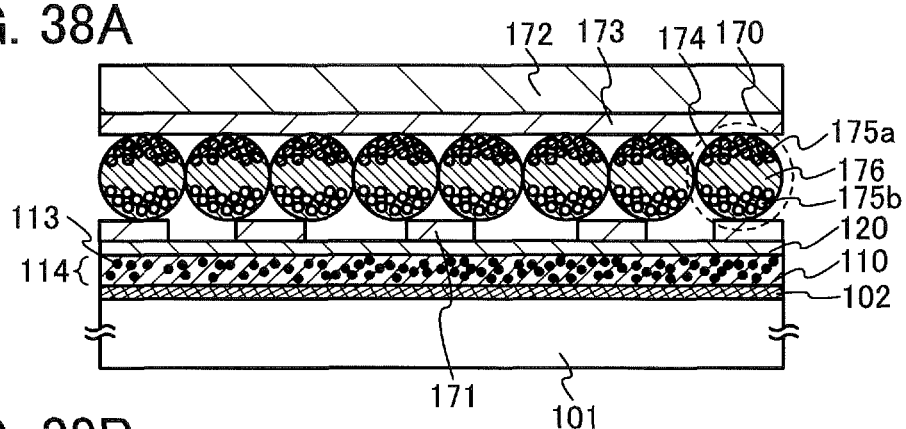
FIGS. 38A to 38D are cross sectional views illustrating a manufacturing process of a semiconductor device of the present invention.
Figure 38B:
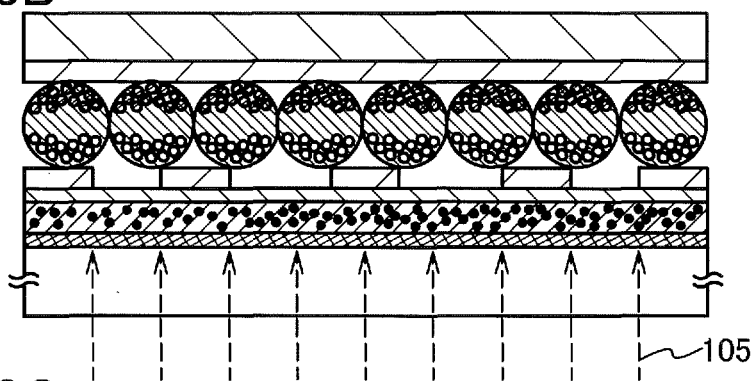
Figure 38C:
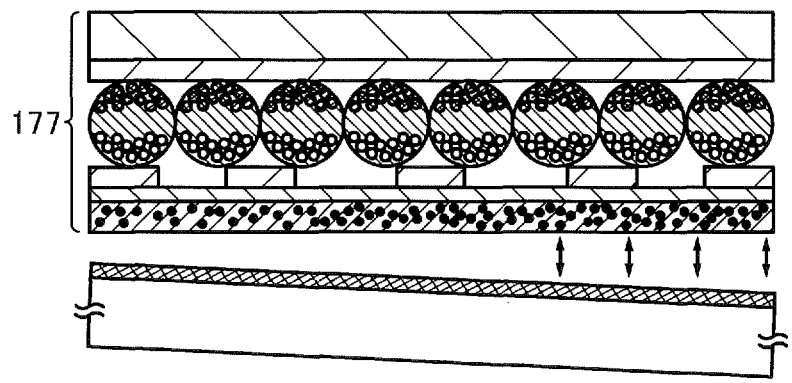
Figure 38D:
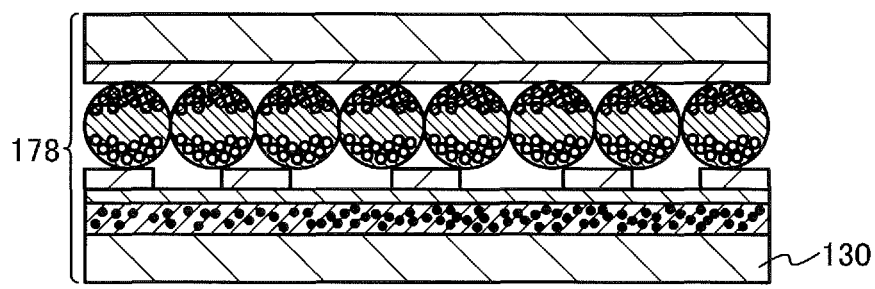
Figure 39A:
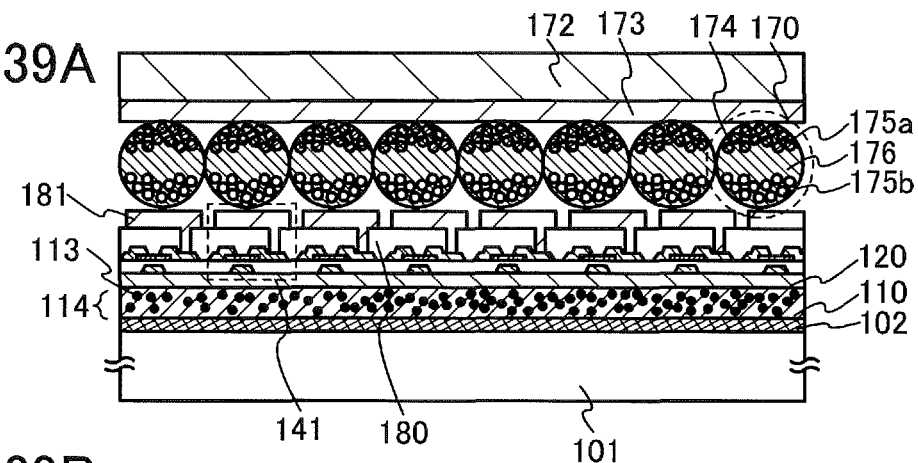
FIGS. 39A to 39D are cross sectional views illustrating a manufacturing process of a semiconductor device of the present invention.
Figure 39B:
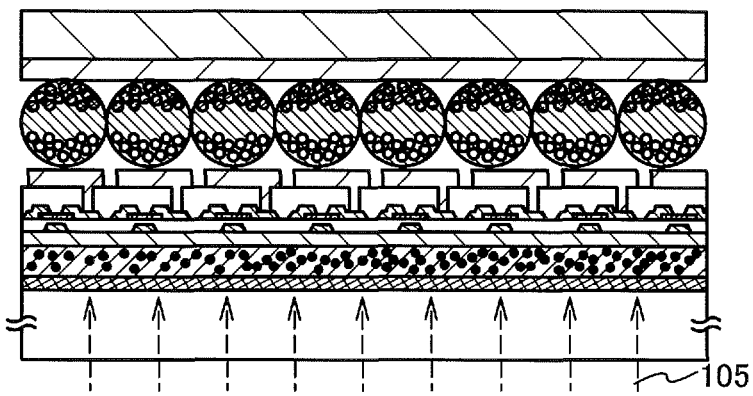
Figure 39C:
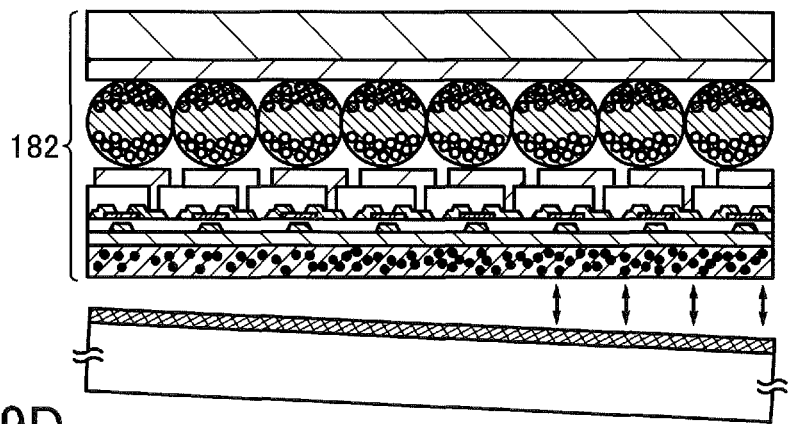
Figure 39D:
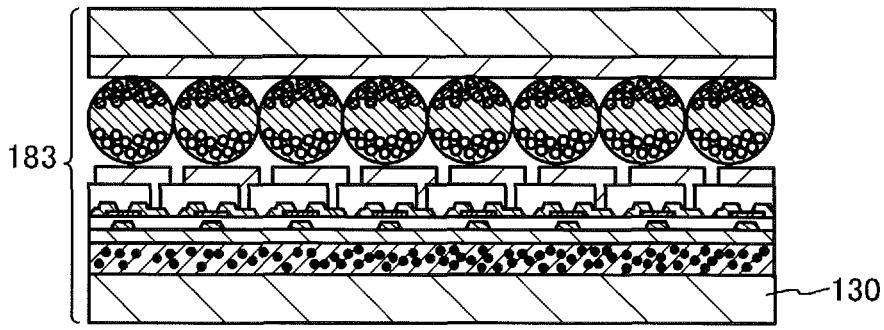

Next, as shown in FIG. 1C, an end portion of the film was lifted from the fixed substrate 101, and separation was performed at an interface between the photocatalytic layer 102 and the organic compound layer 103, and then the element forming layer was transposed from the substrate to the film. The size of the organic semiconductor transistor is as follows: a channel length L/a channel width W=1600/165 µm. FIG. 33 shows a measurement result of an electric characteristic of the organic semiconductor transistor which was transposed to the film when a drain voltage Vd was set at −10 V. A solid line shows a drain current, and dotted lines show a gate current.

As set forth above, the element forming layer formed over the substrate was transposed to the film with the adhesive agent so that a semiconductor device having flexibility could be formed.

This application is based on Japanese Patent Application serial No. 2006-058729 filed in Japan Patent Office on Mar. 3, 2006, the entire contents of which are hereby incorporated by reference.

What is claimed is:

1. A semiconductor device comprising:
a first flexible substrate;
an organic compound layer in which inorganic compound particles are dispersed over and in contact with the first flexible substrate;
an insulating layer over and in direct contact with the organic compound layer;
an electrophoresis element over and in direct contact with the insulating layer; and
a second flexible substrate over and in direct contact with the electrophoresis element,
wherein the inorganic compound particles comprise one of silicon oxide, silicon nitride, aluminum oxide, tantalum oxide, and barium fluoride magnesium,
wherein the insulating layer is a single layer selected from silicon nitride, silicon oxide, and aluminum nitride, and
wherein the electrophoresis element includes a first conductive layer, a second conductive layer in direct contact with the second flexible substrate, and a microcapsule.

2. The semiconductor device according to claim 1,
wherein the first conductive layer is electrically connected to the microcapsule, and
wherein the microcapsule is electrically connected to the second conductive layer.

3. The semiconductor device according to claim 1, wherein the microcapsule is fixed between the first conductive layer and the second conductive layer with a binder.

4. The semiconductor device according to claim 1, wherein the microcapsule includes a black particle and a white particle.

5. A semiconductor device comprising:
a first flexible substrate;
an organic compound layer in which particles having light shielding properties are dispersed over and in contact with the first flexible substrate;
an insulating layer over and in direct contact with the organic compound layer;
an electrophoresis element over and in direct contact with the insulating layer; and
a second flexible substrate over and in direct contact with the electrophoresis element,
wherein the particles having light shielding properties absorb light in the wavelength range from 280 to 780 nm,
wherein the insulating layer is a single layer selected from silicon nitride, silicon oxide, and aluminum nitride, and
wherein the electrophoresis element includes a first conductive layer, a second conductive layer in direct contact with the second flexible substrate, and a microcapsule.

6. The semiconductor device according to claim 5,
wherein the first conductive layer is electrically connected to the microcapsule, and
wherein the microcapsule is electrically connected to the second conductive layer.

7. The semiconductor device according to claim 5, wherein the microcapsule is fixed between the first conductive layer and the second conductive layer with a binder.

8. The semiconductor device according to claim 5, wherein the microcapsule includes a black particle and a white particle.

9. A semiconductor device comprising:
a first flexible substrate;
an organic compound layer in which inorganic compound particles are dispersed over and in contact with the first flexible substrate;
an insulating layer over and in direct contact with the organic compound layer;
a switching element over and in direct contact with the insulating layer;
an electrophoresis element over the switching element; and
a second flexible substrate over and in direct contact with the electrophoresis element,
wherein the inorganic compound particles comprise one of silicon oxide, silicon nitride, aluminum oxide, tantalum oxide, and barium fluoride magnesium,
wherein the insulating layer is a single layer selected from silicon nitride, silicon oxide, and aluminum nitride,
wherein the electrophoresis element includes a first conductive layer, a second conductive layer in direct contact with the second flexible substrate, and a microcapsule, and
wherein the first conductive layer is electrically connected to the switching element.

10. The semiconductor device according to claim 9,
wherein the first conductive layer is electrically connected to the microcapsule, and
wherein the microcapsule is electrically connected to the second conductive layer.

11. The semiconductor device according to claim 9, wherein the microcapsule is fixed between the first conductive layer and the second conductive layer with a binder.

12. The semiconductor device according to claim 9, wherein the microcapsule includes a black particle and a white particle.

13. A semiconductor device comprising:
a first flexible substrate;
an organic compound layer in which particles having light shielding properties are dispersed over and in contact with the first flexible substrate;
an insulating layer over and in direct contact with the organic compound layer;
a switching element over and in direct contact with the insulating layer;
an electrophoresis element over the switching element; and
a second flexible substrate over and in direct contact with the electrophoresis element,
wherein the particles having light shielding properties absorb light in the wavelength range from 280 to 780 nm,
wherein the insulating layer is a single layer selected from silicon nitride, silicon oxide, and aluminum nitride,
wherein the electrophoresis element includes a first conductive layer, a second conductive layer in direct contact with the second flexible substrate, and a microcapsule, and
wherein the first conductive layer is electrically connected to the switching element.

14. The semiconductor device according to claim 13,
wherein the first conductive layer is electrically connected to the microcapsule, and
wherein the microcapsule is electrically connected to the second conductive layer.

15. The semiconductor device according to claim 13, wherein the microcapsule is fixed between the first conductive layer and the second conductive layer with a binder.

16. The semiconductor device according to claim 13, wherein the microcapsule includes a black particle and a white particle.

* * * * *